(12) United States Patent
Miura et al.

(10) Patent No.: US 8,886,893 B2
(45) Date of Patent: Nov. 11, 2014

(54) SEMICONDUCTOR DEVICE

(75) Inventors: Seiji Miura, Tokyo (JP); Yoshinori Haraguchi, Tokyo (JP); Kazuhiko Abe, Tokyo (JP); Shoji Kaneko, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 777 days.

(21) Appl. No.: 12/597,097

(22) PCT Filed: Apr. 25, 2008

(86) PCT No.: PCT/JP2008/058088
§ 371 (c)(1),
(2), (4) Date: Jan. 8, 2010

(87) PCT Pub. No.: WO2008/136417
PCT Pub. Date: Nov. 13, 2008

(65) Prior Publication Data
US 2010/0131724 A1 May 27, 2010

(30) Foreign Application Priority Data

Apr. 26, 2007 (JP) ................................ 2007-116516

(51) Int. Cl.
*G06F 12/00* (2006.01)
*G11C 7/00* (2006.01)
*G06F 13/42* (2006.01)

(52) U.S. Cl.
CPC ................................ *G06F 13/4243* (2013.01)
USPC ........................................ 711/154; 711/167

(58) Field of Classification Search
USPC ................................................... 711/154
See application file for complete search history.

(56) References Cited

U.S. PATENT DOCUMENTS

| 6,195,724 B1 * | 2/2001 | Stracovsky et al. ........... 710/244 |
| 6,446,143 B1 | 9/2002 | Razdan et al. |
| 6,714,595 B1 | 3/2004 | So et al. |
| 7,139,849 B2 | 11/2006 | Tojima et al. |

(Continued)

FOREIGN PATENT DOCUMENTS

| EP | 0566306 A2 | 10/1993 |
| JP | 05-299616 A | 11/1993 |

(Continued)

OTHER PUBLICATIONS

"Data Sheet of Combination Memory (Stacked CSP), Flash Memory + RAM", Model LRS1380, [online], Dec. 10, 2001, Sharp Corporation, [Searched on Aug. 21, 2002], Internet <URL:http://www.sharp.co.jp/products/device/flash/cmlist.html>.

(Continued)

*Primary Examiner* — Kaushikkumar Patel
(74) *Attorney, Agent, or Firm* — Sughrue Mion, PLLC

(57) ABSTRACT

The present invention has an object of providing a high-speed, low-cost, and user-friendly information processing system that can ensure scalability of memory capacity. The information processing system is configured to include an information processing device, a volatile memory, and a nonvolatile memory. By serially connecting the information processing device, the volatile memory, and the nonvolatile memory and reducing the number of connection signals, processing speed is increased while maintaining the scalability of memory capacity. When transferring data of the nonvolatile memory to the volatile memory, error correction is performed, thereby improving reliability. The information processing system including the plurality of chips is configured as an information-processing system module in which the chips are alternately stacked and arranged, and wired by a ball grid array (BGA) or by bonding between the chips.

9 Claims, 51 Drawing Sheets

(56) References Cited

U.S. PATENT DOCUMENTS

| | | |
|---|---|---|
| 7,184,360 B2 | 2/2007 | Gregorius et al. |
| 7,421,525 B2 * | 9/2008 | Polzin et al. .................. 710/100 |
| 7,546,410 B2 * | 6/2009 | Bartley et al. ................. 711/104 |
| 2002/0035590 A1 | 3/2002 | Eibach et al. |
| 2005/0066137 A1 * | 3/2005 | Jeddeloh et al. ............. 711/154 |
| 2005/0216677 A1 * | 9/2005 | Jeddeloh et al. ............. 711/150 |
| 2006/0179193 A1 * | 8/2006 | Miura ........................... 710/110 |
| 2006/0294333 A1 * | 12/2006 | Michaylov et al. ........... 711/168 |
| 2007/0005922 A1 | 1/2007 | Swaminathan et al. |
| 2007/0016698 A1 | 1/2007 | Vogt |
| 2007/0045606 A1 | 3/2007 | Magistretti et al. |

FOREIGN PATENT DOCUMENTS

| | | |
|---|---|---|
| JP | 07-146820 A | 6/1995 |
| JP | 2001-005723 A | 1/2001 |
| JP | 2002-007308 A | 1/2002 |
| JP | 2002530742 A | 9/2002 |
| JP | 2002-366429 A | 12/2002 |
| JP | 2004-192616 A | 7/2004 |
| JP | 2005537543 A | 12/2005 |
| JP | 2006065697 | 3/2006 |
| JP | 2006163711 | 6/2006 |
| JP | 2006293969 A | 10/2006 |
| JP | 2006528394 A | 12/2006 |
| JP | 2007526559 A | 9/2007 |
| TW | 546816 | 8/2003 |
| TW | 594778 | 6/2004 |
| TW | I244617 | 12/2005 |
| WO | 2007/002546 A2 | 1/2007 |

OTHER PUBLICATIONS

"MCP data sheet", Model KBE00F005A-D411, [online], Jun. 2005, Samsung Electronics Co., Ltd., [Searched on Apr. 10, 2006], <URL:1177550776718_0.aspx?family_cd=MCP0>.

Communication dated Feb. 4, 2012 from the Taiwanese Intellectual Property Office in counterpart Taiwanese application No. 097115281.

* cited by examiner

FIG.4

M0_LRG

| LRGFlag | ID | | | |
|---|---|---|---|---|
| 1 | 2 | 1 | 3 | - |

M1_LRG

| LRGFlag | ID | | | |
|---|---|---|---|---|
| 1 | 1 | 3 | - | - |

M2_LRG

| LRGFlag | ID | | | |
|---|---|---|---|---|
| 1 | 3 | - | - | - |

FIG.6A

M0_RRG

| RSELFlag | RRGFlag | ID | | | |
|---|---|---|---|---|---|
| 1 | 1 | 2 | - | - | - |

M1_RRG

| RSELFlag | RRGFlag | ID | | | |
|---|---|---|---|---|---|
| 1 | 1 | 1 | - | - | - |

M2_RG

| RSELFlag | RRGFlag | ID | | | |
|---|---|---|---|---|---|
| 1 | 1 | 3 | - | - | - |

FIG.6B

M0_RRG

| RSELFlag | RRGFlag | ID | | | |
|---|---|---|---|---|---|
| 0 | 0 | 2 | - | - | - |

M1_RRG

| RSELFlag | RRGFlag | ID | | | |
|---|---|---|---|---|---|
| 0 | 0 | 1 | - | - | - |

M2_RG

| RSELFlag | RRGFlag | ID | | | |
|---|---|---|---|---|---|
| 0 | 0 | 3 | - | - | - |

FIG.15

(a) M0 priority control

| Response Priority | Number of Response | | | |
|---|---|---|---|---|
| | Initial | → RsQO(M0) N time | → RsQP(M1) M time | → RsQP(M2) L time |
| PRsQo(M0) | 1 | 3 | 2 | 1 |
| PRsQp(M1) | 2 | 1 | 3 | 2 |
| PRsQp(M2) | 3 | 2 | 1 | 3 |

FIG.19

(b) M1 priority control

| Response Priority | Initial | Number of Response | | |
|---|---|---|---|---|
| | | RsQO(M0) → | RsQO(M1) M1 time → | RsQP(M2) L1 time |
| PRsQo(M1) | 1 | - | 2 | 1 |
| PRsQp(M2) | 2 | - | 1 | 2 |

FIG.22

(c) M2 priority control

| Response Priority | Number of Response | | | |
|---|---|---|---|---|
| | Initial | → RsQO(M0) <br> - | → RsQO(M1) <br> - | → RsQO(M2) <br> L2time(0) |
| PRsQo(M2) | 1 | - | - | 1 |

SEMICONDUCTOR DEVICE

BACKGROUND OF THE INVENTION

1. Technical Field

The present invention relates to a technique of a semiconductor device, and, more particularly relates to a technique that can be effectively applied to an information processing system including a nonvolatile memory and an information processing device, and to a control method of a memory module.

2. Background Art

Conventionally, there is known a combination semiconductor memory having a flash memory (32M-bit capacity) and a static random access memory (SRAM (4M-bit capacity)) integrally sealed into an FBGA (Fine pitch Ball Grid Array) package using a stack chip. The flash memory and the SRAM have an address input terminal and a data input/output terminal in common with regard to an input/output electrode of the FBGA package. However, each of the control terminals is independent of each other (for example, see Non-patent Document 1).

There is also known a combination semiconductor memory having a flash memory (1G-bit capacity) and a dynamic random access memory (DRAM (512M-bit capacity)) integrally sealed into an FBGA (Fine pitch Ball Grid Array) package using a stack chip. With the flash memory and the dynamic random access memory, an address input terminal, a data input/output terminal, and respective control terminals thereof are independent of each other with regard to an input/output electrode of the FBGA package (for example, see Non-patent Document 2).

There is also known a combination semiconductor memory having a flash memory chip and a DRAM chip integrally sealed into a lead frame package. In this combination semiconductor memory, the flash memory and the DRAM perform input and output operations using an address input terminal, a data input/output terminal, and respective control terminals in common with regard to the input/output electrode of the package (for example, see FIGS. 1 and 15 of Patent Document 1 and Patent Document 2).

There is also known a system including a flash memory handled as a main memory, and a cache memory, a controller, and a CPU (for example, see FIG. 1 of Patent Document 3).

There is also a semiconductor memory including a flash memory, a DRAM, and a transfer control circuit (for example, see FIG. 2 of Patent Document 4 and Patent Document 5).

There is also a memory module having a plurality of identical memories connected together (for example, see Patent Document 6 and Patent Document 7).

[Non-patent Document 1] "Data Sheet of Combination Memory (Stacked CSP), Flash Memory+RAM", Model LRS1380, [online], Dec. 10, 2001, Sharp Corporation, [Searched on Aug. 21, 2002], Internet <URL:http://www.sharp.co.jp/products/device/flash/cmlist.html>

[Non-patent Document 2] "MCP data sheet", Model KBE00F005A-D411, [online], June 2005, Samsung Electronics Co., Ltd., [Searched on Apr. 10, 2006], <URL: 1177550776718_0.aspx?family_cd=MCP0>

[Patent Document 1] Japanese Patent Application Laid-open No. H05-299616

[Patent Document 2] European Patent Application Publication No. 0566306

[Patent Document 3] Japanese Patent Application Laid-open No. H07-146820

[Patent Document 4] Japanese Patent Application Laid-open No. 2001-5723

[Patent Document 5] Japanese Patent Application Laid-open No. 2002-366429

[Patent Document 6] Japanese Patent Application Laid-open No. 2002-7308

[Patent Document 7] Japanese Patent Application Laid-open No. 2004-192616

SUMMARY

Disclosure of the Invention

Problem to be Solved by the Invention

Prior to the present application, the present inventors have examined an information processing system including a mobile phone, and a processor, a flash memory, and a random access memory used in the mobile phone.

As shown in FIG. 50, the mobile phone uses an information processing device PRC and memory modules MCM1 and MCM2. The information processing device PRC includes a central processing unit CPU and an SRAM controller SRC, a DRAM controller DRC, and a NAND flash memory controller NDC. The memory module MCM1 includes a NOR flash memory NOR FLASH and an SRAM. The memory module MCM2 includes a NAND flash memory NAND FLASH and a DRAM. The information processing device PRC accesses the memory modules MCM1 and MCM2 to read and write data.

After power-on, the information processing device PRC reads boot data stored in the NOR flash memory NOR FLASH to start itself up. Thereafter, the information processing device PRC reads, if necessary, an application program from the NOR flash memory NOR FLASH and executes it in the central processing unit CPU. The SRAM and the DRAM operate as a work memory and store the results of processing of the central processing unit CPU.

The NAND flash memory NAND FLASH mainly stores music data or video data, and the information processing device PRC reads music data or video data into the DRAM from the NAND flash memory NAND FLASH, if necessary, and plays the music or video. In recent years, mobile devices represented by mobile phones have been provided increasingly with more functions, and there have been necessities for handling various interfaces.

As shown in FIG. 50, a CPU includes controllers for each of different memory devices, which are connected to the memory in parallel. Furthermore, applications, data, and work areas used by the mobile phone are growing larger as more functions (distribution of music or games) are added to the mobile phone, whereby a larger capacity memory is required.

Accordingly, it has been found that the number of signal wirings for connecting the CPU and the memory increases, resulting in increased costs of substrate, noise, and signal skews which hinder cost reductions, speeding up, and downsizing of mobile phones.

It is therefore an object of the present invention to decrease the number of signal wirings between an information processing device and a memory as well as between memories, and provide a high-speed, low-cost, and user-friendly information processing system while ensuring scalability of memory capacity.

Means for Solving the Problem

As representative means of the present invention, an information processing device, a dynamic random access memory, a NOR flash memory, and a NAND flash memory are serially-connected and incorporated into a single sealing body, which is provided with an electrode for wiring a semiconductor chip to the sealing body and an electrode for connecting the sealing body and the outside of the sealing body.

It is preferred that a read request from the information processing device to the dynamic random access memory, the NOR flash memory, and the NAND flash memory of each memory includes recognition information of the request destination, and the read data includes recognition information of the source of transfer.

It is preferred that the read request from the information processing device to the dynamic random access memory, the NOR flash memory, and the NAND flash memory of each memory includes request number information, and the read data includes response number information.

It is preferred that respective memories generate request number information corresponding to the read request from the information processing device to the dynamic random access memory, the NOR flash memory, and the NAND flash memory of each memory.

It is preferred that latency information of the read data is preliminarily output for reading data from the dynamic random access memory, the NOR flash memory, and the NAND flash memory of each memory.

It is preferred to request, from the information processing device, a reservation of a request queue and a response queue provided in the dynamic random access memory, the NOR flash memory, and the NAND flash memory of each memory.

It is preferred that the order, among respective memories, of reading data into the information processing device is dynamically determined according to the number of times the data is read. Furthermore, it is preferred that the number of read times is programmable.

It is preferred to control such that the information processing device determines, after power-on, the identification information for the respective memories serially connected thereto.

It is preferred to control such that data read earlier can be transmitted without waiting for slower data read, regardless of the temporal order of read requests that have been input to the memory.

It is preferred to control such that the circuit accepting read requests from respective memories and the circuit transmitting the read data can be operated independently.

It is preferred to control such that write and read operations can be performed independently.

It is preferred to control such that the clock frequency of each memory can be changed as necessary.

It is preferred that the information processing device performs error detection and correction when reading data from the NAND flash memory, and performs a replacement process for a failed address to which the write operation failed when writing data.

Effect of the Invention

The present invention can achieve a high-speed, low-cost, and user-friendly information processing system that can ensure scalability of memory capacity.

BRIEF DESCRIPTION OF THE DRAWINGS

FIG. 4 shows an example of a setting value of the register;

FIG. 6 shows an example of a setting value of the register;

FIG. 15 is a diagram showing one example of a changing operation of a priority order of the response of the response schedule circuit;

FIG. 19 is a diagram showing one example of a changing operation of a priority order of the response of the response schedule circuit;

FIG. 22 is a diagram showing one example of a changing operation of a priority order of the response of the response schedule circuit;

DETAILED DESCRIPTION OF THE EMBODIMENTS

Best Mode for Carrying Out the Invention

Circuit elements constituting respective blocks, which are not particularly limited in the embodiments of the present invention, are formed on a semiconductor substrate such as single crystal silicon using a well-known integrated circuit technology such as CMOS (Complementary MOS transistor).

(First Embodiment)

Figure 1:
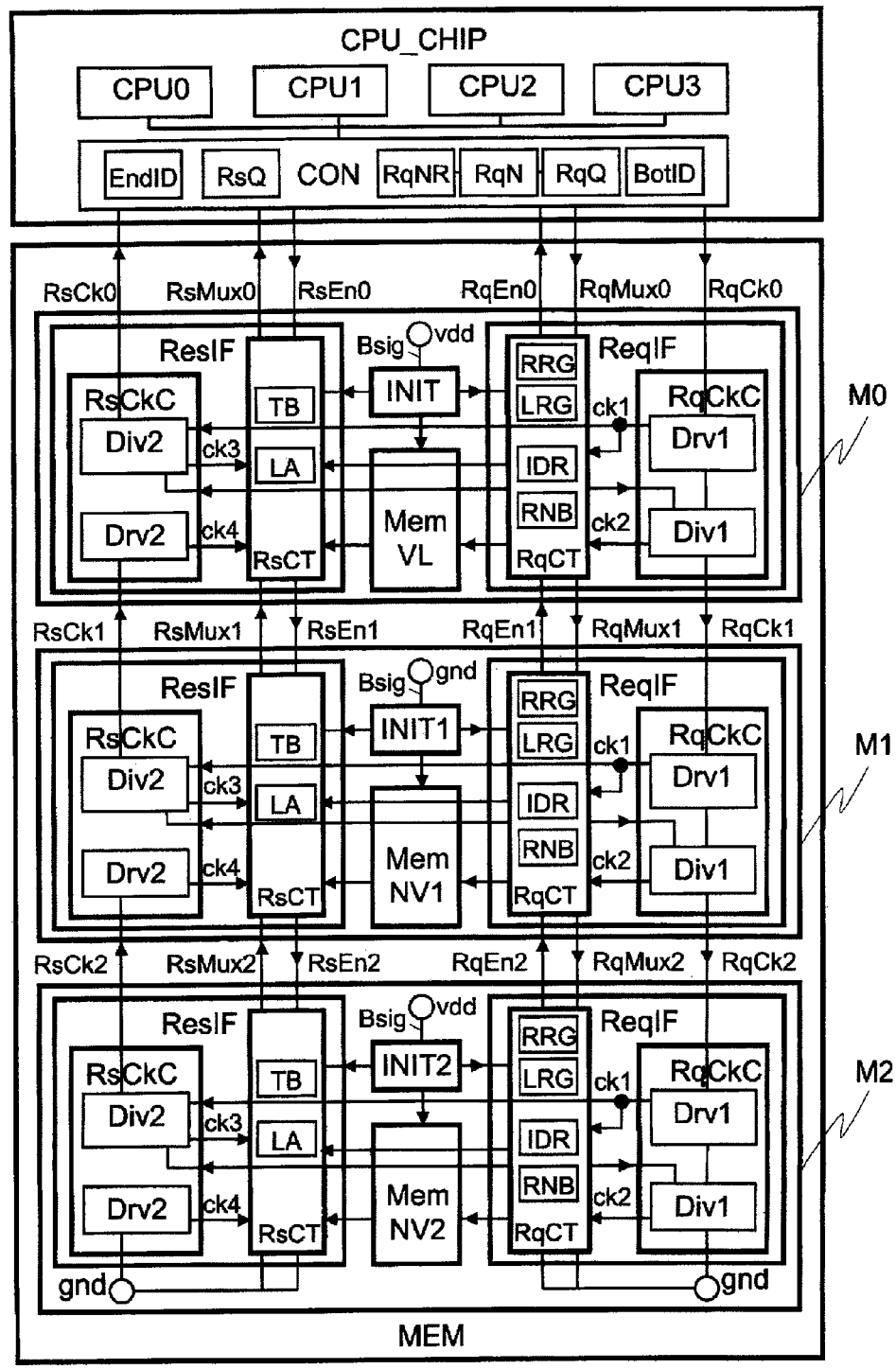
FIG. 1 is a configuration diagram showing one example of an information processing system of the present invention.

FIG. 1 shows an information processing system according to a first embodiment of the present invention, including an information processing device CPU_CHIP and a memory module MEM, which will be respectively described below.

The information processing device CPU_CHIP includes information processing circuits CPU0, CPU1, CPU2, and CPU3, and a memory control circuit CON. The memory control circuit CON includes a request queue RqQ, a response queue RsQ, a boot device ID register BotID, an end-device ID register EndID, a request number generating circuit RqN, and a request number generating register RqNR. CPU0, CPU1, CPU2, and CPU3 read and execute the OS, application programs and data to be processed by the application programs from the memory module MEM through the memory control circuit CON.

The request queue RqQ stores the result of the application program executed in CPU0, CPU1, CPU2, and CPU3 for outputting to the memory module MEM. The response queue RsQ stores the application program that has been read from the memory module MEM for outputting to CPU0, CPU1, CPU2, and CPU3.

The memory module MEM includes memory chips M0, M1, and M2. The information processing device CPU_CHIP and the memory chips M0, M1, and M2 are serially connected. The memory chip M0 is a volatile memory, whereas the memory chips M1 and M2 are nonvolatile memories. As representative volatile memories, there are a DRAM using dynamic random access memory cells in the memory array, a pseudo static random access memory PSRAM, or an SRAM using static random access memory cells, and any of these volatile memory cells can be used for the present invention. In the present embodiment, an example using dynamic random access memory cells in a memory array is described.

As nonvolatile memories, a ROM (Read Only Memory), an EEPROM (Electrical Erasable and Programmable ROM), a flash memory, a phase-change memory, a magnetic random access memory (MRAM), or a resistance switching random access memory ReRAM can be used. A flash memory is exemplified in the present embodiment.

Representative flash memories include a NOR flash memory, an AND flash memory, a NAND flash memory, and an ORNAND flash memory, and any of which can be used in the present invention. Any of the above memory can be used in the present invention. In the present embodiment, the NOR flash memory and the NAND flash memory are exemplified.

Typical volatile memories used as the memory chip M0 include a dynamic random access memory using dynamic memory cells with a read time of about 15 nanoseconds and a memory capacity of about 1 Gbit, although not particularly limited thereto. The memory chip M0 is used as a temporary work memory for executing the application program by the information processing device CPU_CHIP, although not particularly limited thereto.

A typical flash memory used as the memory chip M1 uses NOR flash memory cells, although not particularly limited thereto, with a read time of about 80 nanoseconds and a large memory capacity of about 1 Gbit. The memory chip M1 stores the OS, boot codes, a boot device ID value, an end-device ID value, and application programs executed by the information processing device CPU_CHIP, although not particularly limited thereto.

The typical flash memory used as the memory chip M2 employs NAND flash memory cells, although not particularly limited thereto, with a read time of about 25 microseconds and a memory capacity of about 4 Gbits. The memory chip M2 mainly stores audio data, still image data, video data required for replaying, audio recording, and video recording by the information processing device CPU_CHIP, although not particularly limited thereto.

The memory chip M0 includes an initialization circuit INIT, a request interface circuit ReqIF, a response interface circuit ResIF, and a memory circuit MemVL. The request interface circuit ReqIF includes a request clock control circuit RqCkC and a request queue control circuit RqCT. The response interface circuit ResIF includes a response clock control circuit RsCkC and a response queue control circuit RqCT. The memory circuit MemVL is a volatile memory, specifically a dynamic random access memory using dynamic random access memory cells, although not particularly limited thereto. The request clock control circuit RqCkC includes a clock driver circuit Drv1 and a clock frequency dividing circuit Div1. The memory chip M1 includes an initialization circuit INIT, the request interface circuit ReqIF, the response interface circuit ResIF, and a memory circuit MemNV1.

The request interface circuit ReqIF includes the request clock control circuit RqCkC and the request queue control circuit RqCT.

The response interface circuit ResIF includes the response clock control circuit RsCkC and the response queue control circuit RqCT.

Although not particularly limited thereto, the request queue control circuit RqCT of each memory chip has a request queue ReqQ capable of mainly storing a plurality of requests, an ID register IDR, a latency value output setting register LRG, a response order setting register RRG, a request number setting circuit RNB provided therein, and response queue control circuit RqCT has a response queue ResQ capable of mainly storing a plurality of responses, a latency calculating circuit LA, and a response number table TB provided therein.

The memory chip M1 includes an initialization circuit INIT1, the request interface circuit ReqIF, the response interface circuit ResIF, and a memory circuit MemNV1.

The request interface circuit ReqIF includes the request clock control circuit RqCkC and the request queue control circuit RqCT. The response interface circuit ResIF includes the response clock control circuit RsCkC and the response queue control circuit RqCT. The memory circuit MemNV1 is a nonvolatile memory, specifically a NOR flash memory using NOR flash memory cells, although not particularly limited thereto. The request clock control circuit RqCkC includes the clock driver circuit Drv1 and the clock frequency dividing circuit Div1.

The configuration of the request interface circuit ReqIF and the response interface circuit ResIF is identical with the memory chip M0.

The memory chip M2 includes an initialization circuit INIT, the request interface circuit ReqIF, the response interface circuit ResIF, and a memory circuit MemNV2. In order to indicate that the memory chip M2 is the memory chip at the farthest end of serially connected memory chips, it grounds (gnd) RqEn3, RsMux3, and RqCk3, although not particularly limited thereto.

The request interface circuit ReqIF includes the request clock control circuit RqCkC and the request queue control circuit RqCT. The response interface circuit ResIF includes the response clock control circuit RsCkC and the response queue control circuit RqCT. The memory circuit MemNV2 is a nonvolatile memory, specifically a NAND flash memory using NAND flash memory cells, although not particularly limited thereto. The request clock control circuit RqCkC includes the clock driver circuit Drv1 and the clock frequency dividing circuit Divi.

The configuration of the request interface circuit ReqIF and the response interface circuit ResIF is identical with the memory chip M0.

The initialization circuit INIT of the memory chips M0, M1, and M2 performs initialization of respective memory chips, immediately after power-on. The request queue control circuit RqCT of the memory chips M0, M1, and M2 has an ID register storing ID numbers of respective memory chips provided therein. Immediately after power-on, the initialization circuit INIT first performs initialization, subsequently the information processing device CPU_CHIP determines ID numbers of the memory chips M0, M1, and M2, which are stored in an ID register within each memory chip.

Each of the memory chips M0, M1, and M2 has a boot device recognition signal Bsig, although not particularly limited thereto. If the boot device recognition signal Bsig is grounded (gnd), it indicates that the memory chip is a boot device storing a boot program that performs the operation immediately after power-on. If the boot device recognition signal Bsig is connected to a power supply (vdd), it indicates that the memory chip is not the boot device. The memory chip M1 is the boot device, although not particularly limited thereto, whereas the memory chips M0 and M2 are not set as the boot device. In addition, a boot device recognition signal Bsig can be used to program which one of the chips is set as the boot device.

RqCk0, RqCK1, and RqCk2 are request clocks, whereas RsCk0, RsCK1, and RsCk2 are response clocks. RqEN0, RqEN1, and RqEN2 are request enable signals, whereas RsEN0, RsEN1, and RsEN2 are response enable signals. RqMux0, RqMux1, and RqMux2 are request signals, whereas RsMux0, RsMux1, and RsMux2 are response signals.

The memory chip M0 sets RqEN0 to High if it is capable of accepting a request from the information processing device CPU_CHIP and Low if it is not, although not particularly limited thereto. The memory chip M1 sets RqEN1 to High if it is capable of accepting a request from the memory chip M0 and Low if it is not, although not particularly limited thereto. The memory chip M2 sets RqEN2 to High if it is capable of accepting a request from the memory chip M1 and Low if it is not, although not particularly limited thereto.

RqMux0, RqMux1, and RqMux2 are request signals. The requests transmitted through these request signals have ID values, commands, addresses, request numbers, and the written data multiplexed therein, although not particularly limited thereto, and are transmitted in synchronization with respective request clocks RqCk0, RqCk1, and RqCk2. RsMux0, RsMux1, and RsMux2 are response signals. The responses transmitted through these response signals have ID values, response numbers, latency values or latency level values of the read data, and the read data multiplexed therein, although not particularly limited thereto, and are transmitted in synchronization with respective response clocks RsCk0, RsCk1, and RsCk2.

An operation of the information processing system is described below. An operation at power-on and immediately after power-on is described first.

<Operation Immediately After Power-On> <Initial Sequence at Power-On>

Figure 2:
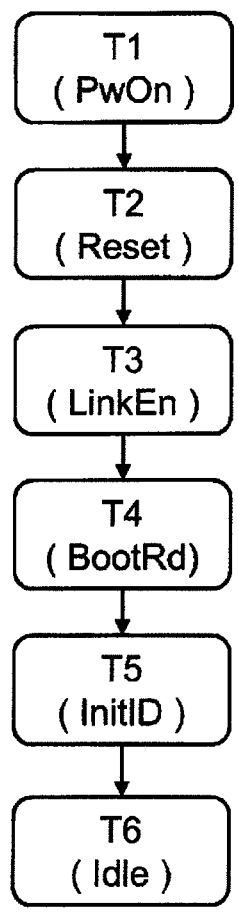
FIG. 2 is an example of an initial sequence when powering on the information processing system.

An example of an operation of the information processing system at power-on is described first with reference to FIGS. 1 and 2.

FIG. 2 is an example of an initial sequence when powering on the information processing system device.

The information processing device CPU_CHIP and the memory chips M0, M1, and M2 in the memory module MEM are powered on within a period T1 (PwON) and reset within a period T2 (Reset). The method of resetting is not particularly limited, thus resetting can be automatically performed in each built-in circuit, or an external reset terminal can be provided to perform a reset operation by a reset signal thereof.

In the reset period T2 (Reset), internal states of the information processing device CPU_CHIP and the memory chips M0, M1, and M2 are initialized. An example thereof is described below.

The information processing device CPU_CHIP initializes the boot device ID register BotID to 1 and the end-device ID register EndID to 0.

In the memory chip M0, its own initialization circuit INIT initializes the request queue control circuit RqCT, the response queue control circuit RqCT, the request control circuit RqCkc, the response clock control circuit RsCkC, the clock frequency dividing circuits Div1 and Div2, and its own memory circuit MemVL. An ID value and an ID valid bit held in the ID register IDR are initialized to 0 and Low, respectively.

A latency value output flag information LRGFlag value and an ID information value held in the latency output register LRG are initialized to 0, respectively.

A request number selection flag RSELFlag value, a response order flag RRGFlag value, and an ID information value held in the response order setting register RRG are initialized to 0, respectively. With regard to the response priority of a response mediation circuit held in the response queue control circuit RqCT, response priorities of the memory chips M0, M1, and M2 are initialized to 1, 2, and 3, respectively. Frequency dividing ratio of the clock frequency dividing circuits Div1 and Div2 is initialized to 1.

In the memory chip M1, its own initialization circuit INIT initializes the request queue control circuit RqCT, the response queue control circuit RqCT, the request control circuit RqCkc, the response clock control circuit RsCkC, the clock frequency dividing circuits Div1 and Div2, and its own memory circuit MemNV1. The ID value and the ID valid bit held in the ID register IDR are initialized to 0 and Low, respectively. The latency value output flag information LRGFlag value and the ID information value held in the latency output register LRG are initialized to 0, respectively.

The request number selection flag RSELFlag value, the response order flag RRGFlag value, and the ID information value held in the response order setting register RRG are initialized to 0, respectively. With regard to response priority of the response mediation circuit held in the response queue control circuit RqCT of the memory chip M1, response priorities of the memory chips M1 and M2 are initialized to 1 and 2, respectively. Frequency dividing ratio of the clock frequency dividing circuits Div1 and Div2 is initialized to 1.

In the memory chip M2, its own initialization circuit INIT initializes the request queue control circuit RqCT, the response queue control circuit RqCT, the request control circuit RqCkc, the response clock control circuit RsCkC, the clock frequency dividing circuits Div1 and Div2, and its own memory circuit MemNV2. The ID value and the ID valid bit held in the ID register IDR are initialized to 0 and Low, respectively. The latency value output flag information LRGFlag value and the ID information value held in the latency output register LRG are initialized to 0, respectively.

The request number selection flag RSELFlag value, the response order flag RRGFlag value, and the ID information value held in the response order setting register RRG are initialized to 0, respectively. With regard to response priority of the memory chip M2, response priorities of the memory chip is initialized to 1. Frequency dividing ratio of the clock frequency dividing circuits Div1 and Div2 is initialized to 1.

In a period T3 (LinkEn) after the reset period T2 (Reset) has expired, connection of signals of the information processing device CPU_CHIP and the memory chips M0, M1, and M2 is confirmed. An example thereof is described below.

The request clock RqCk0 is input to the memory chip M0 from the information processing device CPU_CHIP, and output through a clock driver Drv1 of the memory chip M0 to the clock frequency dividing circuits Div1 and Div2 as a clock signal ck1. The clock that has been input to the clock frequency dividing circuit Div1 is output to the memory chip M1 through the request clock RqCk1. The clock that has been input to the clock frequency dividing circuit Div1 is output from a clock signal ck2 and also output to the memory chip M2 through the request clock RqCk1. The clock that has been input to the clock frequency dividing circuit Div2 is output from a clock signal ck3 and also output to the information processing device CPU_CHIP through the response clock RsCk0. The clock that has been input to the clock driver Drv1 of the memory chip M1 is output to the clock frequency dividing circuit Div1 and the clock frequency dividing circuit Div2 as the clock signal ck1. The clock that has been input to the clock frequency dividing circuit Div1 is output from the clock signal ck2 and also output to the memory chip M2 through the request clock RqCk1. The clock that has been input to the clock frequency dividing circuit Div2 is output from the clock signal ck3 and also output to the memory chip M0 through the response clock RsCk1. The clock that has been input to the clock driver Drv2 of the memory chip M0 through the response clock RsCk1 is output to a clock signal ck4. The clock that has been input to the clock driver Drv1 of the memory chip M2 is output to the clock frequency dividing circuit Div1 and the clock frequency dividing circuit Div2 as the clock signal ck1. The clock that has been input to the clock frequency dividing circuit Div2 is output from the clock signal ck3 and also output to the memory chip M2 through the request clock RqCk1. The clock that has been input to the clock driver Drv2 of the memory chip M1 through the response clock RsCk2 is output to the clock signal ck4.

The memory chip M0 then recognizes that it is not the boot device because the boot device recognition signal Bsig is connected to the power supply vdd. The memory chip M1 recognizes that it is the boot device because the boot device recognition signal Bsig is grounded (gnd), and sets the boot device ID value 1 held in its own memory circuit MemNV1 to the ID register, and sets the ID valid bit to High. The memory chip M2 recognizes that it is not the boot device because the boot device recognition signal Bsig is connected to the power supply. Having grounded (gnd) RqEn3, RsMux3, and RqCk3, the memory chip M2 recognizes that it is located at the farthest end of serially connected memory chips, and sets a request enable signal RqEn2 to High.

The memory chip M1 then confirms that the request enable signal RqEn2 has become High and sets a response enable signal RsEn2 and a request enable signal RqEn1 to High. Subsequently, the memory chip M0 confirms that the request enable signal RqEn1 has become High and sets a response enable signal RsEn1 and a request enable signal RqEn0 to High. Finally, the information processing device CPU_CHIP confirms that the request enable signal RqEn0 has become High and, recognizing that signal connection of respective memory chips has been confirmed, sets a response enable signal RsEn0 to High. Accordingly, it can be confirmed that the information processing device CPU_CHIP and the memory chips M0, M1, and M2 are serially connected.

In a period T4 (BootRd) after the period T3 has expired, the information processing device CPU_CHIP reads the boot data from the memory chip M1. An exemplary operation is described below.

The information processing device CPU_CHIP reads a value 1 of the boot device ID register BotID, synchronizes a request ReqBAm1 having the ID value 1, a bank activation instruction BA, a bank address BK0, and a page address Page0 multiplexed therein with a clock signal RqCK0, and transfers the request ReqBAm1 to the memory chip M0 through the request signal RqMux0.

Subsequently, the information processing device CPU_CHIP synchronizes a request ReqRDm1 having the ID value 1, a read instruction RD, the bank address BK0, and a column address Col multiplexed therein with the clock signal RqCK0, and transfers the request ReqRDm1 to the memory chip M0 through the request signal RqMux0.

The memory chip M0 stores the requests ReqBAm1 and ReqRDm1 from the information processing device CPU_CHIP sequentially in its own request queue control circuit RqCT.

The memory chip M0 compares the ID value 1 included in the requests ReqBAm1 and ReqRDm1 sequentially with a value 2 of its own ID register. Because the result of comparison is a mismatch, the memory chip M0 determines that the requests ReqBAm1 and ReqRD16m1 are not requests directed to itself and sequentially transfers them to the memory chip M1 through the request signal RqMux1.

The memory chip M1 stores the requests ReqBAm1 and ReqRDm from the memory chip M0 into its own request queue control circuit RqCT.

The request queue control circuit RqCT of the memory chip M1 compares the ID value 1 included in the request ReqBAm1 with the value 1 of its own ID register. Because the values match each other, the request queue control circuit RqCT transmits a request ReqBA1 to the memory circuit MemVL. According to the bank activation instruction BA, the bank address BK0, and the page address Page0 included in the request ReqBAm1, the memory circuit MemVL transfers the boot data equivalent to a specified page (1 kByte, although not particularly limited thereto) to a buffer BUF0. The boot data includes a boot program and an end-device ID number 3.

The request queue control circuit RqCT of the memory chip M1 compares the ID value 1 included in the request ReqRDm1 with the value 1 of its own ID register. Because the values match each other, the request queue control circuit RqCT transmits the request ReqRDm1 to the memory circuit MemVL.

Boot data including the end-device ID number 3 within the buffer BUF0 is read by a read instruction RD16, the bank address BK0, and the column address Col included in the request ReqRDm1 from the memory circuit MemNV1 of the memory chip M1, and transferred, together with the ID register value 1, to a response queue control circuit RsCT as a response RsRDm1.

The response queue control circuit RsCT of the memory chip M1 outputs the response RsRDm1 to the memory chip M0 through the response signal RsMux0. The memory chip M0 outputs the response RsRDm1 to the receiving information processing device CPU_CHIP.

The information processing device CPU_CHIP stores a response ResRDm1 to the response queue RsQ. The ID value 1 included in a response ResBRD1 indicates that the boot data has been transmitted from the memory chip M1. An end-device ID value 3 is stored in the end-device ID register EndID within the memory control circuit CON.

In a period T5 (InitID) after the period T4 has expired, the information processing device CPU_CHIP starts up itself by the boot program and subsequently allocates an ID number to each of the memory chips M0, M1, and M2. An exemplary operation is described below.

According to the boot code, the information processing device CPU_CHIP first performs ID numbering to each memory chip. The information processing device CPU_CHIP transfers an ID number 2 and an ID setting instruction to the memory chip M0 through the request signal RqMux0. In memory chips M0, ID numbering is not yet performed because the ID valid bit is Low. Therefore, the memory chip M0 sets the ID number 2 to the ID register according to the ID number 2 and the ID setting instruction and sets the ID valid bit to High. The ID valid bit being High indicates that the ID numbering has been completed. Upon completing the ID numbering by the memory chip M0, the memory chip M0 outputs an ID value 2 of the memory chip M0 and ID numbering completion information through the response signal RsMux0. The information processing device CPU_CHIP receives the ID value 2 and the ID numbering completion information of the memory chip M0 and recognizes that ID numbering of the memory chip M0 has been completed.

The information processing device CPU_CHIP then transfers a request ReqID3 having the ID number 3 and an ID setting instruction multiplexed therein to the memory chip M0 through the request signal RqMux0. The memory chip M0 compares the ID number 2 of its own with the ID number 3 included in the request ReqID3 and, because of a mismatch, transfers the request ReqID3 to the memory chip M1.

The memory chip M1 compares the ID number 1 of its own ID with the ID number 3 included in the request ReqID3 and, because of a mismatch, transfers the request ReqID3 to the memory chip M2. In the memory chip M2, ID numbering is not yet performed because the ID valid bit is Low. Therefore, the memory chip M2 sets the ID number 3 to the ID register of the memory chip M2 according to the ID number 3 included in the request ReqID3 and the ID setting instruction, and sets the ID valid bit to High. Upon completing the ID numbering of the memory chip M2, the memory chip M2 outputs a response ResID3 having the ID value 3 of the memory chip M2 and the ID numbering completion information multiplexed therein to the memory chip M1 through a response signal RqMux2. The memory chip M1 outputs the response ResID3 to the memory chip M0 through the response signal RqMux1. The memory chip M0 transfers the response ResID3 to the information processing device CPU_CHIP through a response signal RqMux0. Having received the response ResID3, the information processing device CPU_CHIP receives the ID value 3 and the ID numbering completion information of the memory chip M2 included in the response ResID3 and recognizes that ID numbering of the memory chip M2 has been completed. Furthermore, the information processing device CPU_CHIP compares the transferred ID value 3 of the memory chip M2 with the end-device ID value 3 set in the end-device ID register EndID within the memory control circuit CON and, because the values match each other, confirms that ID numbering has been performed up to the memory chip at the farthest end.

In and after a period T6 (Idle) after the period T5 has expired, the memory module MEM turns into an idle state in which it waits for a request from the information processing device CPU_CHP.

As described above, it can be confirmed that the memories are reliably connected with each other by performing a checking operation of serial connection immediately after power-on. Furthermore, only the necessary number of memory chips can be easily connected to expand memory capacity, by clearly indicating the boot device and the memory chip at the farthest end and automatically allocating an ID to each memory.

<Register Setting: Latency Value Output Setting Register LRG>

A data setting operation to a latency value output register LREG of the memory chips M0, M1, and M2 after the initial sequence at power-on has been completed is described with reference to FIG. 3.

In latency value output setting register LRG, it is possible to set from which of the memory chips M0, M1, and M2 the latency value relating to the response of the memory chip should be output.

ID register values of the memory chips M0, M1, and M2 are set to 2, 1, and 3, respectively, although not particularly limited thereto.

Figure 3:
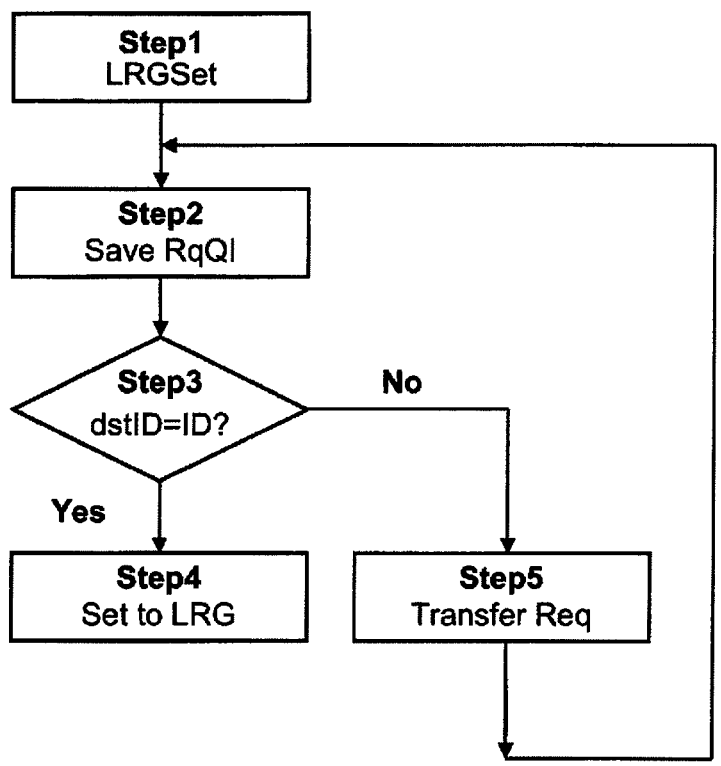
FIG. 3 is a flowchart showing an example of an operation of setting data to a register.

FIG. 3 is a flowchart showing an example of an operation of setting data to the latency value output register LREG of the memory chips M0, M1, and of M2.

ID register values of the memory chips M0, M1, and M2 are set to 2, 1, and 3, respectively, although not particularly limited thereto.

An operation of setting data to the latency value output register LREG of the memory chip M0 is described first.

The information processing device CPU_CHIP synchronizes a request ReqLRGSet0 having the ID value 2, a latency value output register setting instruction LRGSet, and a setting value LRGData0 to the latency value output register LRG multiplexed therein with the clock signal RqCK0, and transfers the request ReqLRGSet0 to the memory chip M0 through the request signal RqMux0 (FIG. 3: Step 1). The setting value LRGData0 to the latency output register LRG includes a latency value output flag information LRGFlag value 1, the ID value 2, the ID value 1, and the ID value 3.

The request queue control circuit RqCT of the memory chip M0 stores the request ReqLRGSet0 (FIG. 3: Step 2).

The request queue control circuit RqCT of the memory chip M0 then compares the ID value 2 included in the request ReqLRGSet0 with the value 2 of its own ID register (FIG. 3: Step 3).

Because the values match each other, the setting value LRGData0 is set to the latency value output register LRG of the memory chip M0 (FIG. 3: Step 4).

The operation of setting data to the latency value output register LREG of the memory chip M1 is described next.

The information processing device CPU_CHIP synchronizes a request ReqLRGSet1 having the ID value 1, the latency value output register setting instruction LRGSet, and a setting value LRGData1 to the latency value output register LRG multiplexed therein with the clock signal RqCK0, and transfers the request ReqLRGSet1 to the memory chip M0 through the request signal RqMux0 (FIG. 3: Step 1). The setting value LRGData1 includes the latency value output flag information LRGFlag value 1, the ID value 2, the ID value 1, and the ID value 3.

The request queue control circuit RqCT of the memory chip M0 stores the request ReqLRGSet1 (FIG. 3: Step 2).

The request queue control circuit RqCT of the memory chip M0 then compares the ID value 1 included in the request ReqLRGSet1 with the value 2 of its own ID register (FIG. 3: Step 3).

Because the values do not match each other, the request queue control circuit RqCT of the memory chip M0 transfers the request ReqLRGSet1 to a request queue circuit RqQX0 and transmits it to the memory chip M1 ((FIG. 3: Step 5).

The request queue control circuit RqCT of the memory chip M1 stores the request ReqLRGSet1 (FIG. 3: Step 2).

The request queue control circuit RqCT of the memory chip M1 then compares the ID value 1 included in the request ReqLRGSet1 with the value 1 of its own ID register (FIG. 3: Step 3).

Because the values match each other, the setting value LRGData1 is set to the latency value output register LRG of the memory chip M1 (FIG. 3: Step 4).

The operation of setting data to the latency value output register LREG of the memory chip M2 is similar to that of the memory chip M1.

FIG. 4 shows an example of a setting value of the latency value output register LREG of the memory chips M0, M1, and M2.

According to the setting value of a latency value output register M0_LREG of the memory chip M0, the memory chip M0 outputs a response for the request to itself, and latency values with regard to the request to the memory chip M1 and the request to the memory chip M2.

According to the setting value of a latency value output register M1_LREG of the memory chip M1, the memory chip M1 outputs response for the request to itself and a latency value relating to the request to the memory chip M2.

According to the setting value of a latency value output register M2_LREG of the memory chip M2, the memory chip M2 outputs a latency value relating to the response for the request to itself.

By outputting the latency value indicating when the data is supposed to be output, before outputting the data, the information processing device CPU_CHIP can preliminarily recognize the arrival time of the data. Thus the information processing device CPU_CHIP can perform other processed required before arrival of the data, thereby improving the performance.

<Register Setting: Response Order Setting Register RRG>

Figure 5:
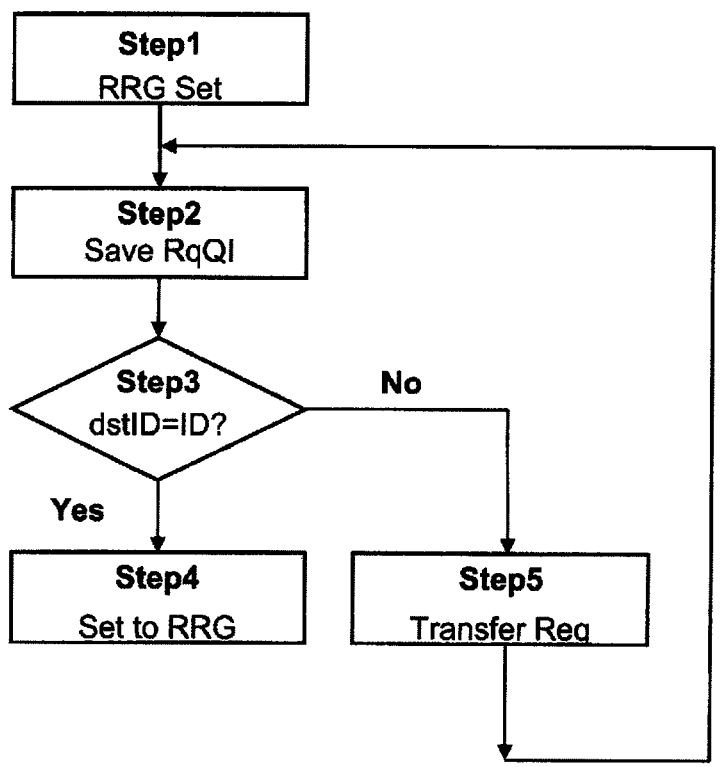
FIG. 5 is a flowchart showing an example of an operation of setting data to a register.

FIG. 5 is a flowchart showing an example of an operation of setting data to the response order setting register RRG of the memory chips M0, M1, and M2.

The operation of setting data to the response order setting register RRG of the memory chip M0 is described first.

The information processing device CPU_CHIP synchronizes a request ReqRRGSet0 having the ID value 2, a response order setting register setting instruction RRGSet, and a setting value RRGData0 to the response order setting register RRG multiplexed therein with the clock signal RqCK0, and transfers the request ReqRRGSet0 to the memory chip M0 through the request signal RqMux0 (FIG. 5: Step 1). The setting value RRGData0 includes a request number selection flag information RSELFlag value, a response order flag RRGFlag information, and the ID value.

The request queue control circuit RqCT of the memory chip M0 stores the request ReqRRGSet0 (FIG. 5: Step 2).

The request queue control circuit RqCT of the memory chip M0 then compares the ID value 2 included in the request ReqRRGSet0 with the value 2 of its own ID register (FIG. 5: Step 3).

Because the values match each other, the setting value RRGData0 is set to the response order setting register RRG of the memory chip M0. (FIG. 5: Step 4).

The operation of setting data to the memory chip M1 is described next.

The information processing device CPU_CHIP synchronizes a request ReqRRGSet1 having the ID value 1, the response order setting register setting instruction RRGSet, a setting value RRGData1 to the response order setting register RRG multiplexed therein with the clock signal RqCK0, and transfers the request ReqRRGSet1 to the memory chip M0 through the request signal RqMux0 (FIG. 5: Step 1).

The setting value RRGData1 includes a request number selection flag information RSELFlag value 1, the response order flag information RRGFlag value 1, and the ID value 2.

The request queue control circuit RqCT of the memory chip M0 stores the request ReqRRGSet1 (FIG. 5: Step 2).

The request queue control circuit RqCT of the memory chip M0 then compares the ID value 1 included in the request ReqRRGSet1 with the value 2 of its own ID register (FIG. 5: Step 3).

Because the values do not match each other, the request queue control circuit RqCT of the memory chip M0 transfers the request ReqRRGSet1 to the request queue circuit RqQX0 and transmits it to the memory chip M1 (FIG. 5: Step 5).

The request queue control circuit RqCT of the memory chip M1 stores the request ReqRRGSet1 (FIG. 5: Step 2).

The request queue control circuit RqCT of the memory chip M1 then compares the ID value 1 included in the request ReqRRGSet1 with the value 1 of its own ID register (FIG. 5: Step 3).

Because the values match each other, the setting value RRGData1 is set to the response order setting register RRG of the memory chip M1 (FIG. 5: Step 4).

The operation of setting the response order setting register RRG of the memory chip M2 is similar to that of the memory chip M1.

FIGS. 6(a) and (b) show an example of a setting value of the response order setting register RRG of the memory chips M0, M1, and M2. M0_RRG is the response order setting register RRG of the memory chip M0. M1_RRG is the response order setting register RRG of the memory chip M1. M2_RRG is the response order setting register RRG of the memory chip M2.

If the request number selection flag information RSELFlag value is 0, the response order is determined using the request number included in the request transmitted from the information processing device CPU_CHIP to the memory module MEM, whereas, if the request number selection flag information RSELFlag value is 1, the memory chip generates a request number corresponding to the request to be transmitted from the information processing device CPU_CHIP to the memory module MEM to determine the response order using the generated request number, although not particularly limited thereto.

If the response order flag information RRGFlag value is 0, although not particularly limited thereto, responses that can be transmitted earlier are transmitted to the memory module MEM first, without being restricted by the order of inputting requests, whereas, if the response order flag information RRGFlag value is 1, responses are transmitted in the order of inputting requests to the memory module MEM.

According to the setting value of the response order setting register RRG shown in FIG. 6(a), the memory chip M0 transmits responses in the order of inputting requests, using the request numbers that the memory chip M0 has generated with regard to requests directed to itself. As for its own responses and responses that have been input to the memory chip M0 from the memory chips M1 or M2, the memory chip M0 can transmit, to the information processing device CPU_CHIP, responses that can be transmitted earlier first, without waiting for slower responses regardless of the order of inputting requests.

The memory chip M1 transmits responses in the order of inputting requests, using the request numbers that the memory chip M1 has generated with regard to requests directed to itself. As for its own responses and responses that have been input from the memory chip M2 to the memory chip M1, the memory chip M1 can transmit, to the memory chip M0, responses that can be transmitted earlier first, without waiting for slower responses regardless of the order of inputting requests.

The memory chip M2 transmits, to the memory chip M1, responses in the order of inputting requests, using the request numbers that the memory chip M2 has generated with regard to requests directed to itself.

According to the setting value of the response order setting register RRG shown in FIG. 6(b), the memory chip M0 transmits, to the information processing device CPU_CHIP, responses that can be transmitted earlier first, without waiting for slower responses regardless of the order of inputting requests, using the request numbers transmitted from the information processing device CPU_CHIP with regard to requests directed to itself. As for its own responses and responses that have been input to the memory chip M0 from the memory chips M1 or M2, the memory chip M0 can transmit, to the information processing device CPU_CHIP, responses that can be transmitted earlier first, without waiting for slower responses regardless of the order of inputting requests.

The memory chip M1 transmits, to the memory chip M0, responses that can be transmitted earlier first, without waiting for slower responses regardless of the order of inputting requests, using the request numbers transmitted from the information processing device CPU_CHIP with regard to requests directed to itself. As for its own responses and responses that have been input to the memory chip M1 from the memory chip M2, the memory chip M1 can transmit, to the memory chip M0, responses that can be transmitted earlier first, without waiting for slower responses regardless of the order of inputting requests.

The memory chip M2 transmits, to the memory chip M1, responses that can be transmitted earlier first, without waiting for slower responses regardless of the order of inputting requests, using the request numbers transmitted from the information processing device CPU_CHIP with regard to requests directed to itself.

Needless to say, an order of responses among a plurality of memory chips can be set by setting a plurality of ID values corresponding to the response order flag information RRGFlag of the response order setting register RRG.

As described above, because it is possible to set, using the response order setting register RRG, either to transmit responses in the order of inputting requests or transmit responses that can be transmitted earlier first, without being restricted by the order of inputting requests among or between memory chips, an improved performance can be obtained while flexibly adapting to the method of arranging the OS, boot programs, or application programs to the memory chips, required by the information processing device CPU_CHIP in various manners according to the target system.

<Description of Normal Operation: Output of Latency Value>

Data transfer between the memory module MEM and the information processing device CPU_CHIP, including output of the latency value is described with reference to FIGS. 1 and 7.

The ID register values of the memory chips M0, M1, and M2 are set to 2, 1, and 3, respectively, although not particularly limited thereto.

The latency value output register LRG of the memory chips M0, M1, and M2 is set to the values shown in FIG. 4, and the response order setting register RRG is set to the values shown in FIG. 6(a), although not particularly limited thereto.

There is described data transfer where two request queues exist in the request queue control circuit RqCT of the memory chips M0, M1, and M2 with no request having been entered, and two response queues exist in the response queue control circuit RsCT of the memory chip M0 with one response having already been entered in this response queue, although not particularly limited thereto.

A request queue can store a 1-Byte ID value, a 1-Byte request number, a 1-Byte instruction, a 2-Byte address, 32-Byte write data and a response queue of can store a 1-Byte ID value, a 1-Byte request number, and 32-Byte read data, although not particularly limited thereto.

In addition, respective memory circuits MemVL, MemNV1, and MemNV2 of the memory chips M0, M1, and M2 include eight memory banks, each memory bank being provided with a sense amplifier circuit, although not particularly limited thereto.

Having no request entered from the information processing device CPU_CHIP into the request queue of its own, the memory chip M0 sets the request enable signal RqEn0 to High and notifies the information processing device CPU_CHIP that it can accept a request.

The information processing device CPU_CHIP synchronizes a request ReqBAm01 having the ID value 2, the bank activation instruction BA, the bank address BK0, and a row address Row0 multiplexed therein with the clock signal RqCK0, and transfers the request ReqBAm01 to the memory chip M0 through the request signal RqMux0.

Subsequently, the information processing device CPU_CHIP synchronizes a request ReqRDm16 having the ID value 2, the 16-Byte read instruction RD, the bank address BK0, and a column address Co131 multiplexed therein with the clock signal RqCK0, and transfers the request ReqRDm16 to the memory chip M0 through the request signal RqMux0 (FIG. 7: Step 1).

Figure 7:
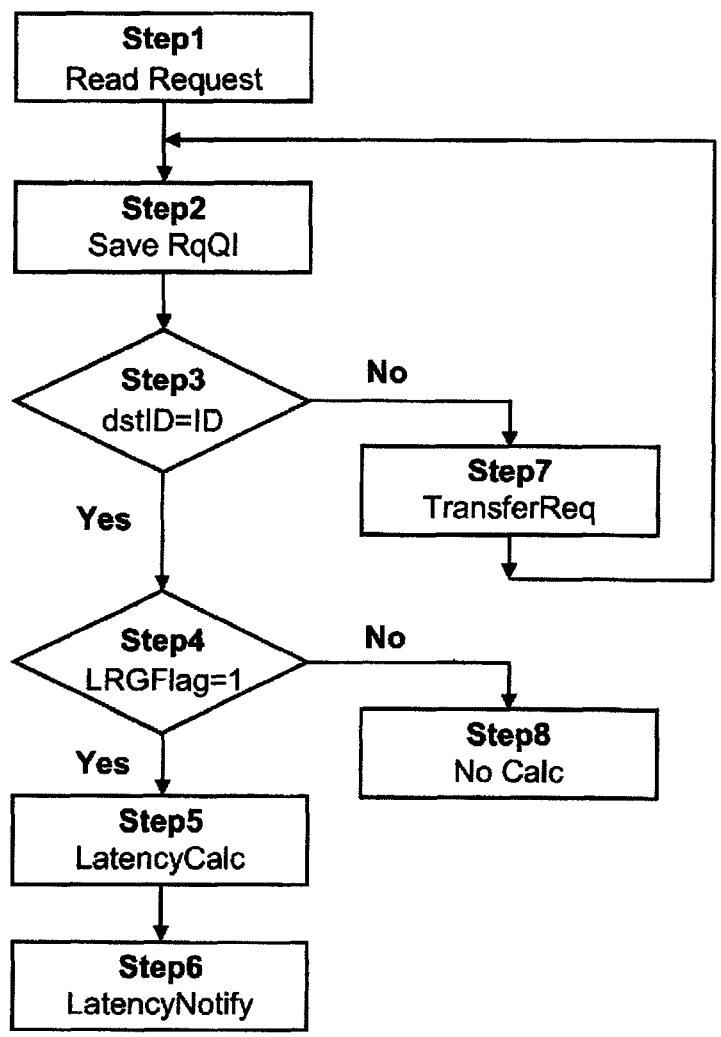
FIG. 7 is a flowchart showing an example of a latency output operation.

The memory chip M0 stores the requests ReqBAm01 and ReqRDm16 from the information processing device CPU_CHIP sequentially in its own request queue control circuit RqCT (FIG. 7: Step 2).

Because all the request queues in the request queue control circuit RqCT have thus been entered and no new request from the information processing device CPU_CHIP can be accepted, the request enable signal RqEn0 is set to Low.

Setting the request enable signal RqEn0 to Low notifies the information processing device CPU_CHIP that the memory chip M0 can not accept a request.

Subsequently, the request queue control circuit RqCT compares the ID value 2 included in the request ReqBAm01 with the value 2 of its own ID register. Because the ID value 2 included in the request ReqBA1 matches the ID register value 2 of the memory chip M0, the request queue control circuit RqCT transmits the request ReqBA1 to the memory circuit MemVL. According to the bank activation instruction BA, the bank address BK0, and the row address Row 0 included in the request ReqBAm01, the memory circuit MemVL activates memory cells equivalent to one page (8192 bits, although not particularly limited thereto) that are connected to the row 0 in a bank 0 and transfers them to the sense amplifier.

Because processing the request ReqBAm01 create a vacancy equivalent to a single request queue in the request queue control circuit RqCT, the memory chip M0 sets the request enable signal RqEn0 to High and notifies the information processing device CPU_CHIP that a new request can be accepted.

The request queue control circuit RqCT then compares the ID value 2 included in the request ReqRDm16 sequentially with the value 2 of its own ID register (FIG. 7: Step 3). Because the ID value 2 included in the request ReqRDm16 matches the ID register value 2 of the memory chip M0, the request queue control circuit RqCT transmits the request ReqRDm16 to the memory circuit MemVL.

When transmitting the read request ReqRDm16 to the memory circuit MemVL, the request queue control circuit RqCT transmits, according to the setting of the latency value output register LRG, the ID value 2 included in a request ReqRDm04 and the latency value output flag information LRGFlag value 1 in the latency value output register LRG to the latency calculating circuit LA in the response queue control circuit RsCT.

The latency calculating circuit LA confirms that the received latency value output flag information LRGFlag value is 1 (FIG. 7: Step 4), and calculates a latency value LaRd until the data for the request ReqRDm16 is output to the information processing device CPU_CHIP through the response signal RsMux0 (FIG. 7: Step 5). The response queue control circuit RsCT then transmits a response RsLa including the ID value 2 and the calculated latency value LaRd to the information processing device CPU_CHIP through the response signal RsMux0 (FIG. 7: Step 6).

If the received latency value output flag information LRGFlag value is 0, the latency calculating circuit LA terminates the process without performing calculation of latency (FIG. 7: Step 8).

The memory control circuit CON of the information processing device CPU_CHIP receives the response RsLa into the response queue RsQ. Based on the ID value 2 and the latency value LaRd included in the response RsLa transmitted to the response queue RsQ, the information processing device CPU_CHIP can perform preliminarily checking by information as to when the data corresponding to a request RqRDm04 is transmitted from the memory chip M0.

According to the 16-Byte read instruction RD16, the bank address BK0, and the column address Col31 included in the request ReqRDm16, 16-Byte data whose starting address is the column address Col31 is read from the memory circuit MemVL, among the data held in the sense amplifier of the bank 0 of the memory circuit MemVL, and transferred, together with the ID register value 2, to the response queue control circuit RsCT as a response ResRDm16.

The response queue control circuit RsCT outputs the response RsRDm16 to the information processing device CPU_CHIP through the response signal RsMux0. The memory control circuit CON of the information processing device CPU_CHIP receives the response RsRDm16 into the response queue RsQ. The information processing device CPU_CHIP can check by the ID value 2 included in the response RsRDm04 transmitted to the response queue RsQ that the data corresponding to the request RqRDm16 has been successfully transmitted from the memory chip M0.

The calculation method of latency in the response queue control circuit RsCT can be Tinitial+Sum (Tcycle), although not particularly limited thereto.

After the request ReqRDm16 has been transmitted to the memory circuit MemVL, there is time of about three clock cycles, although not particularly limited thereto, until desired data is read and input to the response queue control circuit RsCT as the response ResRDm16.

Sum (Tcycle) is the total sum of the number of data transfer clock cycles Tcycle required to output all the response data with regard to response queues already holding response data among the response queues provided in the response queue control circuit RsCT.

Assuming that response data has already been held in one of the response queues provided in the response queue control circuit RsCT, and the number of data transfer clock cycles of the response data is 16, the latency value LaRd of the output data for the request ReqRDm16 is 3+16=19 cycles.

Although the latency value output by the memory chip M0 is described with an exemplary clock cycle number, the latency value can be a level value corresponding to the number of clock cycles.

Although a data read operation in the memory chip M0 is described above, it is needless to say that similar operations can be performed for the memory chips M1 and M2.

The data that has been input to the response queue RsQ is processed in any of the information processing circuits CPU0, CPU1, CPU2, and CPU3, although not particularly limited thereto.

Data transfer between the information processing device CPU_CHIP and the memory chip M1 is described next.

Two request queues exist in the request queue control circuit RqCT of the memory chips M0, M1, and M2 with no request having been entered, although not particularly limited thereto. There is described data transfer where two response queues exist in the response queue control circuit RsCT of the memory chips M0, M1, and M2 with one response having already been entered in the response queues of the memory chips M0 and M1.

The information processing device CPU_CHIP synchronizes the request ReqBAm1 having the ID value 1, the bank activation instruction BA, the bank address BK0, and the page address Page0 multiplexed therein with the clock signal RqCK0, and transfers the request ReqBAm1 to the memory chip M0 through the request signal RqMux0.

Subsequently, the information processing device CPU_CHIP synchronizes a request ReqRD16m1 having the ID value 1, the 16-Byte read instruction RD16, the bank address BK0, and the column address Col31 multiplexed therein with the clock signal RqCK0, and transfers the request ReqRD16m1 to the memory chip M0 through the request signal RqMux0 (FIG. 7: Step 1).

The memory chip M0 stores the request ReqBAm1 from the information processing device CPU_CHIP and ReqRD16m1 sequentially in its own request queue control circuit RqCT (FIG. 7: Step 2).

The memory chip M0 compares the ID value 1 included in the requests ReqBAm1 and ReqRD16m1 sequentially with the value 2 of its own ID register (FIG. 7: Step 3). Because the result of comparison is a mismatch, the memory chip M0 determines that the requests ReqBAm1 and ReqRD16m1 are not requests directed to itself and sequentially transfers them to the memory chip M1 through the request signal RqMux1 (FIG. 7: Step 7).

The memory chip M1 stores the request ReqBAm1 from the memory chip M0 and ReqRD16m1 into its own request queue control circuit RqCT (FIG. 7: Step 2).

The request queue control circuit RqCT of the memory chip M1 compares the ID value 1 included in the request ReqBAm1 with the value 1 of its own ID register (FIG. 7: Step 3). Because the values match each other, the request queue control circuit RqCT transmits the request ReqBA1 to the memory circuit MemVL. According to the bank activation instruction BA, the bank address BK0, and the row address Row 0 included in the request ReqBAm1, the memory circuit MemVL activates memory cells equivalent to a specified page (1 kByte, although not particularly limited thereto) and transfers them to the sense amplifier.

The request queue control circuit RqCT of the memory chip M1 then compares the ID value 1 included in the request ReqRD16m1 with the value 1 of its own ID register. Because the values match each other, the request queue control circuit RqCT transmits the request ReqRDm16 to the memory circuit MemVL.

When transmitting the read request ReqRDm16 to the memory circuit MemVL, the request queue control circuit RqCT of the memory chip M1 transmits, according to the setting of the latency value output register LRG, the ID value 1 included in the request ReqRD16m1 and the latency value output flag information LRGFlag value 1 in the latency value output register LRG to the latency calculating circuit LA in the response queue control circuit RsCT.

The latency calculating circuit LA confirms that the received latency value output flag information LRGFlag value is 1 (FIG. 7: Step 4), and calculates a latency value LaRd1 until the data for the request ReqRDm161 is output to the information processing device CPU_CHIP through the response signal RsMux0 (FIG. 7: Step 5). The response queue control circuit RsCT then transmits a response RsLa1 including the ID value 1 and the calculated latency value LaRd1 to the information processing device CPU_CHIP through the response signal RsMux0 (FIG. 7: Step 6).

The response queue control circuit RsCT of the memory chip M0 that received the response RsLa1 calculates, based on the latency value LaRd1 included in the response RsLa1, a latency value LaRd2 until the data is output to the information processing device CPU_CHIP, and transmits a response RsLa2 including the ID value 1 included in the response RsLa1 and the calculated latency value LaRd2 to the information processing device CPU_CHIP through the response signal RsMux0.

The memory control circuit CON of the information processing device CPU_CHIP receives the response RsLa2 into the response queue RsQ. According to the ID value 1 and the latency value LaRd2 included in the response RsLa2 transmitted to the response queue RsQ, the information processing device CPU_CHIP can preliminarily confirm by information as to when the data is transmitted from the memory chip M1.

According to the 16-Byte read instruction RD16, the bank address BK0, and the column address Col31 included in the request ReqRD16m1, 16-Byte data whose starting address is the column address Col31 is read from the memory circuit Mem NV1 of the memory chip M1, among the data held in the sense amplifier of the bank 0 of the memory circuit MemNV1, and transferred, together with the ID register value 1, to the response queue control circuit RsCT as a response RsRD16m1.

The response queue control circuit RsCT of the memory chip M1 outputs the response RsRD16m1 to the memory chip M0 through the response signal RsMux0. The memory chip M0 receives the response RsRD16m1 and outputs it to the information processing device CPU_CHIP.

The memory control circuit CON of the information processing device CPU_CHIP receives the response RsRD16m1 into the response queue RsQ. The information processing device CPU_CHIP can check by the ID value 1 included in the response RsRD16m1 transmitted to the response queue RsQ that the data corresponding to the request RqRD16m1 has been successfully transmitted from the memory chip M0.

The calculation method of the latency value LaRd1 in the response queue control circuit RsCT in the memory chip M1 is described. The latency value LaRd1 can be given by Tinitial+Sum (Tcycle), although not particularly limited thereto.

The latency value LaRd1 is a time period from when a request ReqNRD4m1 is transmitted to the memory circuit MemNV1 to when the desired data is read and input to the response queue control circuit RsCT as the response RsRD16m1, which is about 80 nanoseconds, that is 40 clock cycles, although not particularly limited thereto.

Sum (Tcycle) is the total sum of the number of data transfer clock cycles Tcycle required to output all the response data with regard to response queues already holding response data among the response queues provided in the response queue control circuit RsCT.

Assuming that response data has already been held in one of the response queues provided in the response queue control circuit RsCT, and the number of data transfer clock cycles of the response data is 16, the latency value LaRd1 of the output data for the request RsRD16m1 is 40+16=56 cycles.

The calculation method of the latency value LaRd2 in the response queue control circuit RsCT of the memory chip M0 when the latency value LaRd1 is received from the memory chip M1 is described next. The latency value LaRd2 can be given by the latency value LaRd1+Sum (Tcycle), although not particularly limited thereto.

Assuming that a response data has already been held in one of the response queues provided in the response queue control circuit RsCT, and the number of data transfer clock cycles of the response data is 8, the latency value LaRd2 is 56+8=62 cycles.

Although the latency value output by the memory chips M0 and M1 is described with an exemplary clock cycle number, the latency value can be a level value corresponding to the number of clock cycles.

The data that has been input to the response queue RsQ is processed in any of the information processing circuits CPU0, CPU1, CPU2, and CPU3, although not particularly limited thereto.

Data transfer between the information processing device CPU_CHIP and the memory chip M2 is described next. The memory chip M2 is a NAND flash memory using NAND flash memory cells, although not particularly limited thereto. Repeatedly writing into a NAND flash memory can degrade its reliability and sometimes the data at the time of writing can be different at the time of reading, or data writing can fail at the time of rewriting. Therefore, 512-Byte data and a 16-Byte ECC code for correcting an error that occurred to the 512-Byte data code are maintained as a data equivalent to one page (512 Bytes+16 Bytes).

Two request queues exist in the request queue control circuit RqCT of the memory chips M0, M1, and M2 with no request having been entered, although not particularly limited thereto. There is described data transfer where two response queues exist in the response queue control circuit RsCT of the memory chips M0, M1, and M2 with one response having already been entered in the response queues of the memory chips M0, M1, and M2.

The information processing device CPU_CHIP synchronizes a request ReqBAm2 having an ID value 3, the bank activation instruction BA, the bank address BK0, and a sector address Sadd0 multiplexed therein with the clock signal RqCK0, and transfers the request ReqBAm2 to the memory chip M0 through the request signal RqMux0.

Subsequently, the information processing device CPU_CHIP synchronizes a request ReqRDp1m2 having the ID value 3, a page data read instruction RDp1, the bank address BK0, and a page address Padd0 multiplexed therein with the clock signal RqCK0, and transfers the request ReqRDp1m2 to the memory chip M0 through the request signal RqMux0 (FIG. 7: Step 1).

The memory chip M0 stores the requests ReqBAm2 and ReqRDp1m2 from the information processing device CPU_CHIP sequentially into its own request queue control circuit RqCT (FIG. 7: Step 2).

The memory chip M0 compares the ID value 3 included in the requests ReqBAm2 and ReqRDp1m2 sequentially with the value 2 of its own ID register (FIG. 7: Step 3). Because the result of comparison is a mismatch, the memory chip M1 determines that the requests ReqBAm2 and ReqRDp1m2 are not requests directed to itself and sequentially transfers them to the memory chip M1 through the request signal RqMux1 (FIG. 7: Step 7).

The memory chip M1 stores the requests ReqBAm2 and ReqRDp1m2 from the memory chip M0 into its own request queue control circuit RqCT (FIG. 7: Step 2).

The memory chip M1 compares the ID value 3 included in the requests ReqBAm2 and ReqRDp1m2 sequentially with the value 3 of its own ID register (FIG. 7: Step 3). Because the result of comparison does not match, the memory chip M1 determines that the requests ReqBAm2 and ReqRDp1m2 are not requests directed to itself and sequentially transfers them to the memory chip M2 through the request signal RqMux1 (FIG. 7: Step 7).

The request queue control circuit RqCT of the memory chip M2 compares the ID value 3 included in the request ReqBAm2 with the value 3 of its own ID register (FIG. 7: Step 3). Because the values match each other, the request queue control circuit RqCT transmits a request ReqBmA2 to the memory circuit MemNV2.

According to the bank activation instruction BA, the bank address BK0, and the sector address Sadd0 included in the request ReqBAm2, the memory circuit MemNV2 transfers data equivalent to a specified sector to the buffer BUF0. The 1-sector data includes data equivalent to 4 pages (2 kByte, although not particularly limited thereto). The time required to transfer a 1-sector data to the buffer BUF0 is about 25 microseconds.

The request queue control circuit RqCT of the memory chip M1 then compares the ID value 3 included in the request ReqRDp1m2 with the value 3 of its own ID register. Because the values match each other, the request queue control circuit RqCT of the memory chip M1 determines that the request ReqRDp1m2 is a request directed to itself.

After a 1-sector data has been transferred to the buffer BUF0 from the memory circuit MemNV2, the request queue control circuit RqCT of the memory chip M1 transmits the request ReqRDp1m2 to the memory circuit MemNV2.

When transmitting the read request ReqRDp1m2 to the memory circuit MemVL, the request queue control circuit RqCT of the memory chip M1 transmits, according to the setting of the latency value output register LRG, the ID value 3 included in the request ReqRDp1m2 and the latency value output flag information LRGFlag value 1 in the latency value output register LRG to the latency calculating circuit LA in the response queue control circuit RsCT.

The latency calculating circuit LA confirms that the received latency value output flag information LRGFlag value is 1 (FIG. 7: Step 4), and calculates a latency value LaRd2 until the data for the request ReqRDp1m2 is output to the memory chip M1 through the response signal RsMux2 (FIG. 7: Step 5). The response queue control circuit RsCT then transmits a response RsLam2 including the ID value 3 and the calculated latency value LaRdm2 to the memory chip M1 through the response signal RsMux2 (FIG. 7: Step 6).

The response queue control circuit RsCT of the memory chip M1 that received the response RsLam2 calculates, based on the latency value LaRd2 included in the response RsLam2, a latency value LaRdm21 until the data is output to the memory chip M0, and transmits a response RsLam21 including the ID value 3 included in the response RsLam2 and the calculated latency value LaRdm21 to the memory chip M0 through the response signal RsMux0.

The response queue control circuit RsCT of the memory chip M0 that received the response RsLam21 calculates, based on the latency value LaRdm21 included in the response RsLam21, a latency value LaRdm210 until the data is output to the information processing device CPU_CHIP, and transmits a response RsLam210 including the ID value 3 included in the response RsLam21 and the calculated latency value LaRdm210 to the information processing device CPU_CHIP through the response signal RsMux0.

The memory control circuit CON of the information processing device CPU_CHIP receives the response RsLam210 into the response queue RsQ. According to the ID value 1 and the latency value LaRdm210 included in the response RsLa2 transmitted to the response queue RsQ, the information processing device CPU_CHIP can perform preliminarily checking by information as to when the data is transmitted from the memory chip M2.

From the data transferred to a data register DREG0, the response queue control circuit RsCT sequentially reads the data equivalent to one page (512 Bytes+16 Bytes) specified by the 1-page read instruction RDp1, the bank address BK0, and the page address Padd0 included in the request ReqRDp1m2, together with the ID register value 3, 32 Bytes at a time, as responses ResNDRDp1m2-0 to ResNDRDp1m2-7, and transfers the data to the memory chip M1. Finally, the response queue control circuit RsCT reads the 16-Byte ECC code in the page address 1 and transfers it as a response ResNDRDp1m2ECC, together with the ID register value 3, to M1 through the response signal RsMux2. The time required for reading the data in the data register DREG0 to the response queue is about 50 nanoseconds, although not particularly limited thereto.

After having been sequentially transferred to the memory chip M1, the responses ResNDRDp1m2-0, ResNDRDp1m2-1, ResNDRDp1m2-2, ResNDRDp1m2-3, ResNDRDp1m2-4, ResNDRDp1m2-5, and ResNDRDp1m2-6, the response ResNDRDp1m2-7, and the response ResNDRDp1m2ECC are transferred to the memory chip M0 through the response signal RsMux1, and further transferred to the information processing device CPU_CHIP through the response signal RsMux0.

The memory control circuit CON of the information processing device CPU_CHIP sequentially receives the responses ResNDRDp1m2-0, ResNDRDp1m2-1, ResNDRDp1m2-2, ResNDRDp1m2-3, ResNDRDp1m2-4, ResNDRDp1m2-5, and ResNDRDp1m2-6, the response ResNDRDp1m2-7, and the response ResNDRDp1m2ECC into the response queue RsQ. Based on the ID value 2 included in these responses transmitted to the response queue RsQ, the information processing device CPU_CHIP can confirm that these responses have been transmitted from the memory chip M2.

The information processing device CPU_CHIP performs error detection using the ECC code in any of the information processing circuits CPU0, CPU1, CPU2, and CPU3 for the data transmitted from the memory chip M2. If there is no error, any of the information processing circuits CPU0, CPU1, CPU2, and CPU3 performs data processing on the data. If there is an error, error correction is performed in any of the information processing circuits CPU0, CPU1, CPU2, and CPU3, and subsequently any of the information processing circuits CPU0, CPU1, CPU2, and CPU3 performs data processing on the error-corrected data.

The calculation method of the latency value LaRdm2 in the response queue control circuit RsCT in the memory chip M2 is described. The latency value LaRdm2 can be given by Tinitial+Sum (Tcycle), although not particularly limited thereto.

The latency value LaRd1 is a time period from when a request ReqRDp1m2 is transmitted to the memory circuit MemNV1 to when the desired data is read from the data register DREG0 and input to the response queue control circuit RsCT as the response ResNDRDp1m2-0, which is about 50 nanoseconds, that is 25 clock cycles, although not particularly limited thereto.

Sum (Tcycle) is the total sum of the number of data transfer clock cycles Tcycle required to output all the response data with regard to response queues already holding response data among the response queues provided in the response queue control circuit RsCT.

Assuming that response data has already been held in one of the response queues provided in the response queue control circuit RsCT of the memory chip M2, and the number of data transfer clock cycles of the response data is 16, the latency value LaRdm2 of the output data for the response ResNDRDp1m2-0 is 25+16=41 cycles.

The calculation method of the latency value LaRdm21 in the response queue control circuit RsCT in the memory chip M1 is described. The latency value LaRdm21 can be given by Landm2+Sum (Tcycle), although not particularly limited thereto.

Sum (Tcycle) is the total sum of the number of data transfer clock cycles Tcycle required to output all the response data with regard to response queues already holding response data among the response queues provided in the response queue control circuit RsCT.

Assuming that response data has already been held in three of the response queues provided in the response queue control circuit RsCT of the memory chip M1, and the number of data transfer clock cycles of the response data is 16×3, the latency value LaRdm21 is 41+48=89 cycles.

The calculation method of the latency value LaRdm210 in the response queue control circuit RsCT of the memory chip M0 when the latency value LaRdm21 is received from the memory chip M1 is described next. The latency value LaRdm210 can be given by the latency value LaRdm21+Sum (Tcycle), although not particularly limited thereto.

Sum (Tcycle) is the total sum of the number of data transfer clock cycles Tcycle required to output all the response data with regard to response queues already holding response data among the response queues provided in the response queue control circuit RsCT.

Assuming that response data has already been held in three of the response queues provided in the response queue control circuit RsCT of the memory chip M0, and the number of data transfer clock cycles of the response data is 16×3, the latency value LaRdm210 is 89+48=137 cycles.

Although the latency value output by the memory chips M0, M1, and M2 is described with an exemplary clock cycle number, the latency value can be a level value corresponding to the number of clock cycles.

Although the data read operation in the memory chip M2 is described above, it is needless to say that similar operations can be performed for the memory chips M0 and M1.

The data that has been input to the response queue RsQ is processed in any of the information processing circuits CPU0, CPU1, CPU2, and CPU3, although not particularly limited thereto.

As described above, by preliminarily transmitting, from the memory module MEM to the information processing device CPU_CHIP, latency of a response to a read request from the information processing device CPU_CHIP to the memory module MEM before the response is output from the memory module MEM to the information processing device CPU_CHIP, the information processing device CPU_CHIP can recognize the arrival time of the data beforehand and flexibly determine which process is performed to what extent before the data arrives, whereby processing performance can be improved.

<Description of Normal Operation: Queue Reservation>

Depending on the application program executed by the information processing device CPU_CHIP, there is a case that the maximum latency of the read data is required to be ensured during execution of the application program. A reservation method of a response queue and a request queue to ensure the maximum latency of the read data is described with reference to FIGS. 1 and 8.

An example of a reservation method of a queue that is empty among the request queues and the response queues provided in the memories M0, M1, and M2 in the memory module MEM is described.

A reservation method of a request queue and a response queue that is performed to process, smoothly and with a high priority, requests and responses to and from the memory chip M1 is described, although not particularly limited thereto.

The ID register values of the memory chips M0, M1, and M2 are respectively set to 2, 1, and 3, although not particularly limited thereto.

The information processing device CPU_CHIP first reserves, among the response queues in its own response queue RsQ, only one, although not particularly limited thereto, of empty response queues specially for storing a response started from the memory chip M1. If there is no empty response queue, the information processing device CPU_CHIP waits until any of the response queues become empty.

Subsequently, the information processing device CPU_CHIP transfers a request ReqNQRv having the ID value 1, a queue reservation instruction QRv, and a number of queues to be reserved QRvN value 1 multiplexed therein to the memory chip M0 through the request signal RqMux0 in order to reserve a queue (FIG. 8: Step 1).

Figure 8:
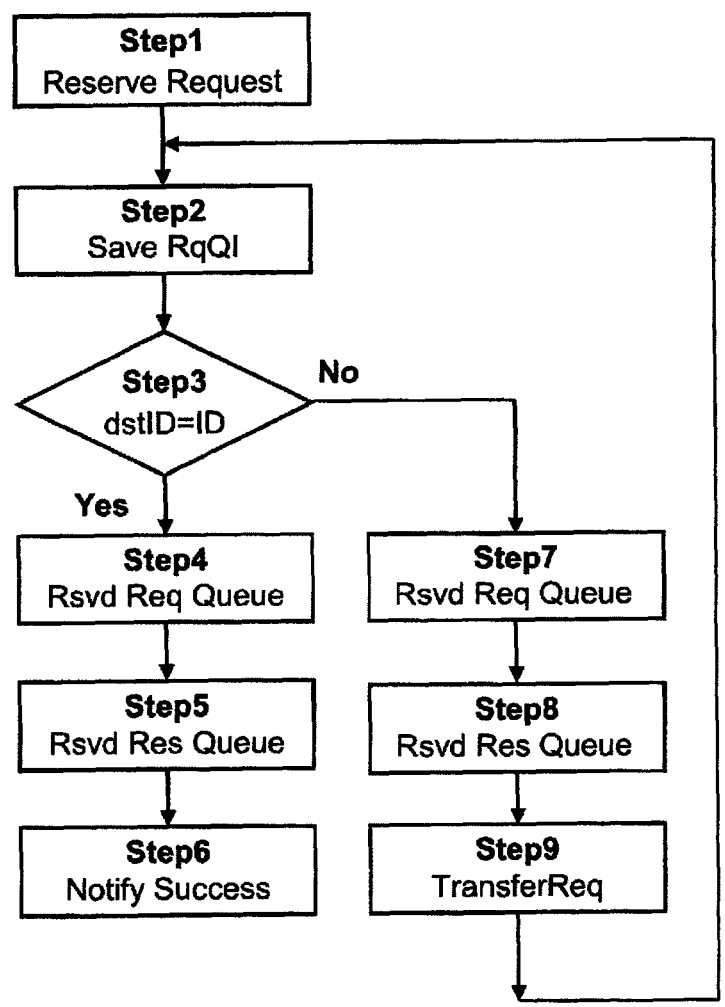
FIG. 8 is a flowchart showing an example of a queue reservation operation.

The memory chip M0 stores the request ReqNQRv into its own request queue control circuit RqCT (FIG. 8: Step 2).

Subsequently, the request queue control circuit RqCT of the memory chip M0 compares the ID value 1 included in the request ReqNQRv with the value 2 of its own ID register (FIG. 8: Step 3). Because the values do not match each other, the request queue control circuit RqCT of the memory chip M0 reserves, according to the ID value 1, the queue reservation instruction QRv, and the QRvN value 1 included in the request ReqNQRv, only one of the empty request queues specially for storing a request to the memory chip M1. If there is no empty request queue, the request queue control circuit RqCT waits until any of the response queues become empty and reserves it (FIG. 8: Step 7).

Furthermore, the request queue control circuit RqCT transfers the request ReqNQRv to the response queue control circuit RsC.

The response queue control circuit RsCT of the memory chip M0 reserves, according to the ID value 1, the queue reservation instruction QRv, and the QRvN value 1 included in the request ReqNQRv, only one of the empty response queues specially for storing a response including the data read from the memory chip M1 that is to be input to the memory chip M0. If there is no empty response queue, the response queue control circuit RsCT waits until any of the response queues become empty and reserves it (FIG. 8: Step 8).

After completing a reservation of a request queue and a response queue that are empty, the memory chip M0 transfers, according to the ID value 1 included in the request ReqNQRv, the request ReqNQRv to the memory chip M1 through the request signal RqMux1 (FIG. 8: Step 9).

The memory chip M1 stores the request ReqNQRv into its own request queue control circuit RqCT (FIG. 8: Step 2). Subsequently, the request queue control circuit RqCT of the memory chip M1 compares the ID value 1 included in the request ReqNQRv with the value 1 of its own ID register (FIG. 8: Step 3). Because the values match each other, the request queue control circuit RqCT of the memory chip M1 reserves, according to the ID value 1, the queue reservation instruction QRv, and the QRvN value 1 included in the request ReqNQRv, only one of the empty request queues specially for storing a request to the memory chip M1. If there is no empty request queue, the request queue control circuit RqCT waits until any of the request queues become empty and reserves it (FIG. 8: Step 4).

Furthermore, the request queue control circuit RqCT transfers the request ReqNQRv to the response queue control circuit RsC.

The response queue control circuit RsCT of the memory chip M1 reserves, according to the ID value 1, the queue reservation instruction QRv, and the QRvN value 1 included in the request ReqNQRv, only one of the empty response queues specially for storing a response from the memory chip M1. If there is no empty response queue, the response queue control circuit RsCT waits until any of the response queues become empty and reserves it (FIG. 8: Step 5).

After completing a reservation of a request queue and a response queue that are empty, the memory chip M1 transfers a reservation the reservation completion signal RvFlg to the memory chip M0 through the response signal RsMux1 (FIG. 8: Step 6).

The memory chip M0 transfers the received reservation completion signal RvFlg to the information processing device CPU_CHIP through the response signal RsMux0.

Upon receiving the reservation completion signal RvFlg, the information processing device CPU_CHIP can recognize that a reservation of a queue by the request ReqNQRv has been completed.

An operation of the information processing device CPU_CHIP performing a data read request to the memory chip M1 after completing a reservation of a queue is described below.

The information processing device CPU_CHIP transfers a request ReqNRD16m1 having the ID value 1, a 16-Byte data read instruction NRD16, and an address Add63 multiplexed therein to the memory chip M0 through the request signal RqMux0.

Having an empty request queue already reserved for receiving a request to the memory chip M1, the memory chip M0 stores the request ReqNRD16m1 in the reserved request queue. The memory chip M0 then compares the ID value 1 included in the request ReqNRD16m1 with the value 2 of its own ID register. Because the result is a mismatch, the request ReqNRD16m1 is transferred to the memory chip M1 through the request signal RqMux1.

Having an empty request queue already reserved for receiving a request to the memory chip M1, the memory chip M1 stores the request ReqNRD16m1 in the reserved request queue. The memory chip M1 then compares the ID value 1 included in the request ReqNRD16m1 with the value 1 of its own ID register and confirms that the result is a match. Because an empty response queue has already been reserved for receiving data corresponding to the request ReqNRD16m1, the request ReqNRD16m1 is immediately transmitted to the memory circuit MemNV1, and the data corresponding to the request ReqNRD16m1 is read from the memory circuit MemNV1 and stored in the reserved response queue as a response ResNRD16m1 together with the ID value 1.

The memory chip M1 outputs the response ResNRD16m1 from the response signal RsMux1 to the memory chip M0.

Having an empty response queue already reserved for receiving a response from the memory chip M1, the memory chip M0 immediately stores the response ResNRD16m1 in the reserved request queue. Immediately thereafter, the memory chip M0 outputs the response ResNRD16m1 from the response signal RsMux0 to the information processing device CPU_CHIP.

Having an empty response queue already reserved for receiving a response from the memory chip M0, the information processing device CPU_CHIP immediately stores the response ResNRD16m1 in the reserved request queue.

The queue reservation method has been described with regard to a request and a response to the memory chip M1. A reservation of a queue for the memory chips M0 and M2 can also be performed in a similar manner and data can be transferred by a similar operation.

As described above, the target requests and responses can be processed smoothly with a high priority by reserving a request queue and response queue that are empty, whereby the maximum latency of the read data can be ensured when necessary during execution of an application.

Furthermore, a reservation of request queues and response queues that are empty can be performed for any memory chip, and the number of request queues and response queues to be reserved can also be arbitrarily changed, allowing flexible adaptation to various systems.

<Description of Normal Operation: In-Order Operation: Intra-Chip, Out-of-Order Operation: Inter-Chip>

When allocating program codes and data required for executing the program to the memory chips M0, M1, and M2, the information processing device CPU_CHIP can set the value of the response order setting register RRG of the memory chips M0, M1, and M2 that is suitable for the allocation method, in order to increase the execution speed of the program.

A program A and data A are stored in the memory M0, a program B and data B are stored in the memory M1, and a program C and data C are stored in the memory M2. The programs A, B, and C are programs that operate totally independently, whereas the data A, data B, and data C are respectively associated with the programs A, B, and C.

FIG. 6(a) shows a setting value set for the response order setting register RRG of the memory chips M0, M1, and M2 when the program codes and data are allocated to the memory chips M0, M1, and M2.

There is described data transfer where the information processing device CPU_CHIP transmits a data read request to a bank 1 of the memory chip M1 in the memory module MEM, a data write request to the bank 0 of the memory chip M0, and subsequently a data read request to the bank 0 of the memory chip M0, and further transmits in succession a data read request to the bank 1 of the memory chip M0.

The ID register values of the memory chips M0, M1, and M2 are respectively set to 2, 1, and 3, although not particularly limited thereto.

The information processing device CPU_CHIP transfers a request ReqRD16b1m1 having the ID value 1, the 16-Byte data read instruction RD16, a bank address BK1, and the column address Col31 multiplexed therein to the memory chip M0 through the request signal RqMux0.

The information processing device CPU_CHIP then transfers a request ReqWT32b0m0 having the ID value 2, a 32-Byte data write instruction WT32, the bank address BK0, the column address Col63, and a 32-Byte write data multiplexed therein to the memory chip M0.

Subsequently, the information processing device CPU_CHIP transfers a request ReqRD32b0m0 having the ID value 2, a 32-Byte data read instruction RD32, the bank address BK0, and the column address Col32 multiplexed therein to the memory chip M0.

Moreover, the information processing device CPU_CHIP transfers a request ReqRD16b1m0 having the ID value 2, the 16-Byte data read instruction RD16, the bank address BK1, and the column address Col32 multiplexed therein to the memory chip M0.

The memory chip M0 stores the requests ReqRD16b1m1, ReqWT32b0m0, ReqRD32b0m0, and ReqRD16b1m0 from the information processing device CPU_CHIP sequentially into its own request queue control circuit RqCT. The request number setting circuit RNB of the request queue control circuit RqCT provides, when storing these requests, a request number ReqN corresponding to each of the requests in the order of inputting requests.

Request number ReqN values 1, 2, 3, and 4 are provided to the requests ReqRD16b1m1, ReqWT32b0m0, ReqRD32b0m0, and ReqRD16b1m0, respectively, in the order of inputting the requests, although not particularly limited thereto.

The request queue control circuit RqCT of the memory chip M0 compares the ID value 1 included in the request ReqRD16b1m1 with the value 2 of its own ID register. Because the result is a mismatch, the request ReqRD16b1m1, and the request number ReqN value 1 corresponding to this request are transferred to the memory chip M1 through the request signal RqMux1.

The request queue control circuit RqCT of the memory chip M0 then compares the ID value 2 included in the request ReqWT32b0m0 with the value 2 of its own ID register and, because the values match each other, transmits the request ReqWT32b0m0 to its own memory circuit MemVL.

According to the 32-Byte write instruction WT32, the bank address BK0, and a column address Co63 included in the request ReqWT32b0m0, the memory circuit MemVL of the memory chip M0 starts a write operation of 32-Byte data whose starting address is the column address 63 into a memory bank 0 via a sense amplifier of the memory bank 0 of the memory circuit MemVL.

The request queue control circuit RqCT of the memory chip M0 then compares respective ID values 2 included in the requests ReqRD32b0m0 and ReqRD16b1m0 with the value 2 of its own ID register and, because the values match each other, transfers the request number ReqN value 3 of the request ReqRD32b0m0 and the request number ReqN value 4 of the request ReqRD16b1m0 to the response queue control circuit RsCT.

The response queue control circuit RsCT of the memory chip M0 sequentially enters the request number ReqN value 3 as a response number ResTN value 3, and the request number ReqN value 4 as a response number ResTN value 4 into the response number table TB.

In this manner, a response with regard to the request number ReqN value 3 corresponding to the response number ResTN value 3 becomes the first response, and a response with regard to the request number ReqN value 4 corresponding to the response number ResTN value 4 becomes the second response.

The request ReqRD32b0m0 following the request ReqWT32b0m0 includes the read instruction RD32 into the memory bank 0 of the memory circuit MemVL of the memory chip M0 and has to wait for completion of the data writing into the memory bank 0 because it reads data into the same memory bank as the memory bank 0 to which a write operation is performed by the request ReqWT32b0m0.

The request ReqRD32b1m0 includes the read instruction RD32 into a memory bank 1 of the memory circuit MemVL of the memory chip M0 and does not have to wait for completion of the data writing into memory bank 0 because it reads data into a different memory bank from the memory bank 0 to which a write operation is performed by the request ReqWT32b0m0. The request queue control circuit RqCT of the memory chip M0 then transmits the request ReqRD32b1m0 to the memory circuit MemVL.

According to the 32-Byte read instruction RD32, the bank address BK1, and the column address Col32 included in the request ReqRD32b1m0, 32-Byte data whose starting address is the column address 32 is read from the memory circuit MemVL of the memory chip M0, among the data held in the sense amplifier of the bank 1 of the memory circuit MemVL.

The response RsRD32b1m0 including the 32-Byte data that has been read, the response number ResN value 4 corresponding to the request number ReqN value 4, and the ID register value 2 is transferred to the response queue control circuit RsCT.

The response queue control circuit RsCT of the memory chip M0 compares the response number ResTN value 3 that has been entered first into the response number table TB with the response number ResN value 4. Because the values do not match each other, the response queue control circuit RsCT waits for a response corresponding to the response number ResTN value 3.

After completion of writing data into the memory bank 0 of the memory circuit MemVL of the memory chip M0, the request ReqRD32b0m0 is transmitted to the memory circuit MemVL.

According to the 32-Byte read instruction RD32, the bank address BK0, the column address Col32 included in the request ReqRD32b0m0, 32-Byte data whose starting address is the column address 32 is read from the memory circuit MemVL of the memory chip M0, among the data held in the sense amplifier of the bank 0 of the memory circuit MemVL.

The response RsRD32b0m0 including the 32-Byte data that has been read, the response number ResN value 3 corresponding to the request number ReqN value 3, and the ID register value 2 is transferred to the response queue control circuit RsCT.

The response queue control circuit RsCT of the memory chip M0 compares the response number ResTN value 3 that has been entered earliest into the response number table TB with the response number ResN value 3.

Because the values match each other, the response queue control circuit RsCT of the memory chip M0 transmits the response RsRD32b0m0 including the ID register value 2 and the 32-Byte data to the information processing device CPU_CHIP through the response signal RsMux0. In this case, the response number ResTN value 3 entered into the response number table TB of the memory chip M0 becomes invalid and the response number ResTN value 4 becomes the oldest response number.

Because the request ReqRD16b1m1 that has been input to the memory chip M0 prior to the request ReqRD32b0m0 is transmitted to the memory chip M1, and no response corresponding to the request ReqRD16b1m1 has not been input to the memory chip M0, the response RsRD32b0m0 corresponding to the request ReqRD32b0m0 is transmitted to the information processing device CPU_CHIP without waiting for a response corresponding to the request ReqRD16b1m1.

Subsequently, the response queue control circuit RsCT of the memory chip M0 compares the response number ResN value 4 of the response RsRD32b1m0 with the response number ResTN value 4 that has been entered earliest into the response number table TB.

Because the values match each other, the response queue control circuit RsCT of the memory chip M0 transmits the response RsRD32b1m0 including the ID register value 2, and the 32-Byte data to the information processing device CPU_CHIP through the response signal RsMux0.

In this case, the response number ResTN value 4 that has been entered into the response number table TB of the memory chip M0 becomes invalid.

Because the request ReqRD16b1m1 that has been input to the memory chip M0 prior to the request ReqRD32b1m0 is transmitted to the memory chip M1, and no response corresponding to the request ReqRD16b1m1 has not been input to the memory chip M0, the response RsRD32b1m0 corresponding to the request ReqRD32b1m0 is transmitted to the information processing device CPU_CHIP without waiting for a response corresponding to the request ReqRD16b1m1.

As described above, according to the setting of the response order setting register RRG of the memory chip M0, the memory chip M0 generates request numbers corresponding to requests directed to itself and, using the generated request numbers, transmits the responses in the order of inputting requests.

Furthermore, according to the setting of the response order setting register RRG of the memory chip M0, the memory chip M0 can transmit, to the information processing device CPU_CHIP, responses that can be transmitted earlier, without waiting for slower responses, regardless of the order of inputting requests between its own response and responses that have been input to the memory chip M0 from the memory chips M1 or M2.

An operation of the memory chip M1 is described next.

The memory chip M1 stores the request ReqRD16b1m1 that has already been transmitted from the memory chip M0 and the request number ReqN value 1 corresponding to this request in the request queue control circuit RqCT, and performs a data read operation in parallel with data write and read operations performed in the memory chip M0.

The request queue control circuit RqCT of the memory chip M1 compares ID value 1 included in the request ReqRD16b1m1 with its own ID register value 1.

Because the values match each other, the request queue control circuit RqCT transfers the request number ReqN value corresponding to the read request ReqRD16b1m1 to the response queue control circuit RsCT.

The response queue control circuit RsCT stores the request number ReqN value 1 in the response number table as a response number ResTN value 1. Accordingly, the response of the request ReqRD16b1m1 corresponding to the response number ResTN value 1 becomes the response that is transmitted first from the memory chip M1. Subsequently, the request ReqRD16b1m1 is transmitted to the memory circuit MemNV1.

According to the 16-Byte read instruction RD16, the bank address BK1, and the column address Col32 included in the request ReqRD16b1m1, the memory circuit MemNV1 of the memory chip M1 reads 16-Byte data whose starting address is the column address 32 among the data held in the sense amplifier of the bank 1 of the memory circuit MemNV1.

The response RsRD16b1m0 including the 16-Byte data that has been read, the response number ResN value 1 corresponding to the request number ReqN value 1, and the ID register value 1 is transferred to the response queue control circuit RsCT.

The response queue control circuit RsCT of the memory chip M1 compares the response number ResTN value 1 that has been entered first into the response number table with the response number ResN value 1. Because the values match each other, the response queue control circuit RsCT of the memory chip M1 transmits a response RsRD16b1m1 including the ID register value 1, the response number ResN value 1, and 16-Byte data to the memory chip M0 through the response signal RsMux1. In this case, the response number ResTN value 1 entered into the response number table becomes invalid.

The response queue control circuit RsCT of the memory chip M0 receives and stores the response RsRD16b1m1. The response queue control circuit RsCT then compares a response number ResTN being effective in the response number table TB with the response number ResN value 1.

Because there is no response number ResTN being effective in the response number table TB, the response queue control circuit RsCT of the memory chip M0 transmits the response RsRD16b1m1 including the ID register value 1 and the 16-Byte data to the information processing device CPU_CHIP through the response signal RsMux0.

As described above, according to the setting of the response order setting register RRG of the memory chip M0, the memory chip M0 generates request numbers corresponding to the requests in the order of inputting the requests and, using the request numbers, transmits the responses to the information processing device CPU_CHIP correctly in the order of inputting requests. Accordingly, the information processing device CPU_CHIP can recognize whether a response corresponding to a request to the same chip has been transmitted and perform the desired processing.

According to the setting of the response order setting register RRG of the memory chip M0, the memory chip M0 can transmit, to the information processing device CPU_CHIP, responses that can be transmitted earlier, without waiting for slower responses, regardless of the order of inputting requests between its own response and responses that have been input to the memory chip M0 from the memory chips M1 or M2, thereby increasing the transmission speed.

In addition, performance can be improved by flexibly adapting to the method of arranging the OS, boot programs, or application programs to the memory chips, required by the information processing device CPU_CHIP in various manners according to the target system.

Furthermore, a request can be reliably transferred to the destination of request by providing an ID to the request. Because the information processing device CPU_CHIP can recognize the memory chip at the source of transfer by providing IDs to the responses, even if the order of inputting requests is different from the order of reading data, the information processing device CPU_CHIP can perform the desired processing while reducing the number of connection signals by serially connecting the information processing device CPU_CHIP and the memory chip.

Although data transfer with regard to the memory chips M0 and M1 is described above, it is needless to say that data transfer can be executed in a similar manner with regard to the memory chips M0, M1, and M2.

<Description of Normal Operation: Simultaneous Execution of Read and Write>

Next, there is described data transfer where the information processing device CPU_CHIP transmits a data write request to the memory module MEM subsequent to a data read request.

The information processing device CPU_CHIP transfers a request ReqRD8b1m0 having the ID value 2, an 8-Byte data read instruction RD8, the bank address BK1, and the column address Col15 multiplexed therein to the memory chip M0 through the request signal RqMux0. Subsequently, the information processing device CPU_CHIP transfers a request ReqWT8b1m0 having the ID value 2, an 8-Byte data write instruction WT8, the bank address BK1, the column address Col31, and 8-Byte write data multiplexed therein to the memory chip M0 through the request signal RqMux0.

The memory chip M0 sequentially stores the request ReqRD8b1m0 and the request ReqWT8b1m0 from the information processing device CPU_CHIP into its own request queue control circuit RqCT. The request queue control circuit RqCT compares the ID value 2 included in the request ReqRD8b1m0 with the value 2 of its own ID register, and because the values match each other, transmits the request ReqRD8b1m0 to the memory circuit MemVL.

According to the 8-Byte read instruction RD8, the bank address BK1, and the column address Col31 included in the request ReqRD8b1m0, the memory circuit MemVL reads, among the data held in the sense amplifier of bank 1 of the memory circuit MemVL, 8-Byte data whose starting address is the column address 15, and transfers the data, together with the ID register value 2, to the response queue control circuit RsCT as a response RsRD8b1m0.

The response queue control circuit RsCT outputs, through the response signal RsMux0, the response RsRD8b1m0 including the ID register value 2 and the 8-Byte data to the information processing device CPU_CHIP.

Because the request ReqRD8b1m0 has been processed, the request queue control circuit RqCT compares the ID value 2 included in the request ReqWT8b1m0 with the value 2 of its own ID register, and because the values match each other, transmits the request ReqWT8b1m0 to the memory circuit MemVL.

With regard to the memory circuit MemVL, 8-Byte data whose starting address is the column address 31 is written into the sense amplifier of the bank 1 of the memory circuit MemVL and further written into the memory bank 1, according to the 8-Byte write instruction WT8, the bank address BK1, and the column address Col31 included in the request ReqWT8b1m0.

Because the request queue control circuit RqCT and the response queue control circuit RsCT operate independently, a write operation of the request ReqWT8b1m0 can be performed even while the response RsRD8b1m0 corresponding to the request ReqRD8b1m0 is being output to the information processing device CPU_CHIP.

As described above, because the request interface circuit ReIF and the response interface circuit can operate independently, data read and write operations can be performed simultaneously, thereby improving the performance of data transfer. Although reading and writing data in the memory chip M0 has been described above, it is needless to say that a similar operation can be performed in the other memory chips M1 and M2. Furthermore, because the request interface circuit ReIF and the response interface circuit can operate independently in respective memory chips, it is needless to say that even when requests are generated for reading and writing data into different memory chips, the requests can be processed in parallel, thereby improving the performance of data transfer.

<Description of Normal Operation: Request Number>

When the information processing device CPU_CHIP provides a unique request number to a request to the memory module MEM and transmits the request including this request number to the memory module MEM, the memory module MEM can transmit, using the request number transmitted by the information processing device CPU_CHIP, responses that can be transmitted earlier first regardless of the order of inputting requests, whereby the processing speed can be increased. The operation thereof is described below. Setting values of the response order setting register RRG of the memory chips M0, M1, and M2 are also shown in FIG. 6(b).

There is described data transfer where the information processing device CPU_CHIP transmits a data read request to the bank 1 of the memory chip M1 in the memory module MEM, a data write request to the bank 0 of the memory chip M0, and subsequently a data read request to the bank 0 of the memory chip M0, and further transmits in succession a data read request to the bank 1 of the memory chip M0.

The ID register values of the memory chips M0, M1, and M2 are respectively set to 2, 1, and 3, although not particularly limited thereto.

When the information processing device CPU_CHIP sets the value of the request number generating register RqNR to 1, a request number generating circuit RqN generates a request number ReqN corresponding to a requested to be output through the request signal RqMux0. The information processing device CPU_CHIP then transfers the request ReqRD16b1m1 having the ID value 1, the request number ReqN value 1, the 16-Byte data read instruction RD16, the bank address BK1, and the column address Col31 multiplexed therein to the memory chip M0 through the request signal RqMux0.

The information processing device CPU_CHIP then transfers the request ReqWT32b0m0 having the ID value 2, a request number ReqN value 2, the 32-Byte data write instruction WT32, the bank address BK0, the column address Col63 and 32-Byte write data multiplexed therein to the memory chip M0.

The information processing device CPU_CHIP subsequently transfers the request ReqRD32b0m0 having the ID value 2, a request number ReqN value 3, the 32-Byte data read instruction RD32, the bank address BK0, and the column address Col32 multiplexed therein to the memory chip M0.

Furthermore, The information processing device CPU_CHIP transfers the request ReqRD16b1m0 having the ID value 2, a request number ReqN value 4, the 16-Byte data read instruction RD16, the bank address BK1, and the column address Col32 multiplexed therein to the memory chip M0.

The memory chip M0 sequentially stores the requests ReqRD16b1m1, ReqWT32b0m0, ReqRD32b0m0, and ReqRD16b1m0 from the information processing device CPU_CHIP into its own request queue control circuit RqCT.

The request queue control circuit RqCT of the memory chip M0 compares the ID value 1 included in the request ReqRD16b1m1 with the value 2 of its own ID register. Because the result is a mismatch, the request ReqRD16b1m1 is transferred to the memory chip M1 through the request signal RqMux1.

The request queue control circuit RqCT of the memory chip M0 then compares the ID value 2 included in the request ReqWT32b0m0 with the value 2 of its own ID register, and because the values match each other, transmits the request ReqWT32b0m0 to its own memory circuit MemVL.

According to the 32-Byte write instruction WT32, the bank address BK0, and the column address Co63 included in the request ReqWT32b0m0, the memory circuit MemVL of the memory chip M0 starts a write operation of 32-Byte data whose starting address is the column address 63 into a memory bank 0 via a sense amplifier of the memory bank 0 of the memory circuit MemVL.

The request ReqRD32b0m0 following the request ReqWT32b0m0 includes the read instruction RD32 into memory the bank 0 of the memory circuit MemVL of the memory chip M0 and has to wait for completion of the data writing into the memory bank 0 because it reads data into the same memory bank as the memory bank 0 to which a write operation is being performed by the request ReqWT32b0m0.

The request ReqRD32b1m0 includes the read instruction RD32 into the memory bank 1 of the memory circuit MemVL of the memory chip M0 and does not have to wait for completion of the data writing into memory bank 0 because it reads data into a different memory bank from the memory bank 0 to which a write operation is being performed by the request ReqWT32b0m0. The request queue control circuit RqCT of the memory chip M0 then transmits the request ReqRD32b1m0 to the memory circuit MemVL.

According to the 32-Byte read instruction RD32, the bank address BK1, the column address Col32 included in the request ReqRD32b1m0, 32-Byte data whose starting address is the column address 32 is read from the memory circuit MemVL of the memory chip M0, among the data held in the sense amplifier of the bank 1 of the memory circuit MemVL.

The response RsRD32b1m0 including the 32-Byte data that has been read, the response number ResN value 4 equivalent to the request number ReqN value 4, and the ID register value 2 is transferred to the response queue control circuit RsCT, and transmitted to the information processing device CPU_CHIP.

Next, after completion of writing data into the memory bank 0 of the memory circuit MemVL of the memory chip M0, the request ReqRD32b0m0 is transmitted to the memory circuit MemVL.

According to the 32-Byte read instruction RD32, the bank address BK0, the column address Col32 included in the request ReqRD32b0m0, 32-Byte data whose starting address is the column address 32 is read from the memory circuit MemVL of the memory chip M0, among the data held in the sense amplifier of the bank 0 of the memory circuit MemVL.

The response RsRD32b0m0 including the 32-Byte data that has been read, the response number ResN value 3 equivalent to the request number ReqN value 3, and the ID register value 2 is transferred to the response queue control circuit RsCT, and transmitted to the information processing device CPU_CHIP.

Accordingly, because the request ReqRD32b1m0 input to the memory chip M0 after the request ReqRD32b0m0 can be processed prior to the request ReqRD32b0m0, the response of the request ReqRD32b0m0 can be transmitted to the memory chip M0 without waiting for slower responses of the request ReqRD32b0m0.

Additionally, because the request ReqRD16b1m1 input to the memory chip M0 has been transmitted to the memory chip M1 and no response corresponding to the request ReqRD16b1m1 has been input to the memory chip M0, the response RsRD32b1m0 of the request ReqRD32b1m0 and the response RsRD32b0m0 of the request ReqRD32b0m0 are transmitted to the information processing device CPU_CHIP without waiting for a response corresponding to the request ReqRD16b1m1.

An operation of the memory chip M1 is described next.

The memory chip M1 stores the request ReqRD16b1m1 that has already been transmitted from the memory chip M0 together with the request number ReqN value 1 in the request queue control circuit RqCT, and performs a data read operation in parallel with data write and read operations performed in the memory chip M0.

The request queue control circuit RqCT of the memory chip M1 compares ID value 1 included in the request ReqRD16b1m1 with its own ID register the value 1.

Because the values match each other, the request queue control circuit RqCT transmits the request ReqRD16b1m1 to the memory circuit MemNV1.

According to the 16-Byte read instruction RD16, the bank address BK1, and the column address Col32 included in the request ReqRD16b1m1, the memory circuit MemNV1 of the memory chip M1 reads 16-Byte data whose starting address is the column address 32 among the data held in the sense amplifier of the bank 1 of the memory circuit MemNV1.

The response RsRD16b1m0 including the 16-Byte data that has been read, the response number ResN value 1 equivalent to the request number ReqN value 1, and the ID register value 1 is transferred to the response queue control circuit RsCT, and then transferred to the memory chip M0.

The response queue control circuit RsCT of the memory chip M0 receives the response RsRD16b1m1 including the response number ResN value 1 and transmits it to the information processing device CPU_CHIP through the response signal RsMux0.

As described above, because the memory module MEM can generate a response number using the request number included in the request transmitted by the information processing device CPU_CHIP and transmit a response including this response number to the information processing device CPU_CHIP, the memory module MEM can immediately transmit responses that can be transmitted earlier, without waiting for slower responses, regardless of the order of inputting requests among or between memory chips, whereby the processing speed can be increased. Furthermore, even if responses are transmitted in an order different from the order of inputting the requests, the information processing device CPU_CHIP can recognize which request a transmitted response is directed to, whereby the information processing device CPU_CHIP can perform the desired processing at high speed.

Although data transfer with regard to the memory chips M0 and M1 is described above, it is needless to say that data transfer can be executed in a similar manner with regard to the memory chips M0, M1, and M2.

<Clock Control>

Clock control with regard to the memory module MEM is described next. When the memory module MEM is used for a portable device, although not particularly limited thereto, not all of the memory chip M0, M1, and M2 in the memory module MEM always operate simultaneously. In order to reduce power consumption of the portable device, therefore, the memory module MEM can generate a clock with a necessary frequency when data transfer is required, or stop the clock when data transfer does not occur.

Frequency control of a response clock signal RsCk0 output from the memory chip M0 is described. First, there is described a case where the clock frequency of the response clock signal RsCk0 output from the memory chip M0 is reduced to half, although not particularly thereto. The information processing device CPU_CHIP inputs the ID value 2 of the memory chip M0 and a response clock frequency dividing command 2 from the request signal RqMux0.

Transmitting the response clock frequency dividing command 2 by the memory chip M0 to the clock frequency dividing circuit Div2 in the memory chip M0 via the request queue control circuit RqCT reduces the frequency of the response clock signal RsCk0 to half. When lowering the operating frequency of the clock, it is preferred to gradually lower the frequency and finally operate at a desired frequency to prevent malfunctions due to noise.

A case of stopping the response clock signal RsCk0 output from the memory chip M0 is described next. The information processing device CPU_CHIP inputs the ID value 2 of the memory chip M0 and a response clock stop command from the request signal RqMux0. Transmitting the response clock stop command by the memory chip M0 to the clock frequency dividing circuit Div2 in the memory chip M0 via the request queue control circuit RqCT stops the response clock signal RsCk0. When stopping the clock, it is preferred to gradually lower the frequency and finally stop the clock to prevent malfunctions due to noise.

A case of resuming the response clock signal RsCk0 that has been stopped is described next. The information processing device CPU_CHIP inputs the ID value 2 of the memory chip M0 and a response clock resuming command from the request signal RqMux0. Transmitting the response clock resuming command by the memory chip M0 to the clock frequency dividing circuit Div2 in the memory chip M0 via the request queue control circuit RqCT resumes the response clock signal RsCk0 that has been stopped. When resuming the clock, it is preferred to gradually raise the frequency and finally operate at a desired frequency to prevent malfunctions due to noise.

Frequency control of a response clock signal RsCk1 output from the memory chip M1 is described. First, there is described a case where the clock frequency of the response clock signal RsCk1 output from the memory chip M1 is reduced to a quarter, although not particularly thereto. Inputting, by the information processing device CPU_CHIP, the ID value 1 of the memory chip M1 and a response clock frequency dividing command 4 from the request signal RqMux0 causes the ID value 1 and the response clock frequency dividing command 4 to be transmitted to the memory chip M1 via memory chip M0. Transmitting the response clock frequency dividing command 4 by the memory chip M1 to the clock frequency dividing circuit Div2 in the memory chip M1 via the request queue control circuit RqCT reduces the frequency of the response clock signal RsCk0 to a quarter. When lowering the operating frequency of the clock, it is preferred to gradually lower the frequency and finally operate at a desired frequency to prevent malfunctions due to noise.

A case of stopping the response clock signal RsCk1 output from the memory chip M1 is described next. Inputting, by the information processing device CPU_CHIP, the ID value 1 of the memory chip M1 and the response clock stop command from the request signal RqMux0 causes the ID value 1 and the response clock frequency dividing command 4 to be transmitted to the memory chip M1 via the memory chip M0. Transmitting the response clock stop command by the memory chip M1 to the clock frequency dividing circuit Div2 in the memory chip M1 via the request queue control circuit RqCT stops the response clock signal RsCk1. When stopping the clock, it is preferred to gradually lower the frequency and finally stop the clock to prevent malfunctions due to noise.

A case of resuming the response clock signal RsCk1 that has been stopped is described next. Inputting, by the information processing device CPU_CHIP, the ID value 1 of the memory chip M1 and the response clock resuming command from the request signal RqMux0 causes the ID value 1 and the response clock resuming command to be transmitted to the memory chip M1 via the memory chip M0. Transmitting the response clock resuming command by the memory chip M1 to the clock frequency dividing circuit Div2 in the memory chip M1 via the request queue control circuit RqCT resumes the response clock signal RsCk1 that has been stopped. When resuming the clock, it is preferred to gradually raise the frequency and finally operate at a desired frequency to prevent malfunctions due to noise.

Frequency control of a response clock signal RsCk2 output from the memory chip M2 is described. First, there is described a case where the clock frequency of the response clock signal RsCk2 output from the memory chip M2 is reduced to one-eighth, although not particularly thereto. Inputting, by the information processing device CPU_CHIP, the ID value 3 of the memory chip M2 and a response clock frequency dividing command 8 from the request signal RqMux0 causes the ID value 3 and the response clock dividing command 8 to be transmitted to the memory chip M2 via the memory chips M0 and M1. Transmitting the response clock frequency dividing command 8 by the memory chip M2 to the clock frequency dividing circuit Div2 in the memory chip M2 via its own request queue control circuit RqCT reduces the frequency of the response clock signal RsCk2 to one-eight. When lowering the operating frequency of the clock, it is preferred to gradually lower the frequency and finally operate at a desired frequency to prevent malfunctions due to noise.

A case of stopping the response clock signal RsCk2 output from the memory chip M2 is described next. Inputting, by the information processing device CPU_CHIP, the ID value 3 of the memory chip M2 and the response clock stop command from the request signal RqMux0 causes the ID value 3 and the response clock stop command to be transmitted to the memory chip M21 via the memory chips M0 and M1. Transmitting the response clock stop command by the memory chip M2 to the clock frequency dividing circuit Div2 in the memory chip M2 via its own request queue control circuit RqCT stops the response clock signal RsCk2. When stopping the clock, it is preferred to gradually lower the frequency and finally stop the clock to prevent malfunctions due to noise.

A case of resuming the response clock signal RsCk2 that has been stopped is described next. Inputting, by the information processing device CPU_CHIP, the ID value 3 of the memory chip M2 and the response clock resuming command from the request signal RqMux0 causes the ID value 3 and the response clock resuming command to be transmitted to the memory chip M2 via the memory chip M0 and M1. Transmitting the response clock resuming command by the memory chip M2 to the clock frequency dividing circuit Div2 in the memory chip M2 via the request queue control circuit RqCT resumes the response clock signal RsCk2 that has been stopped. When resuming the clock, it is preferred to gradually raise the frequency and finally operate at a desired frequency to prevent malfunctions due to noise.

Frequency control of a request clock signal RsCk1 output from the memory chip M0 is described. First, there is described a case where the clock frequency of the request clock signal RqCk1 output from the memory chip M0 is reduced to half, although not particularly thereto. The information processing device CPU_CHIP inputs the ID value 2 of the memory chip M0 and a request the clock frequency dividing command 2 from the request signal RqMux0. Transmitting the request the clock frequency dividing command 2 by the memory chip M0 to the clock frequency dividing circuit Div1 of the memory chip M0 via the request queue control circuit RqCT causes the clock frequency dividing circuit Div1 to generate a clock having a frequency that is half the clock frequency of the request clock signal RqCk0 and output it from the request clock signal RqCk1. The request clock signal RqCk1 is input to the memory chip M1 and output as the response clock signal RsCk1 via the clock driver Drv2 and the clock frequency dividing circuit Div2 of the memory chip M1. When lowering the operating frequency of the clock, it is preferred to gradually lower the frequency and finally operate at a desired frequency to prevent malfunctions due to noise.

A case of stopping the request clock signal RqCk1 output from the memory chip M0 is described next. The information processing device CPU_CHIP inputs the ID value 2 of the memory chip M0 and a request clock stop command from the request signal RqMux0. Transmitting the request clock stop command by the memory chip M0 to the clock frequency dividing circuit Div1 of the memory chip M0 via the request queue control circuit RqCT causes the clock frequency dividing circuit Div1 to stop the request clock signal RqCk1. The request clock signal RqCk1 is input to the memory chip M1, and output as the response clock signal RsCk1 via the clock driver Drv2 and the clock frequency dividing circuit Div2 of the memory chip M1 so that the response clock signal RsCk1 is also stopped. When stopping the clock, it is preferred to gradually lower the frequency and finally stop the clock to prevent malfunctions due to noise.

A case of resuming the request clock signal RsCk1 that has been stopped is described next. The information processing device CPU_CHIP inputs the ID value 2 of the memory chip M0 and a request clock resuming command from the request signal RqMux0. Transmitting the request clock resuming command by the memory chip M0 to the clock frequency dividing circuit Div1 of the memory chip M0 via the request queue control circuit RqCT causes the clock frequency dividing circuit Div1 to resume the request clock signal RqCk1 that has been stopped. The request clock signal RqCk1 is input to the memory chip M1 and output as the response clock signal RsCk1 via the clock driver Drv2 and the clock frequency dividing circuit Div2 of the memory chip M1 so that the response clock signal RsCk1 is also resumed. When resuming the clock, it is preferred to gradually raise the frequency and finally operate at a desired frequency to prevent malfunctions due to noise.

Frequency control of a request clock signal RsCk2 output from the memory chip M1 is described. First, there is described a case where the clock frequency of the request clock signal RqCk2 output from the memory chip M1 is reduced to a quarter, although not particularly thereto. Inputting, by the information processing device CPU_CHIP, the ID value 1 of the memory chip M1 and a request the clock frequency dividing command 4 from the request signal RqMux0 causes the ID value 1 and the request clock dividing command 4 to be transmitted to the memory chip M1 via the memory chip M0. Transmitting the request the clock frequency dividing command 4 by the memory chip M1 to its own clock frequency dividing circuit Div1 via the request queue control circuit RqCT causes the clock frequency dividing circuit Div1 to generate a clock having a frequency that is a quarter of the clock frequency of the request clock signal RqCk0 and output it from the request clock signal RqCk2.

The request clock signal RqCk2 is input to the memory chip M2 and output as the response clock signal RsCk2 via the clock driver Drv2 and the clock frequency dividing circuit Div2 of the memory chip M2. When lowering the operating frequency of the clock, it is preferred to gradually lower the frequency and finally operate at a desired frequency to prevent malfunctions due to noise.

A case of stopping the request clock signal RqCk2 output from the memory chip M1 is described next. Inputting, by the information processing device CPU_CHIP, the ID value 1 of the memory chip M1 and the request clock stop command from the request signal RqMux0 causes the ID value 1 and the request clock stop command to be transmitted to the memory chip M1 via the memory chip M0. Transmitting the request clock stop command by the memory chip M1 to its own clock frequency dividing circuit Div1 via its own request queue control circuit RqCT causes the clock frequency dividing circuit Div1 to stop the request clock signal RqCk2. The request clock signal RqCk2 is input to the memory chip M2, and output as the response clock signal RsCk2 via the clock driver Drv2 and the clock frequency dividing circuit Div2 of the memory chip M2 so that the response clock signal RsCk2 is also stopped.

When stopping the clock, it is preferred to gradually lower the frequency and finally stop the clock to prevent malfunctions due to noise.

A case of resuming the request clock signal RsCk2 that has been stopped is described next. Inputting, by the information processing device CPU_CHIP, the ID value 1 of the memory chip M1 and the request clock resuming command from the request signal RqMux0 causes the ID value 1 and the request clock resuming command to be transmitted to the memory chip M1 via the memory chip M0. Transmitting the request clock resuming command by the memory chip M1 to its own clock frequency dividing circuit Div1 via its own request queue control circuit RqCT causes the clock frequency dividing circuit Div1 to resume the request clock signal RqCk2 that has been stopped. The request clock signal RqCk2 is input to the memory chip M2 and output as the response clock signal RsCk1 via the clock driver Drv2 and the clock frequency dividing circuit Div2 of the memory chip M2 so that the response clock signal RsCk2 is also resumed. When resuming the clock, it is preferred to gradually raise the frequency and finally operate at a desired frequency to prevent malfunctions due to noise.

<Description of Memory Map>

Figure 9:
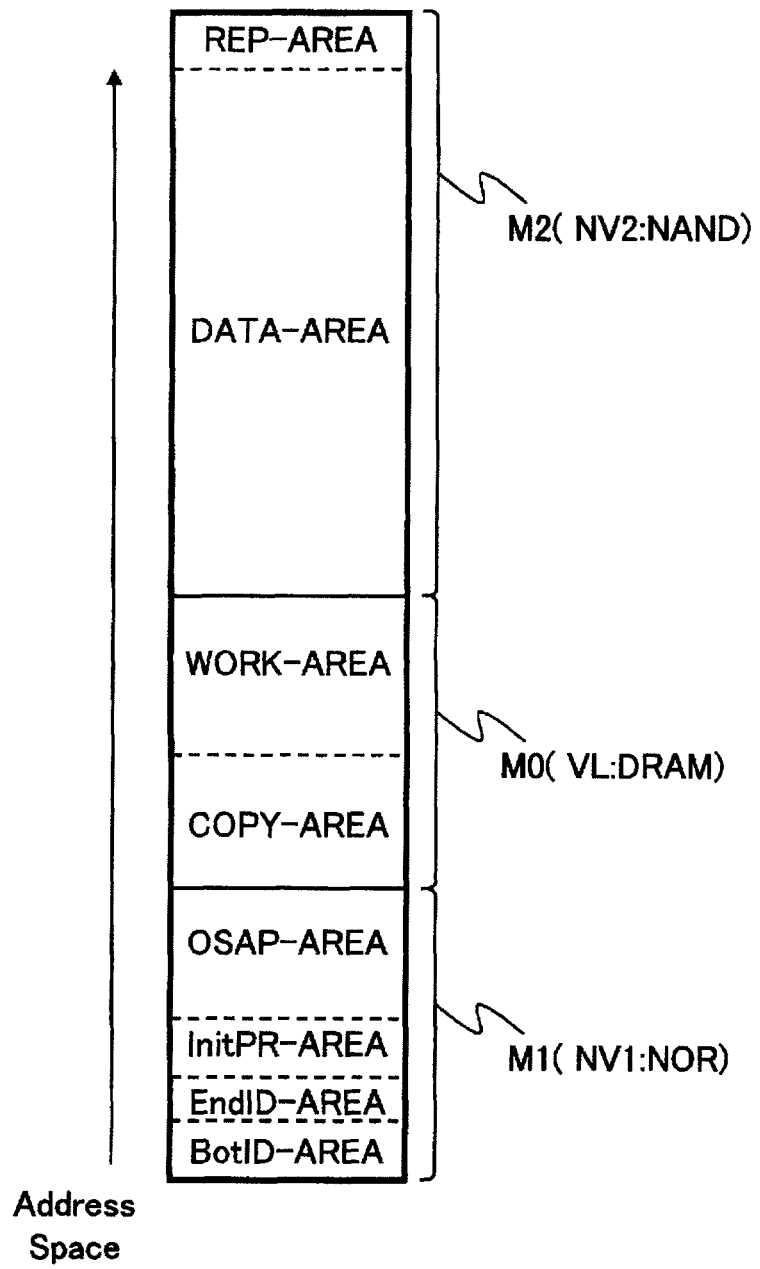
FIG. 9 is a diagram for explaining an example of an address map of the information processing system of the present invention.

FIG. 9 shows an example of a memory map corresponding to the memory module MEM managed by the information processing device CPU_CHIP. In the present embodiment, a representative memory map is described by exemplifying a memory module having a 1-Gbit storage area for the memory chip M0, a 1-Gbit storage area for the memory chip M1, and 4-Gbit+128-Mbit storage area (128 Mbits for a replacement area) for the memory chip M2, although not particularly limited thereto.

The memory chip M0 is a volatile dynamic random access memory using dynamic random access memory cells with a read time of about 15 nanoseconds, although not particularly limited thereto. The memory chip M1 is a nonvolatile memory, and a NOR flash memory using NOR flash memory cells, and its read time is about 80 nanoseconds, although not particularly limited thereto. The memory chip M2 is a nonvolatile, NAND flash memory using NAND flash memory cells with a read time of 25 microseconds, although not particularly limited thereto. The memory chip M1 is divided into a boot device ID storage area BotID-AREA, an end-device ID storage area EndID-AREA, an initial program area InitPR-AREA, and a program storage area OSAP-AREA, although not particularly limited thereto.

The boot device ID storage area BotID-AREA stores ID information of the boot device. The end-device ID storage area EndID-AREA stores end-memory device ID information with regard to the serially connected memory module MEM. The initial program area InitPR-AREA stores the boot program, although not particularly limited thereto. The program storage area OSAP-AREA stores the operating system or application programs, although not particularly limited thereto. The memory chip M0 is divided into a copy area COPY-AREA and a work area WORKAREA, although not particularly limited thereto. The work area WORK-AREA is used as a work memory when executing a program, and the copy area COPY-AREA is used as a memory for copying a program and data from the memory chips M1 and M2. The memory chip M2 is divided into a data area DATA AREA and a replacement area REP-AREA, although not particularly limited thereto. The data area DATA-AREA stores data such as music data, audio data, video data, or still image data, although not particularly limited thereto.

Repeatedly writing in a FLASH can degrade its reliability and sometimes the data written at the time of writing can be different data at the time of reading, or data writing can fail at the time of rewriting. The replacement area REP-AREA is provided to relocate such a write-failed data to a new area. It is preferred to determine the size of the replacement area REP-AREA so as to secure the reliability ensured by the memory chip M2, although not particularly limited thereto.

<Operation Immediately After Power-On>

Data transfer from the memory chip M1 to the information processing device CPU_CHIP immediately after power-on is described. After power-on, the information processing device CPU_CHIP sets its own boot device ID register BotID to 1. The memory chip M1 reads ID information 1 of the boot device from the boot device ID storage area BotID-AREA and sets the information 1 to its own ID register, whereby the boot device is determined to be the memory chip M1.

The information processing device CPU_CHIP then transmits the ID number 1 of the memory chip M1 and a read instruction to the memory module MEM in order to read the boot program and the end-memory device ID information stored in the memory chip M1 that is the boot device. According to the ID number 1 and the read instruction, the memory module MEM reads the boot program from the initial program area InitPR-AREA of the memory chip M1 and the end-memory device ID information from the end-device ID storage area EndID-AREA, and transmits them to the information processing device CPU_CHIP. By initializing the ID of the boot device immediately after power-on, the boot device in the memory module MEM that is provided by serially connecting the memory chips can be specified, whereby the number of connection signals between the information processing device CPU_CHIP and the memory module MEM can be significantly reduced, and the information processing device CPU_CHIP can quickly and reliably read the boot program and the end-memory device ID from the boot device and start up the information processing device CPU_CHIP and the memory module MEM.

<Description of Data Copy Operation>

Data read time of the memory chip M0 is significantly shorter than the read time of the memory chip M2. Therefore, the information processing device CPU_CHIP can perform image processing at high speed by preliminarily transferring required image data from the memory chip M2 to the memory chip M0. There is described data transfer from the memory chip M2 to the memory chip M0, where the ID register values of the memory chips M0, M1, and M2 are set to 2, 1, and 3, although not particularly limited thereto.

The information processing device CPU_CHIP transmits the ID number 3 of the memory chip M2 and a 1-page (512-Byte data+16-Byte ECC code) data read instruction to the memory module MEM in order to read data from the data area DATA-AREA of the memory chip M2. According to the ID number 3 and the 1-page data read instruction, the memory module MEM reads a 1-page data from the data area DATA-AREA of the memory chip M2, provides it with the ID number 3, and transmits it to the information processing device CPU_CHIP.

The information processing device CPU_CHIP performs error detection for the 1-page data transmitted from the memory chip M2. If there is no error, the information processing device CPU_CHIP transmits the ID number 2 of the memory chip M0 and the 1-page data read instruction to the memory module MEM in order to transfer the data to the copy area COPY-AREA of the memory chip M0. If there is an error, the information processing device CPU_CHIP transmits, after correcting the error, the ID number 2 of the memory chip M0 and the 1-page data read instruction to the memory module MEM in order to transfer the 1-page data to the copy area COPY-AREA of the memory chip M0. According to the ID number 2 and the 1-page data read instruction, the memory module MEM writes the 1-page data into the copy area COPY-AREA data area of the memory chip M0.

Data transfer from the memory chip M0 to the memory chip M2 is described next when writing an image data from the information processing device CPU_CHIP to the memory chip M0 at high speed and storing the image data in the memory chip M2, if necessary. The information processing device CPU_CHIP transmits the ID number 2 of the memory chip M0 and a 1-page (512 Byte) data read instruction to the memory module MEM in order to read data from the copy area COPY-AREA of the memory chip M0. According to the ID number 0 and the 1-page data read instruction, the memory module MEM reads a 1-page data from the copy area COPY-AREA of the memory chip M0, provides the data with the ID number 2, and transmits it to the information processing device CPU_CHIP. The information processing device CPU_CHIP transmits the ID number 2 of the memory chip M2 and the 1-page data write instruction to the memory module MEM in order to transfer the 1-page data transmitted from the memory chip M0 to the data area DATA-AREA of the memory chip M2.

Transmitting the ID number 2 and the 1-page data write instruction by the memory module MEM to the memory chip M2 via the memory chip M0 and M1 causes the memory chip M2 to write the 1-page data into its own data area DATA-AREA. The memory chip M2 checks whether the data writing succeeded and terminates the writing process when the writing succeeded. When the writing failed, the memory chip M2 transmits the ID number 2 and writing error information, and notifies the information processing device CPU_CHIP of the writing error via the memory chips M1 and M0. Upon receiving the ID number and the writing error information, the information processing device CPU_CHIP transmits the ID number 2 of the memory chip M2 and the 1-page data write instruction to the memory module MEM in order to perform writing into a new address of the replacement area REP-AREA that is preliminarily prepared in the memory chip M2. Transmitting the ID number 2 and the 1-page data write instruction by the memory module MEM to the memory chip M2 via the memory chip M0 and M1 causes the memory chip M2 to write the 1-page data in its own replacement area REP-AREA. Having performed a replacement process, the information processing device CPU_CHIP holds and manages failed addresses and address information as to which of the failed addresses the replacement process has been performed.

As described above, data of the memory chip M2 can be read at speed equivalent to that of the memory chip M0, allowing high speed processing in the information processing device CPU_CHIP by securing, within the memory chip, an area to which a part of the data of the memory chip M2 can be copied and preliminarily transferring data from the memory chip M2 to the memory chip M0. Additionally, data writing speed can be also increased when writing data into the memory chip M2, because the data can be temporarily written into the memory chip M0 and written back, if necessary, to the memory chip M2. Furthermore, reliability can be kept high because error detection and correction are performed when reading from the memory chip M2 and a replacement process is performed for a failed address to which data writing has not been properly performed.

<Description of the Memory Chip M0>

Figure 10:
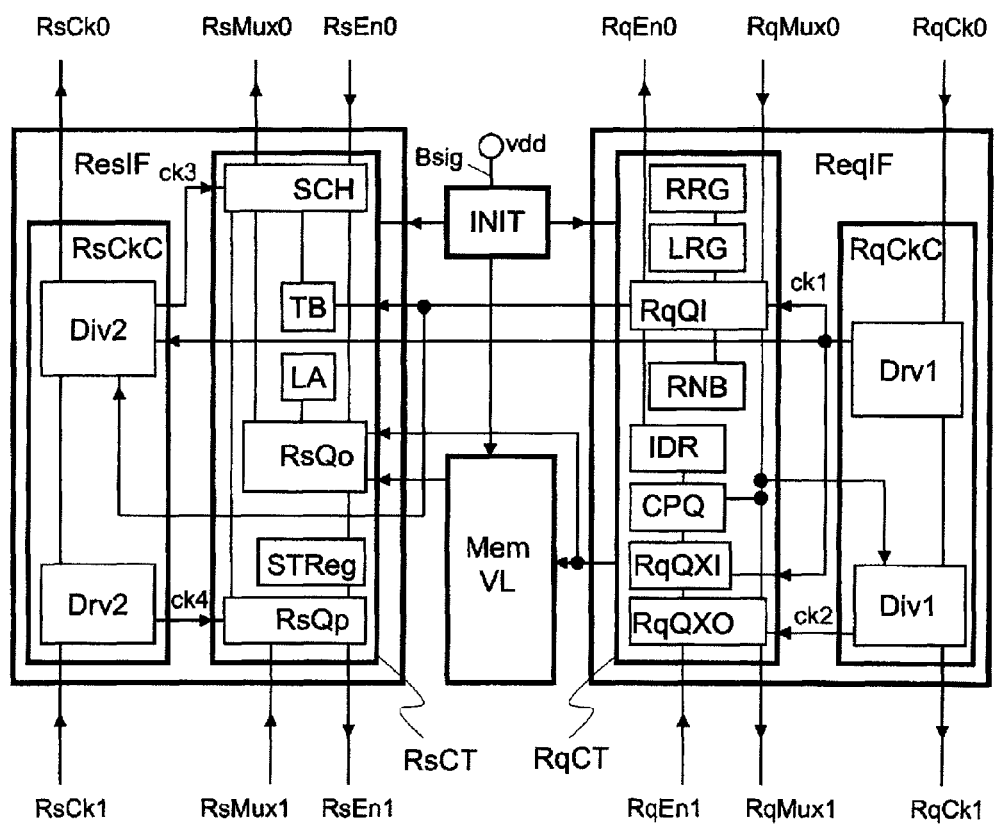
FIG. 10 is a diagram showing one example of a memory configuring the information processing system of the present invention.

FIG. 10 shows an example of a configuration of the memory chip M0.

The memory chip M0 includes the request interface circuit ReqIF, the response interface circuit ResIF, the initialization circuit INIT, and the memory circuit MemVL. The request interface circuit ReqIF includes the request clock control circuit RqCkC and the request queue control circuit RqCT. The request clock control circuit RqCkC includes the clock driver Drv1 and the clock frequency dividing circuit Div1.

The request queue control circuit RqCT includes a request queue circuit RqQI, a request queue circuit RqQXI, the request queue circuit RqQX0, the ID register circuit IDR, an ID comparison circuit CPQ, a latency value output setting register circuit LRG, a response order setting register circuit RRG, and the request number setting circuit RNB.

The request queue circuits RqQI, RqQXI, and RqQX0 respectively include four request queues, although not particularly limited thereto. The response interface circuit ResIF includes the response clock control circuit RsCkC and the response queue control circuit RsCT. The response clock control circuit RsCkC includes the clock driver Drv2 and the clock frequency dividing circuit Div2.

The response queue control circuit RsCT includes a response queue circuit RsQo, a response queue circuit RsQp, a status register circuit STReg, a response schedule circuit SCH, the latency calculating circuit LA, and the response number table TB.

The response queue circuits RsQo and RsQp respectively include four response queues, although not particularly limited thereto.

The memory chip MemVL is a volatile memory, and is a dynamic random access memory using dynamic random access memory cells, although not particularly limited thereto. The initialization circuit INIT initializes the memory chip M0 when starting power supply to the memory chip M0. The request clock control circuit RqCkC communicates the clock that has been input from the clock signal RqCk0 to the request queue control circuit RqCT and the response clock control circuit RsCkC via an internal clock ck1. The request clock control circuit RqCkC outputs the clock that the has been input from a request clock signal RqCk0 through the clock signal RqCk1 via the clock driver Drv1 and the clock frequency dividing circuit Div1. According to the instruction that has been input through the request signal RqMux0, the request clock control circuit RqCkC can lower the clock frequency of the clock signal ck2 and the request clock RqCk1, as well as stopping, and further resuming the clock.

The response clock control circuit RsCkC outputs the clock that has been input from an internal clock signal ck1 to the response queue control circuit RsCT through an internal clock signal ck3. The response clock control circuit RsCkC outputs, from the clock signal RsCk0, the clock that has been input from the internal clock signal ck1 via the clock frequency dividing circuit Div2. The response clock control circuit RsCkC outputs the clock that has been input from a clock signal RsCK1 to the response queue control circuit RsCT from the clock signal ck4 via a clock driver Div2. According to the instruction that has been input through the request signal RqMux0, the response clock control circuit RsCkC can lower the clock frequency of the response clock RsCk0, as well as stopping, and further resuming the clock.

If the instruction is a response order setting register setting instruction, the response order setting register circuit RRG stores the request number selection flag information RSELFlag value, the response order flag RRGFlag information, and the ID value.

If the instruction is a latency value output setting register setting instruction, the latency value output setting register circuit LRG stores the latency value output flag information LRGFlag value and the ID value included in the written data.

The request number setting circuit RNB generates the request number ReqN corresponding to the request that has been input to the request queue circuit RqQI if the request number selection flag information RSELFlag value is 1, whereas it defines the request number ReqN input through the request signal RqMux0 as the request number ReqN if the request number selection flag information RSELFlag value is 1.

The request queue circuit RqQI stores a request that has the ID value, the request number ReqN, the instruction, the address, and the written data multiplexed therein and that has been input to the memory chip M0 through the request signal RqMux0, generates a response number ResN that is identical to the request number ReqN, and transmits the response number ResN to the response queue control circuit RsCT.

The ID register circuit IDR stores the ID value of the memory chip M0.

The ID comparison circuit CPQ compares the ID value stored in the request queue circuit RqQI with the ID value stored in the ID register circuit IDR.

The request queue circuits RqQXI and RqQX0 store requests transferred from the request queue circuit RqQI.

The response queue circuit RsQo stores the data read from the memory circuit MemVL of the memory chip M0 and the ID value and the response number ResN read from the ID register circuit IDR.

The response queue circuit RsQp stores the ID value, the response number ResN, the read data, the error information, and the status information input through the response signal RsMux1.

The latency calculating circuit LA calculates the latency value of the read data if the latency value output flag information LRGFlag value of the latency value output setting register LRG is 1, whereas it does not calculate the latency value of the read data if the latency value output flag information LRGFlag value is 0.

The response number table TB determines transmission order of the read data according to setting of the response order setting register.

The status register circuit STRReg stores unprocessed response information indicating that a response is stored in the response queue circuits RsQo and RsQp, although not particularly limited thereto.

The response schedule circuit SCH determines response priority between the response stored in the response queue circuit RsQo and the response stored in the response queue circuit RsQp, and performs mediation for outputting the response having a higher priority from the response signal RsMux0. The response schedule circuit SCH dynamically changes the response priority according to the number of times responses are output from the response queue circuit RsQo and the number of times responses are output from the response queue circuit RsQp.

An operation of the memory chip M0 is described next.

An operation at the time of power-on is described first.

When the memory chip M0 is powered-on, the initialization circuit INIT initializes the memory chip M0. First, the value of the ID register and the ID valid bit held in the ID register circuit IDR are initialized to 0 and Low, respectively.

The latency value output flag information LRGFlag value and the ID information value held in the latency output register LRG are initialized to 0.

The request number selection flag RSELFlag value, the response order flag RRGFlag value, and the ID information value held in the response order setting register RRG are initialized to 0.

Next, the priority of the response to be input to the response queue circuit RsQo held in the response schedule circuit SCH is set to 1, the priority of the response to be input to the response queue circuit RsQp from the memory chip M1 is set to 1, and the priority of the response from the memory chip M2 is set to 3. Upon completion of initialization by the initialization circuit INIT, the memory chip M0 performs a communication confirmation operation to confirm that communication is possible between the information processing device CPU_CHIP and the memory chip M1. The memory chip M0 confirms that the request enable signal RqEn1 has become High, and sets the response enable signal RsEn1 and the request enable signal RqEn0 to High.

The information processing device CPU_CHIP then confirms that the request enable signal RqEn0 has become High, and recognizing that signal connection between respective memory chips has been checked, sets the response enable signal RsEn0 to High. Upon completion of the communication confirmation, the ID number 2 and the ID setting instruction are transferred from the information processing device CPU_CHIP to the memory chip M0 through the request signal RqMux0. Determining that ID numbering has not been performed yet because the ID valid bit is Low, the memory chip M0 completes the ID numbering by setting the ID number 2 to the ID register and the ID valid bit to High. The memory chip M0 then outputs the ID value 2 of the memory chip M0 and the ID numbering completion information through the response signal RsMux0, and notifies the information processing device CPU_CHIP that ID numbering of the memory chip M0 has been completed.

An operation after completion of the operation immediately after power-on is described next.

A data setting operation to the latency value output register LREG of the memory chip M0 is described first.

The information processing device CPU_CHIP synchronizes the request ReqLRGSet0 having the ID value 2, the latency value output register setting instruction LRGSet, and the setting value LRGData0 to the latency value output register LRG multiplexed therein with the clock signal RqCK0, and transfers the request ReqLRGSet0 to the memory chip M0 through the request signal RqMux0.

The setting value LRGData0 to the latency output register LRG includes, although not particularly limited thereto, the latency value output flag information LRGFlag value and the ID value.

The request queue control circuit RqCT of the memory chip M0 stores the request ReqLRGSet0.

The request queue control circuit RqCT of the memory chip M0 then compares the ID value 2 included in the request ReqLRGSet0 with the value 2 of its own ID register. Because the values match each other, a setting value LRGData0 is set to the latency value output register LRG of the memory chip M0. FIG. 4 shows an example of a value set to the latency value output register LRG of the memory chip M0.

A data setting operation to the response order setting register RRG of the memory chip M0 is described.

The information processing device CPU_CHIP synchronizes the request ReqRRGSet0 having the ID value 2, the response order setting register setting instruction RRGSet, the setting value RRGData0 to the response order setting register RRG multiplexed therein with the clock signal RqCK0, and transfers the request ReqRRGSet0 to the memory chip M0 through the request signal RqMux0. The setting value RRGData0 includes the request number selection flag information RSELFlag value, the response order flag RRGFlag information, and the ID value.

The request queue control circuit RqCT of the memory chip M0 stores the request ReqRRGSet0.

The request queue control circuit RqCT of the memory chip M0 then compares the ID value 2 included in the request ReqRRGSet0 with the value 2 of its own ID register. Because the values match each other, the setting value RRGData0 is set to the response order setting register RRG of the memory chip M0. FIG. 6 shows examples of values set to the response order setting register RRG of the memory chip M0.

There is described an operation when a request from the information processing device CPU_CHIP to the memory chip M0 is generated, with the latency value output register LRG of the memory chip M0 being set to the value shown to FIG. 4 and the response order setting register RRG being set to the value shown in FIG. 6.

The request queue circuit RqQI of the memory chip M0 includes two request queues RqQI-0 2 and RqQI-1, although not particularly limited thereto. Because no request has been entered to the request queues RqQI-0 and RqQI-1, the memory chip M0 sets the request enable signal RqEn0 to High and notifies the information processing device CPU_CHIP that a request can be accepted. The response queue circuit RqQo of the memory chip M0 includes two response queues RqQo-0 and RqQo-1, although not particularly limited thereto.

The response queue circuit RqQp of the memory chip M0 includes two response queues RqQp-0 nd RqQp-1, although not particularly limited thereto.

The information processing device CPU_CHIP sets the response enable signal RsEn0 High and notifies the memory chip M0 that a response can be accepted. The information processing device CPU_CHIP synchronizes a request ReqBAb0m0 having the ID value 2, the request number ReqN value 1, the bank activation instruction BA, the bank address BK1, and the row address Row multiplexed therein with the clock signal RqCk0, and transfers the request ReqBAb0m0 to the memory chip M0 through the request signal RqMux0 (FIG. 11: Step 1).

Figure 11:
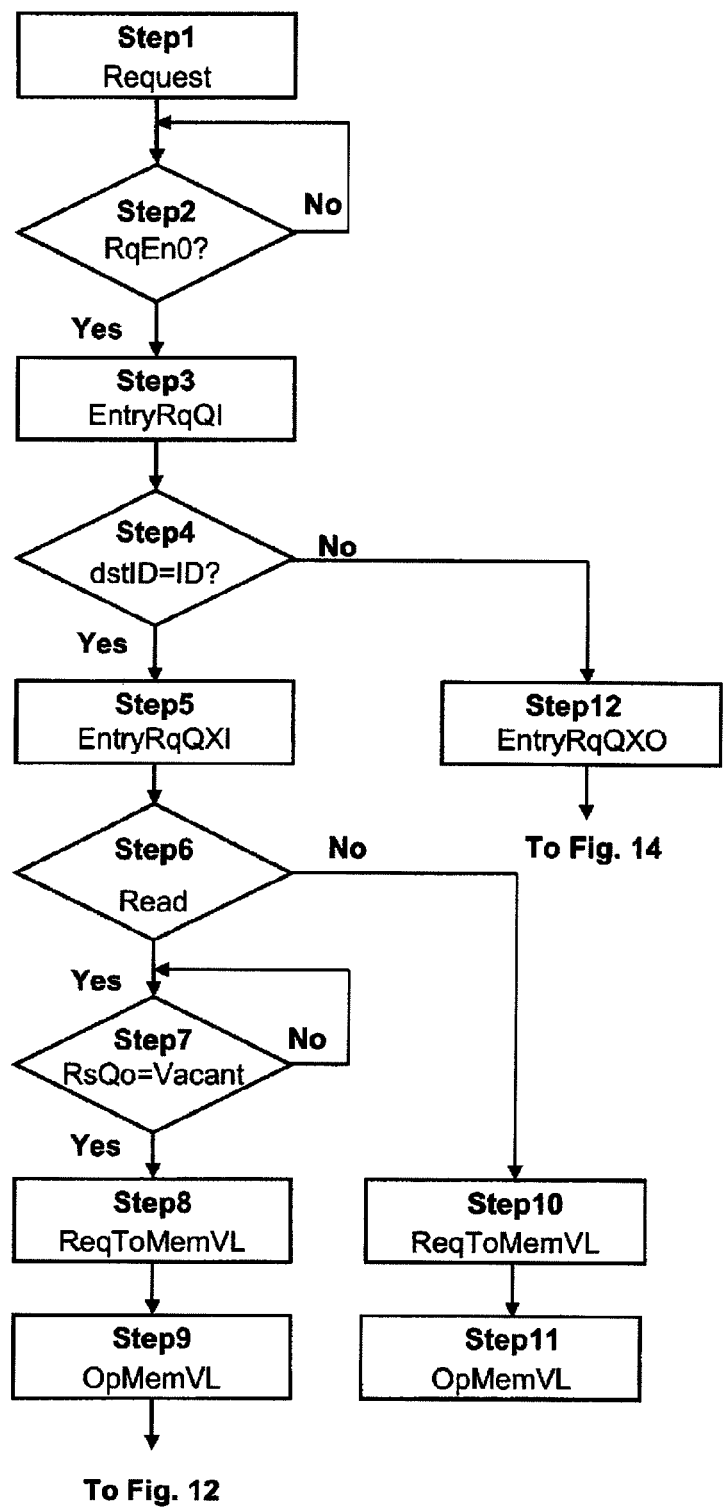
FIG. 11 is a flowchart showing an example of an operation responsive to a request generated in the information processing system of the present invention.

The information processing device CPU_CHIP then synchronizes the request ReqRD32b0m0 having the ID value 2, the request number ReqN value 2, the 32-Byte data read instruction RD32, the bank address BK0, and the column address Col255 multiplexed therein with the clock signal RqCK0, and transfers the request ReqRD32b0m0 to the memory chip M0 through the request signal RqMux0 (FIG. 11: Step 1).

If the request enable signal RqEn0 is Low (FIG. 11: Step 2), the request from the information processing device CPU_CHIP is not stored in the request queue circuit RqQI of the memory chip M0. If the request enable signal RqEn0 is High (FIG. 11: Step 2), the requests ReqBAb0m0 and ReqRD32b0m0 to the memory chip M0 are stored sequentially in the request queues RqQI-0 and RqQI-1 of the request queue circuit RqQI of the memory chip M0 (FIG. 11: Step 3).

Because all the request queues of the request queue circuit RqQI have been entered as described above and a new request from the information processing device CPU_CHIP van not be accepted, the request enable signal RqEn0 is set to Low. Because the request enable signal RqEn0 has been set to Low, the information processing device CPU_CHIP recognizes that the memory chip M0 can no longer accept a request.

Subsequently, the ID comparison circuit CPQ compares the ID value 2 included in the request ReqBAb0m0 entered into the request queue RqQI-0 with the ID value 2 held in the ID register circuit IDR (FIG. 11: Step 4). Because the result of comparison is a match, the request ReqBAb0m0 is transferred to the request queue circuit RqQXI (FIG. 11: Step 5). If the result of comparison is a mismatch, the request including the ID value and the request number ReqN value is transferred to the request queue circuit RqQX0, and transferred to the memory chip M1 (FIG. 11: Step 12).

The request queue circuit RqQXI then checks whether the stored request includes a read instruction (FIG. 11: Step 6). If a read instruction is included, the request queue circuit RqQXI checks whether there is vacancy in the response queues RqQp-0 and RqQp-1 of the response queue circuit RsQo (FIG. 11: Step 7). Because the request ReqBAb0m0 does not include a read instruction, the request queue circuit RqQXI transfers the stored request ReqBAb0m0 to the memory circuit MemVL (FIG. 11: Step 10). The memory circuit MemVL operates according to the request ReqBAb0m0 (FIG. 11: Step 11). Specifically, according to the bank activation instruction BA, the bank address BK0, and the row address Row63 included in the request ReqBAb0m0, the memory circuit MemVL activates the memory cells equivalent to 1 kByte connected to the row 63 in the bank 0 and transfers them to the sense amplifier in the bank (FIG. 11: Step 11).

Because, processing the request ReqBAb0m0 has provided vacancy for one request in the request queue RqQI-0, the memory chip M0 sets the request enable signal RqEn0 to High and notifies the information processing device CPU_CHIP that a new request can be accepted. The information processing device CPU_CHIP confirms that the request enable signal RqEn0 of the memory chip M0 is set to High, synchronizes a request ReqWT23b0m0 having the ID value 2, the request number ReqN value 3, the 32-Byte write instruction WT, the bank address BK0, the column address Col127, and the 32-Byte write data multiplexed therein with the clock signal RqCK0, and transfers the request ReqWT23b0m0 to the memory chip M0 through the request signal RqMux0 (FIG. 11: Step 1). The request enable signal RqEn0 is checked (FIG. 11: Step 2) and, because the request enable signal RqEn0 is High, the memory chip M0 stores the request ReqWT23b0m0 from the information processing device CPU_CHIP to the request queue RqQI-0 in its own request queue control circuit RqCT (FIG. 11: Step 3).

The memory chip M0 can process the request ReqRD32b0m0 already stored in the request queue RqQI-1

(FIG. 11: Step 4 and later), in parallel with and independently of, storing the new request ReqWT23b0m0 in the request queue RqQI-0 in its own request queue circuit RqQI (FIG. 11: Step 3).

An operation with regard to the request ReqRD32b0m0 already stored in the request queue RqQI-1 is described next.

The ID comparison circuit CPQ compares the ID value 2 included in the request ReqRD32b0m0 entered into the request queue RqQI-1 with the ID value 2 held in the ID register circuit IDR (FIG. 11: Step 4). Because the result of comparison is a match, the request ReqRD32b0m0 is transferred to the request queue circuit RqQXI (FIG. 11: Step 5). If the result of comparison is a mismatch, the reqRD32b0m0 is transferred to the request queue circuit RqQX0, and transferred to the memory chip M1 (FIG. 11: Step 12). The request queue circuit RqQXI then checks whether the stored response includes a read instruction (FIG. 11: Step 6).

Because the request ReqRD32b0m0 includes a read instruction, the request queue circuit RqQXI checks whether there is vacancy in the response queues RqQp-0 and RqQp-1 of the response queue circuit RsQo (FIG. 11: Step 7). If there is no vacancy in the response queues RqQp-0 and RqQp-1 of the response queue circuit RsQo, the request queue circuit RqQXI stops transferring the request ReqRD32b0m0 until there is vacancy. If there is vacancy in the response queues RqQp-0 and RqQp-1 of the response queue circuit RsQo, the request queue circuit RqQXI transfers the stored request ReqRD32b0m0 to the memory circuit MemVL (FIG. 11: Step 8). The memory circuit MemVL operates according to request ReqRD32b0m0 (FIG. 11: Step 9). Specifically, according to the ID value 2, the request number ReqN value 2, the 32-Byte data read instruction RD, the bank address BK0, and the column address Col255 included in the request ReqRD32b0m0, the memory circuit MemVL reads 32-Byte data whose starting address is the column address 255 among the data held in the sense amplifier of the bank 0 (FIG. 11: Step 9), and enters the data into the response queue RsQo-0 of the response queue RsQo in the response queue control circuit RsCT, together with the ID register value 2 and a response number ResN value 2 identical to the request number ReqN value 2, as a response ResRD32b0m0 (FIG. 12: Step 13).

Figure 12:
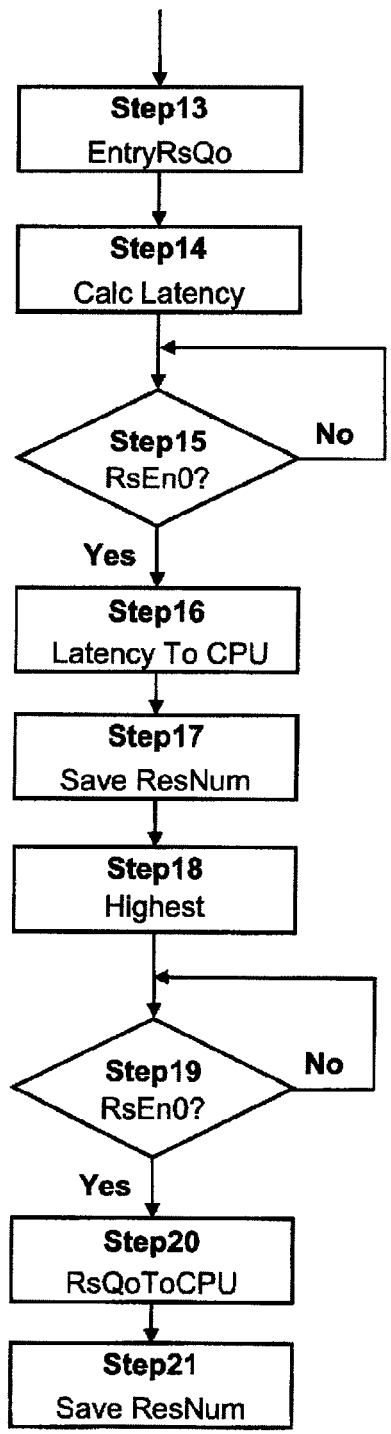
FIG. 12 is a flowchart showing an example of an operation responsive to a responce of the information processing system of the present invention.

Upon entry of a response into the response queue circuits RsQo and RsQp, latency is calculated for the response (FIG. 12: Step 14). The response enable signal RsEn0 is then checked (FIG. 12: Step 15), and the response number ResN and the latency value are transmitted to the information processing device CPU_CHIP when the response enable signal RsEn0 is High (FIG. 12: Step 16).

The response schedule circuit SCH stores the number of responses entered into the response queue circuits RsQo and RsQp in a status register STReg (FIG. 12: Step 17). Furthermore, response priority of responses that have been entered into the response queue circuits RsQo and RsQp is determined (FIG. 12: Step 18). The response enable signal RsEn0 is then checked (FIG. 12: Step 19), and the response having the highest response priority is transmitted to the information processing device CPU_CHIP through the response signal RsMux0 when the response enable signal RsEn0 is High (FIG. 12: Step 20). Transmission to the information processing device CPU_CHIP is not performed when the response enable signal RsEn0 is Low.

Upon completely transmitting a single response of the response queue circuits RsQo and RsQp to the information processing device CPU_CHIP, the response schedule circuit SCH checks the number of responses that have been entered into the response queue circuits RsQo and RsQp and stores the newest number of responses in the status register STReg (FIG. 12: Step 21).

Because the response enable signal RsEn0 is High and the response ResRD32b0m0 is the only response entered into the response queue circuits RsQo and RsQp, a latency value Lat32b0m0 is calculated for the response ResRD32b0m0, and the response number ResN value 2 and the latency value Lat32b0m0 included in the response ResRD32b0m0 are transmitted to the information processing device CPU_CHIP.

By receiving the response number value 2 and the latency value Lat32b0m0 corresponding to the request number ReqN value 2 of the request ReqRD32b0m0, the information processing device CPU_CHIP can check the latency value until the response ResRD32b0m0 is input to the information processing device CPU_CHIP.

The response schedule circuit SCH then stores the number of responses 1 in the status register STReg, sets the response priority of response eRsRD32b0m0 to the highest priority, and transmits the response RsRD32b0m0 to the information processing device CPU_CHIP.

The response RsRD32b0m0 includes the ID register value 2, the response number value 2 identical to the request number ReqN value 2, and the 32-Byte data.

By receiving the response number value 2 corresponding to the request number ReqN value 2 of the request ReqRD32b0m0, the information processing device CPU_CHIP can confirm that the response ResRD32b0m0 is a response of the request ReqRD32b0m0.

Upon transmission of the response ResRD32b0m0 to the information processing device CPU_CHIP, the response schedule circuit SCH stores the number of responses 0 in the status register STReg, because there is no response entered into the response queue circuits RsQo and RsQp.

Upon entry of the response ResRD32b0m0 corresponding to the request ReqRD32b0m0 into the response queue circuit RsQo, the request ReqWT23b0m0 can be processed even while the response ResRD32b0m0 is being output to the information processing device CPU_CHIP (FIG. 11: Step 4 and later).

An operation with regard to the request ReqWT23b0m0 already stored in the request queue RqQI-0 is described next. The ID comparison circuit CPQ compares the ID value 2 included in request ReqWT23b0m0 entered into the request queue RqQI-0 with the ID value 2 held in the ID register circuit IDR (FIG. 11: Step 4). Because the result of comparison is a match, the request ReqWT23b0m0 is transferred to the request queue circuit RqQXI (FIG. 11: Step 5). If the result of comparison is a mismatch, the request ReqWT23b0m0 is transferred to the request queue circuit RqQX0, and transferred to the memory chip M1 (FIG. 11: Step 12).

The request queue circuit RqQXI then checks whether the stored response includes a read instruction (FIG. 11: Step 6). If a read instruction is included, the request queue circuit RqQXI checks whether there is vacancy in the response queues RqQp-0 and RqQp-1 of the response queue circuit RsQo (FIG. 11: Step 7). Because the ReqWT23b0m0 does not include a read instruction, the request queue circuit RqQXI transfers the stored ReqWT23b0m0 to the memory circuit MemVL (FIG. 11: Step 10). The memory circuit MemVL operates according to request ReqWT23b0m0 (FIG. 11: Step 11). Specifically, according to the ID value 2, the 32-Byte data write instruction WT, the bank address BK0, the column address Col127, and the 32-Byte write data included in the request ReqWT23b0m0, the memory circuit MemVL writes the 32-Byte data whose starting address is the column address 127 into the sense amplifier of memory the bank 0.

Figure 13:
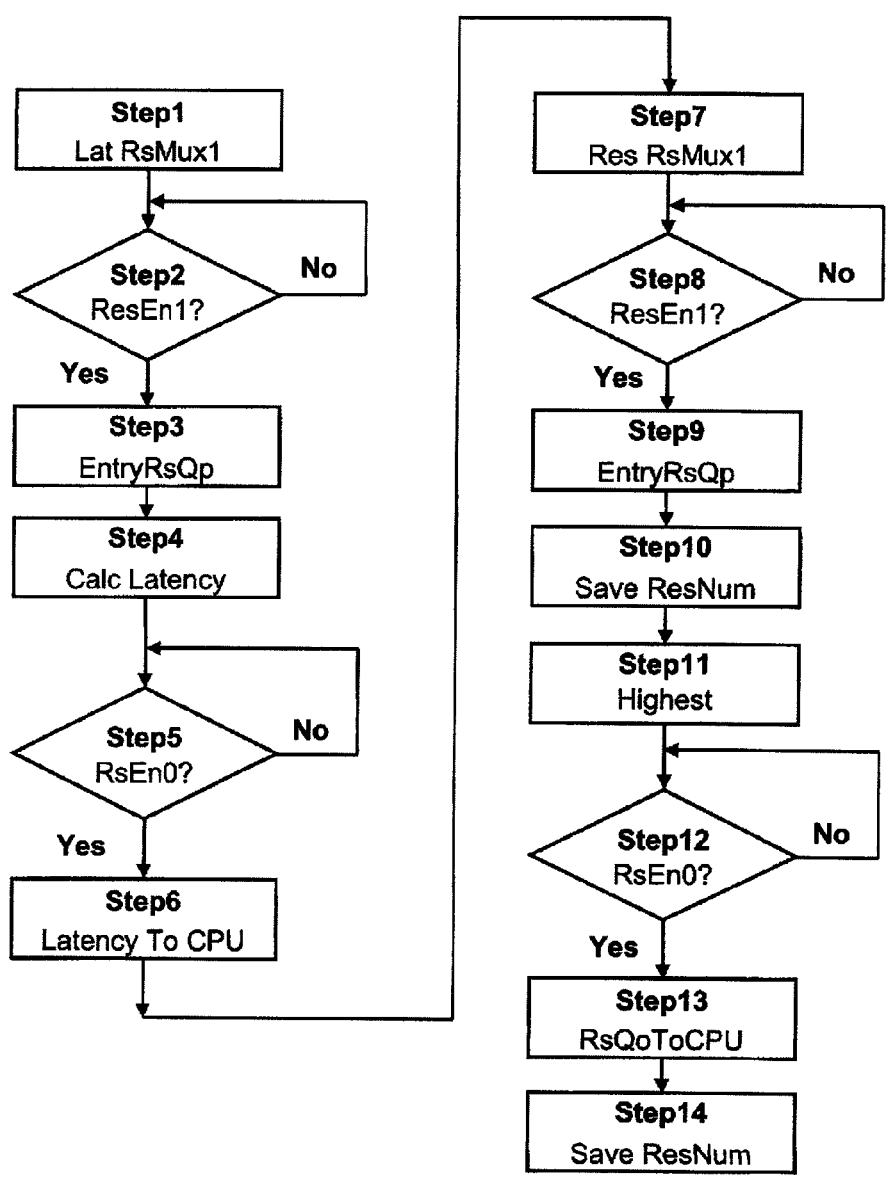
FIG. 13 is a flowchart showing an example of an operation responsive to a responce of the information processing system of the present invention.

FIG. 13 is a flowchart showing an example of an operation when a response from the memory chip M1 to the memory chip M0 occurs.

When a response ResLatm1 including a response number ResN value 15 and a latency value Latm1 is transmitted from the response signal RsMux1 to the memory chip M0 in synchronization with the response clock signal RqCK1 (FIG. 13: Step 1), the response ResLatm1 is not stored in the response queue circuit RsQp of the memory chip M0 if a response enable signal ResEn1 is Low (FIG. 13: Step 2). If the response enable signal ResEn1 is High (FIG. 13: Step 2), the response ResLatm1 is stored in the response queue circuit RsQp of the memory chip M0 (FIG. 13: Step 3).

Upon entry of the response ResLatm1 into the response queue circuit RsQp, latency is calculated for the response from the latency value Latm1 to obtain a latency value Latm1m0 (FIG. 13: Step 4). The response enable signal RsEn0 is then checked (FIG. 13: Step 5), and a response ResLatm1m0 including the response number ResN value 15 and the latency value Latm1m0 is transmitted to the information processing device CPU_CHIP when the response enable signal RsEn0 is High (FIG. 13: Step 6).

By receiving the response number ResN value 15 and the latency value Latm1m0, the information processing device CPU_CHIP can check the latency value until a response having the response number ResN value 15 corresponding to the request having the request number ReqN value 15 is input to the information processing device CPU_CHIP.

A response ResRDm1m0 including a response number ResN value 20 and a read data RDdata transmitted to the memory chip M0 (FIG. 13: Step 7) is not stored in the response queue circuit RsQp of the memory chip M0, if the response enable signal ResEn1 is Low (FIG. 13: Step 8). If the response enable signal ResEn1 is High (FIG. 13: Step 8), it is stored in the response queue circuit RsQp of the memory chip M0 (FIG. 13: Step 9).

Upon entry of the response ResRDm1m0 into the response queue circuit RsQp, the response schedule circuit SCH stores the number of responses entered into the response queue circuits RsQo and RsQp in the status register STReg (FIG. 13: Step 10). Furthermore, response priority for the response entered into the response queue circuits RsQo and RsQp are determined (FIG. 13: Step 11). The response enable signal RsEn0 is then checked (FIG. 13: Step 12), and the response having the highest response priority is transmitted from the response signal RsMux0 to the information processing device CPU_CHIP if the response enable signal RsEn0 is High (FIG. 13: Step 13). If the response enable signal RsEn0 is Low, transmission to the information processing device CPU_CHIP is not performed.

By receiving the response ResRDm1m0 having response number ResN value 15, the information processing device CPU_CHIP can confirm that the response is a response to the request having the request number ReqN value 15.

Upon complete transmission of a single response of the response queue circuits RsQo and RsQp to the information processing device CPU_CHIP, the response schedule circuit SCH checks the number of responses that have been entered into the response queue circuits RsQo and RsQp and stores the newest number of responses in the status register STReg (FIG. 13: Step 14).

An operation of the response schedule circuit SCH is described.

Figure 14:
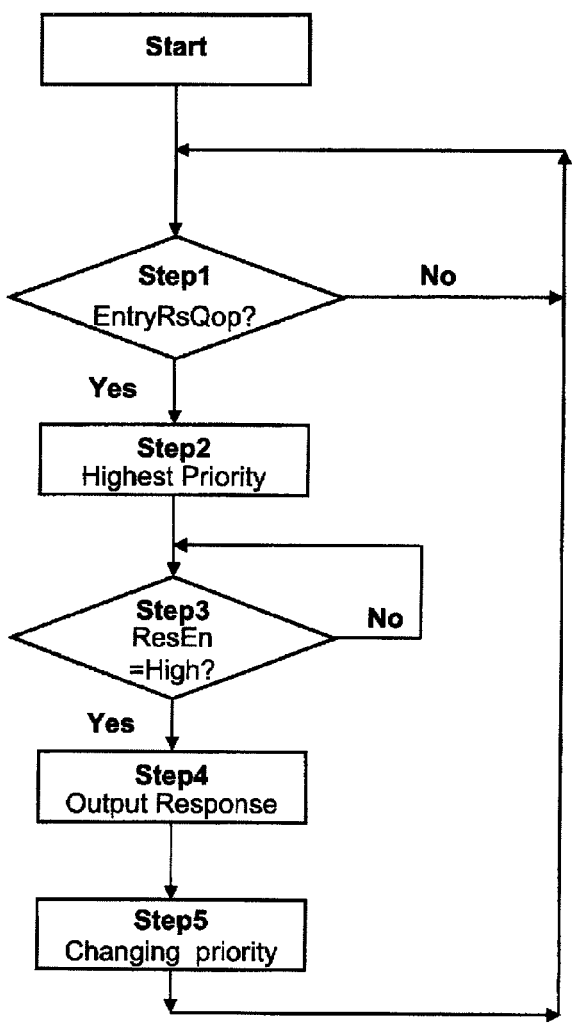
FIG. 14 is a flowchart showing an operation of a response schedule circuit.

FIG. 14 is a flowchart showing an operation of the response schedule circuit SCH. The response schedule circuit SCH first checks whether a response has been entered into the response queue circuits RsQo and RsQp (Step 1). If no response has been entered into either of the response queue circuits RsQo and RsQp, the response schedule circuit SCH checks again for an entry to the response queue circuits RsQo and RsQp. If a response has been entered into in either of the response queue circuits RsQo or RsQp, the response schedule circuit SCH checks the priority of the responses and prepares for transmission of the response having the highest response priority (Step 2).

The response schedule circuit SCH then checks the response enable signal RsEn0 (Step 3) and, if the response enable signal RsEn0 is Low, waits until the response enable signal RsEn0 becomes high without outputting a response. If the response enable signal RsEn0 is High, the response schedule circuit SCH outputs the response having the highest response priority (Step 4), and changes the output priority with regard to responses after the response is output (Step 5).

An example of an operation of changing the response priority performed in the response schedule circuit SCH of the memory chip M0 is described. FIG. 15 shows control of dynamic response priority performed by the response schedule circuit SCH provided in the memory chip M0.

Control of the response priority in the memory chip M0 is described first. At the initialization immediately after power-on (Initial), the priority of the response of the memory chip M0 entered into the response queue circuit RsQo (PRsQo (M0)) is set to 1, the priority of the response of the memory chip M1 entered into the response queue circuit RsQp (PRsQp(M1)) is set to 2, and the priority of the response of the memory chip M2 entered into the response queue circuit RsQp (PRsQp(M2)) is set to 3. A response having a smaller priority number is assumed to have a higher priority, although not particularly limited thereto. When the response of the memory chip M0 entered into the response queue circuit RsQo (RsQo(M0)) is output Ntime times, the response of the memory chip M0 entered into the response queue circuit RsQo (PRsQo (M0)) has the lowest priority of 3, the response of the memory chip M1 (PRsQp (M1)) has the highest priority of 1, and the response of the memory chip M2 entered into the response queue circuit RsQP (PRsQp(M2)) has a priority of 2.

When the response of the memory chip M1 entered into the response queue circuit RsQp (RsQp(M1)) is output Mtime times, the response of the memory chip M1 entered into the response queue circuit RsQp (PRsQp(M1)) has the lowest priority of 3, the response of the memory chip M2 entered into the response queue circuit RsQp (PRsQp(M1)) has the highest priority of 1, and the response of the memory chip M0 entered into the response queue circuit RsQPo (PrsQo(M0)) has a priority of 2.

Next, when the response of the memory chip M2 entered into the response queue circuit RsQp (RsQp(M2)) is output Ltime times, the response of the memory chip M2 entered into the response queue circuit RsQp (PRsQp(M2)) has the lowest priority of 3, and the response of the memory chip M0 entered into the response queue circuit RsQo (PRsQo(M0)) has the highest priority of 1. The response of the memory chip M2 entered into the response queue circuit RsQp (PRsQp (M1)) has a priority of 2. The number of response output times Ntime for changing the response priority of the response from the memory chip M0 entered into the response queue circuit RsQo, the number of response output times Mtime for changing the response priority of the response from the memory chip M1 entered into the response queue circuit RsQp, and the number of response output times Ltime for changing the response priority of the response from the memory chip M2 entered into the response queue circuit RsQp are respectively set to 10, 2, and 1 at the initialization immediately after power-on (Initial), although not particularly limited thereto.

Further, the numbers of response output times Ntime, Mtime, and Ltime can be set from the information processing device CPU_CHIP and can be respectively set according to the system configuration of portable devices that use the present invention to achieve a high performance.

<Clock Control>

Figure 16A:
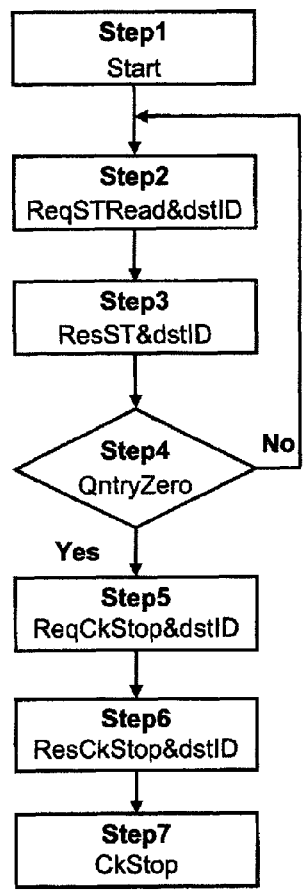
FIG. 16 is a flowchart showing one example of a clock control operation of the information processing system of the present invention.

FIG. 16(a) shows an example of an operation of stopping the response clock signal RsCk0 output from the memory chip M0. The information processing device CPU_CHIP inputs a request ReqRNo having the ID value 2 of the memory chip M0 and a number-of-response confirmation instruction from the request signal RqMux0 multiplexed therein to check the number of responses ResN entered into the response queue circuits RsQo and RsQp (Step 2). The request queue circuit RqQI of the memory chip M0 stores the request ReqRNo. The ID comparison circuit CPQ then compares the ID value 2 included in the request ReqRNo stored in the request queue circuit RqQI with the ID value 2 held in the ID register circuit IDR, and because the result is a match, the request ReqBAb0m0 is transferred to the request queue circuit RqQXI.

The request queue circuit RqQXI transmits the request ReqBAb0m0 to the status register circuit STReg. The status register circuit STReg transmits, together with the ID value 2, the number of responses ResN to the response queue circuit RsQo, and the response queue circuit RsQo transmits the ID value 2 and the response number ResN to the information processing device CPU_CHIP through the response signal RsMux0 (Step 3). The information processing device CPU_CHIP that received the ID value 2 and the number of responses ResN then checks whether the number of responses ResN is 0 (Step 4).

If the number of responses ResN is not 0, it transmits the number-of-response confirmation instruction to the memory chip M0 again because there still exists a response that has been entered into the response queue circuits RsQo and RsQp (Step 2).

If the number of responses ResN is 0, an instruction of stopping the response clock signal RsCk0 is transmitted to the memory chip M0 from the request signal RqMux0 because there is no response entered into the response queue circuits RsQo and RsQp (Step 5). A request ReqStop2 having the ID value 2 and the response clock stop command multiplexed therein is input to the memory chip M0 as a request from the request signal RqMux0. The memory chip M0 stores the request ReqStop2 in a request queue within its own request queue control circuit RqCT. Subsequently, the ID comparison circuit in the request queue control circuit RqCT compares the ID value 2 included in the request ReqStop2 with the value 2 of its own ID register. Values of the comparison result match, and the request queue control circuit RqCT transmits the request ReqStop2 to the clock frequency dividing circuit Div2 in the response clock control circuit RsCkC (Step 5).

The clock frequency dividing circuit Div2 gradually lowers the clock frequency of a response clock signal RsCK0 according to the request ReqStop2, and transmits, when preparation for stopping the response clock signal RsCK0 is ready, the ID value 2 and response clock stop notification information to the information processing device CPU_CHIP from the response signal RsMux0 through the response schedule circuit SCH (Step 6). Subsequently, the clock frequency dividing circuit Div2 stops the clock signal ck3 and the response clock signal RsCK0 (Step 7).

Figure 16B:
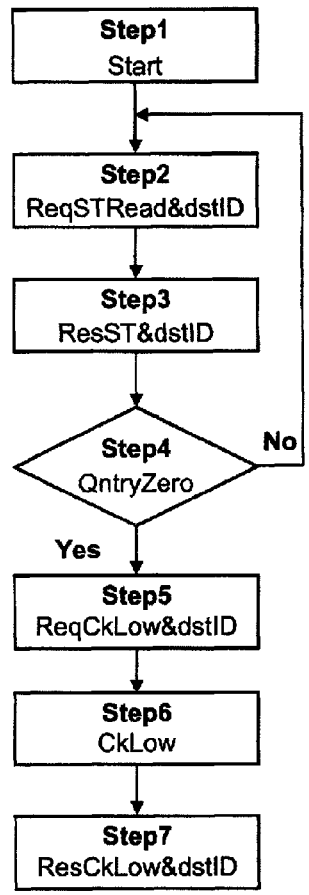

FIG. 16(b) shows an example of an operation of lowering the clock frequency of the response clock signal RsCk0 output from the memory chip M0. Because the operation from Steps 1 to 4 of FIG. 16(b) is equivalent to FIG. 16(a), descriptions are given for Step 5 and later. A request ReqDIV8 having the ID value 2, the response clock frequency dividing command, and a division ratio 8 multiplexed therein is transmitted to the memory chip M0 as a request from the request signal RqMux0 (Step 5). The memory chip M0 compares, using the ID comparison circuit in its own request queue control circuit RqCT, the ID value 2 included in the request ReqDIV8 with the value 2 of its own ID register. Because the result of comparison is a match, the request ReqDIV8 is transmitted to the clock frequency dividing circuit Div2 in the request clock control circuit RqCkC (Step 5).

The clock frequency dividing circuit Div2 gradually lowers the clock frequency of the response clock signal RsCK0 according to the request ReqDIV8 and finally outputs a clock divided into one-eighth of the request clock signal RqC2 from a clock CK 3 and the response clock signal RsCk2 (Step 6). After the clock frequency of the response clock signal RsCK0 has been changed to a desired frequency, the clock frequency dividing circuit Div2 transmits the ID value 2 and response clock frequency division completion information to the information processing device CPU_CHIP from the response signal RsMux0 through the response schedule circuit SCH (Step 7).

Figure 16C:
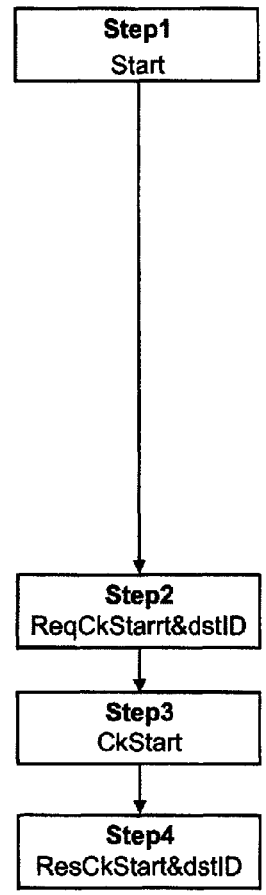

FIG. 16(c) shows an example of an operation of causing the divided or stopped response clock signal RsCk0 to operate again with a frequency equivalent to the request clock signal RqCk0. It is an exemplary operation of lowering the clock frequency of the response clock signal RsCk0 output from the memory chip M0. A request ReqStart2 having the ID value 2 and the response clock resuming command multiplexed therein is input to the memory chip M0 as a request from the request signal RqMux0.

The memory chip M0 stores the request ReqStart2 to a request queue in its own request queue control circuit RqCT (Step 2). Subsequently, the ID comparison circuit in the request queue control circuit RqCT compares the ID value 2 included in the request ReqStart2 with the value 2 of its own ID register. Because the result of comparison is a match, the memory chip M0 determines that the request ReqDIV4 is a request directed to itself. The request queue control circuit RqCT transmits the request ReqStart2 to the clock frequency dividing circuit Div2 in the response clock control circuit RsCkC (Step 2). According to the request ReqStart2, the clock frequency dividing circuit Div3 gradually raises the clock frequency and finally outputs a clock having a frequency equivalent to the request clock signal RqCk0 from the clock ck3 and the response clock signal RsCK0 (Step 3).

After the clock frequency of the response clock signal RsCK0 has been changed to a desired frequency, the clock frequency dividing circuit Div2 transmits the ID value 2 and response clock resuming completion information to the information processing device CPU_CHIP from the response signal RsMux0 through the response schedule circuit SCH (Step 4). Although a clock control method is described above with regard to the response clock signal RsCk0, it is needless to say that clock control of the request clock signal RqCk1 can be performed in a similar manner.

<Memory Circuit MemVL>

Figure 17:
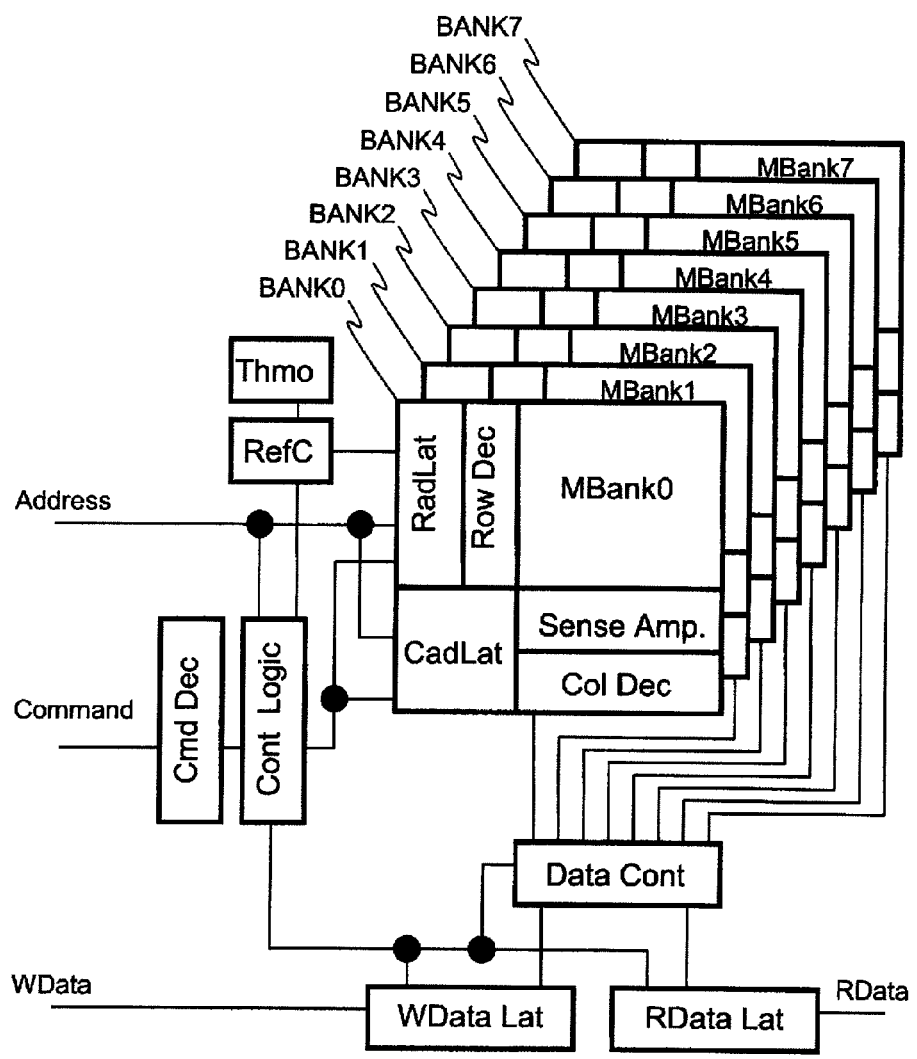
FIG. 17 is a diagram showing one example of a memory circuit of the memory configuring the information processing system of the present invention.

FIG. 17 is an example of a circuit block diagram of the memory circuit MemVL provided in the memory chip M0.

The memory circuit MemVL includes a command decoder CmdDec, a control circuit Cont Logic, a refresh counter RefC, a thermometer Thmo, a write data buffer WDataLat, a read data buffer RDataLat, a data control circuit DataCont, and memory banks BANK0 to BANK7.

Each of the memory banks BANK0 to BANK7 includes a row address buffer RadLat, a column address buffer CadLat, a row decoder RowDec, a column decoder ColDec, a sense amplifier SenseAmp, and memory circuits MBank0 to MBank7.

A read operation of the memory circuit MemVL is described.

A bank address 7 and a row address 5 are stored in a request queue RqQXI. The bank activation instruction BA is transmitted from a command signal Command, and the bank address 7 and the row address 5 are transmitted to the memory circuit MemVL from an address signal Address. The command decoder CmdDec decodes the bank activation instruction BA, a memory bank BANK7 is selected by the control circuit Cont Logic, the row address 5 is stored in the row address buffer RadLat of the memory bank BANK7 and input to the row decoder RowDec. Subsequently, memory cells connected to the row address 5 in a memory circuit MBank 7 are activated, and 1-kByte data is transferred to the sense amplifier SenseAmp.

Next, with an 8-Byte data read instruction RD8, the bank address 7, and a column address 64 being stored in the request queue RqQXI, the 8-Byte data read instruction RD8 is then transmitted from the command signal Command, and the bank address 7 and the column address 63 are transmitted from the address signal Address to the memory circuit MemVL.

The command decoder CmdDec decodes the 8-Byte data read instruction RD8, the control circuit Cont Logic selects the memory bank BANK7, and the column address 63 is stored in a column address buffer CAddLat of the memory bank BANK7 and input to the column decoder ColDec.

Subsequently, 8-Byte data whose starting address is the column address 64 is read from the sense amplifier SenseAmp, transferred to the read data buffer RDataLat and stored therein via the data control circuit DataCont. The 8-Byte data that has been read is subsequently transferred to the response queue circuit RsQo.

A write operation of the memory circuit MemVL is described next. With an 8-Byte data write instruction WT8, the bank address 7, and a column address 128 being stored in the request queue RqQXI, the 8-Byte data write instruction RD8 is transmitted from the command signal Command, the bank address 7 and the column address 127 are transmitted from the address signal Address, and the 8-Byte data is transmitted from the write data signal WData to the memory circuit MemVL.

The command decoder CmdDec decodes the 8-Byte data write instruction WT8, the column address 128 is stored in the column address buffer CAddLat of the memory bank BANK7 by the control circuit Cont Logic and input to the column decoder ColDec, and the 8-Byte write data is stored in the write data buffer WData Lat.

Subsequently, 8-Byte data whose starting address is the column address 128 is transferred from the write data buffer WData Lat to the sense amplifier SenseAmp in the memory bank Bank 7 via the data control circuit DataCont, and written into the memory circuit Mbank7.

Because respective memory banks BANK0 to BANK7 operate independently, read and write operations can be performed simultaneously across different banks, whereby processing speed can be increased.

A refresh operation is described next. Because the memory circuit MemVL is a volatile memory, a refresh operation must be regularly performed to retain the data. A refresh instruction REF stored in the request queue RqQXI is input from the command signal Command. The command decoder CmdDec decodes the refresh instruction REF, and the control circuit Cont Logic instructs a refresh counter RefC to perform the refresh operation. The refresh counter RefC performs the refresh operation according to the instruction of the control circuit Cont Logic.

A self-refresh operation is described next. If a request to the memory circuit MemVL is not generated for a long time, the operation mode is changed to self-refresh state so that the memory circuit MemVL can perform the refresh operation by itself.

A self-refresh entry instruction SREF stored in the request queue RqQXI is input from the command signal Command. The command decoder CmdDec decodes the self-refresh entry instruction SREF, and the control circuit Cont Logic changes the operation mode of the entire circuit to self-refresh state. The command decoder CmdDec further instructs the refresh counter RefC to automatically perform the self-refresh operation regularly. The refresh counter RefC automatically performs the self-refresh operation regularly according to the instruction of the control circuit Cont Logic.

In the self-refresh operation described above, frequency of self-refreshing can be changed according to the temperature.

Generally, with a volatile memory, data retention period tends to be short when the temperature is high and long when the temperature is low. Accordingly, the self-refresh operation is performed by detecting the temperature with a thermometer to shorten the cycle of self-refreshing when the temperature is high and lengthen the cycle of self-refreshing when the temperature is low, whereby useless self-refreshing can be eliminated to reduce power consumption.

A self-refresh/cancellation instruction SREFX can be input from the command signal Command to come out of the self-refresh state. A data retention operation after having come out of a self-refresh state is performed by the refresh instruction REF.

<Description of Memory Chip M1>

Figure 18:
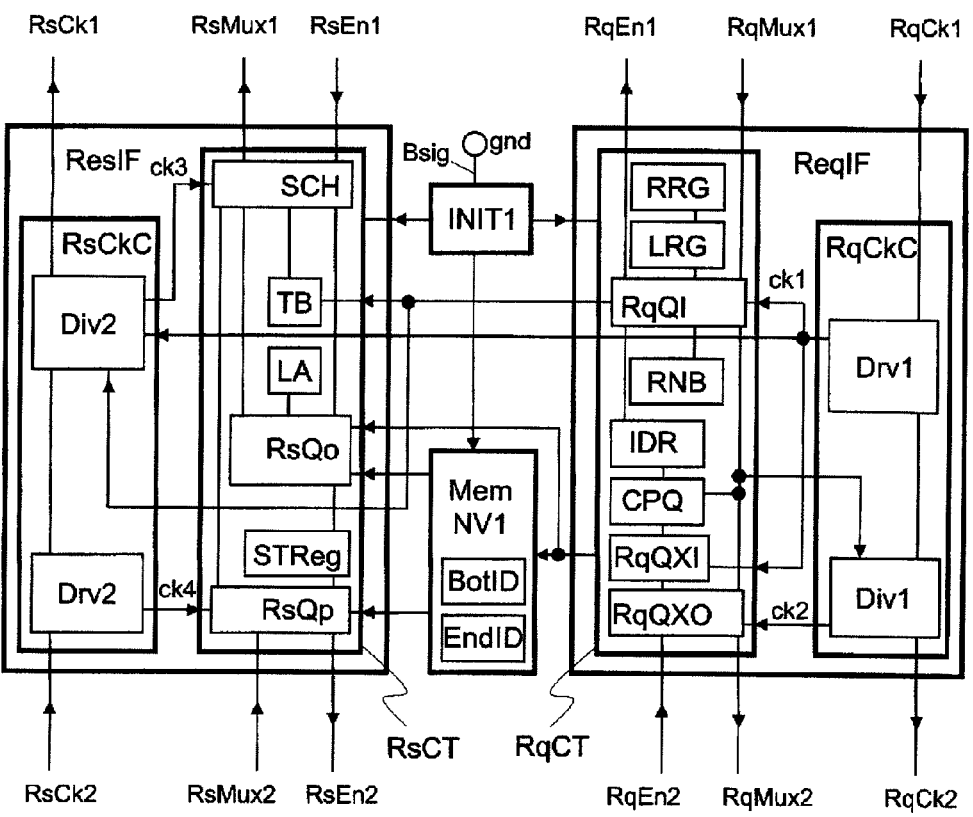
FIG. 18 is a diagram showing one example of a memory configuring the information processing system of the present invention.

FIG. 18 shows an example of a configuration of the memory chip M1.

The memory chip M1 includes the request interface circuit ReqIF and the response interface circuit ResIF and the initialization circuit INIT, the memory circuit MemNV1. The request interface circuit ReqIF includes the request clock control circuit RqCkC and the request queue control circuit RqCT. The request clock control circuit RqCkC includes the clock driver Drv1 and the clock frequency dividing circuit Div1.

The request queue control circuit RqCT includes the request queue circuit RqQI, the request queue circuit RqQXI, the request queue circuit RqQX0, the ID register circuit IDR, the ID comparison circuit CPQ, the latency value output setting register circuit LRG, the response order setting register circuit RRG, and the request number setting circuit RNB.

The request queue circuits RqQI, RqQXI, and RqQX0 respectively include four request queues although not particularly limited thereto. The response interface circuit ResIF includes the response clock control circuit RsCkC and the response queue control circuit RsCT. The response clock control circuit RsCkC includes the clock driver Drv2 and the clock frequency dividing circuit Div2.

The response queue control circuit RsCT includes the response queue circuit RsQo, the response queue circuit RsQp, the status register circuit STReg, the response schedule circuit SCH, the latency calculating circuit LA, and the response number table TB.

The response queue circuits RsQo and RsQp respectively include four response queues, although not particularly limited thereto.

The response clock control circuit RsCkC includes the clock driver Drv2 and the clock frequency dividing circuit Div2. The response queue control circuit RsCT includes the response queue circuit RsQo, the response queue circuit RsQp, the status register circuit STReg, and the response schedule circuit SCH.

The memory circuit MemNV1 is a nonvolatile memory and a NOR flash memory using NOR flash memory cells, although not particularly limited thereto. A boot device ID value BotID and an end-device ID value EndI are stored in the memory circuit MemNV1. The circuits other than the memory circuit MemNV1 and the initialization circuit INIT1 included in the memory chip M1, and operations such as data read or write are equivalent to those of the memory chip M0 of FIG. 10.

The operation when powering on the memory chip M1 is described. When the memory chip M1 is powered-on, the initialization circuit INIT1 initializes the memory chip M1. Because the boot device recognition signal Bsig is grounded (gnd), the memory chip M1, recognizing itself to be the boot device, sets the boot device ID value 1 held by its own memory circuit MemNV1 to the ID register IDR and sets the ID valid bit to High.

Next, the priority of the response to be input to the response queue circuit RsQo held in the response schedule circuit SCH is set to 1, and the priority of the response to be input to the response queue circuit RsQp from the memory chip M2 is set to 2. Frequency dividing ratio of the clock frequency dividing circuits Div1 and Div2 is set to 1. Upon completion of initialization by the initialization circuit INIT, the memory chip M1 performs a communication confirmation operation to confirm that communication is possible between the memory chips M1 and M2. The memory chip M1 confirms that the request enable signal RqEn2 has become High, and sets the response enable signal RsEn2 and the request enable signal RqEn1 to High.

The memory chip M0 then confirms that the request enable signal RqEn1 has become High, and sets the response enable signal RsEn1 to High. Upon completion of the communication confirmation, the boot data is read from the memory circuit MemNV1 and transmitted to the information processing device CPU_CHIP via the memory chip M0. Control of response priority in the memory chip M1 is described next.

FIG. 19 shows control of dynamic response priority performed by the response schedule circuit SCH provided in the memory chip M1.

As shown in FIG. 1, for a connection in which no response of the memory chip M0 is generated for the memory chip M1, priority is defined only for the responses of the memory chips M1 and M2. At the initialization immediately after power-on (Initial), the priority of the response from the memory circuit MemNV1 entered into the response queue circuit RsQo (PRsQo(M1)) is set to 1 and the priority of the response from the memory chip M2 entered into the response queue circuit RsQp (PRsQp(M2)) is set to 2. A response having a smaller priority number is assumed to have a higher priority, although not particularly limited thereto.

When the response of the memory circuit MemNV1 entered into the response queue circuit RsQo (RsQo(M1)) is output M1time times, the response entered into the response queue circuit RsQo (PRsQo(M0)) has the lowest priority of 2 and the response of the memory chip M2 (PRsQp(M2)) has the highest priority of 1.

When the response from the memory chip M2 entered into the response queue circuit RsQp (PRsQp(M2)) is output L1time times, the response from the memory chip M2 entered into the response queue circuit RsQp (PRsQp(M2)) has the lowest priority of 2, and the response entered into the response queue circuit RsQo (PRsQp(M1)) has the highest priority of 1. The number of response output times M1time for changing the response priority of the response from the memory circuit MemNV1 entered into the response queue circuit RsQo, and the number of response output times L1time for changing the response priority of the response from the memory chip M2 entered into the response queue circuit RsQp are respectively set to 10, and 1 at the initialization immediately after power-on (Initial), although not particularly limited thereto. Furthermore, the numbers of response output times M1time and L1time can be set from the information processing device CPU_CHIP, and can be respectively set according to the system configuration of portable devices that use the present invention to achieve a high performance.

Control of the dynamic response priority performed by the response schedule circuit SCH provided in the memory chip M1 is equivalent to the operation shown in FIG. 14. In addition, the clock control method of the request clock signal RqCk2 and the response clock signal RsCk1 is similar to the clock control method shown in FIG. 16.

<Memory Circuit MemNV1>

Figure 20:
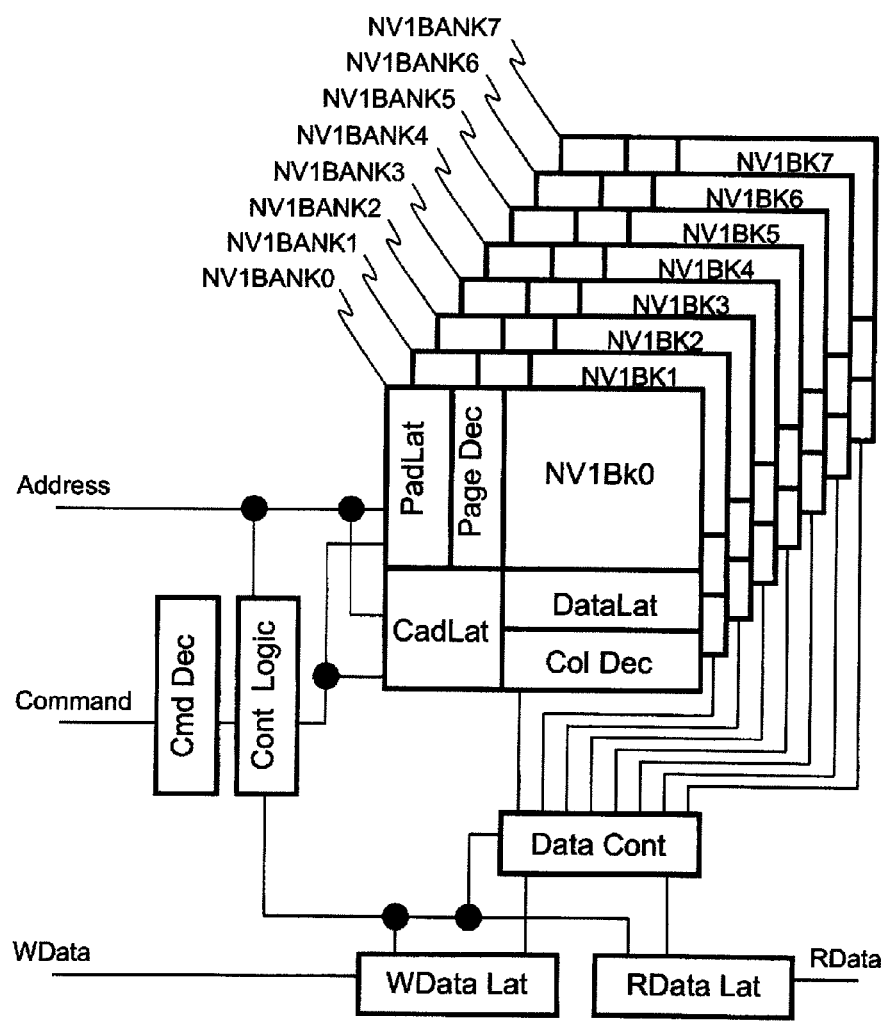
FIG. 20 is a diagram showing one example of a memory circuit of the memory configuring the information processing system of the present invention.

FIG. 20 is an example of a circuit block diagram of the memory circuit MemNV1 provided in the memory chip M0.

The memory circuit MemNV1 includes the command decoder CmdDec, the control circuit Cont Logic, the write data buffer WDataLat, the read data buffer RDataLat, the data control circuit DataCont, and memory banks NV1BANK0 to NV1BANK7.

Each of the memory banks NV1BANK0 to NV1BANK7 includes a page address buffer PadLat, the column address buffer CadLat, a page decoder PageDec, the column decoder ColDec, a data buffer DataLat, and memory cell circuits NV1BK0 to NV1BK7.

A read operation of the memory circuit MemNV1 is described.

With the bank address 7 and the row address 5 being stored in the request queue RqQXI, the bank activation instruction BA is transmitted from the command signal Command, and the bank address 7 and a page address 5 are transmitted from the address signal Address to the memory circuit MemNV1. The command decoder CmdDec decodes the bank activation instruction BA, the control circuit Cont Logic selects the memory bank NV1BANK7, the page address 5 is stored in the page address buffer PadLat of memory bank NV1BANK7 and input to the page decoder PageDec. Subsequently, memory cells connected to the page address 5 in the memory cell circuit NV1Bank 7 is activated and 1-kByte data is transferred to the data buffer DataLat, although not particularly limited thereto.

With an 8-Byte data read instruction RD8, the bank address 7, and the column address 64 being stored in the request queue RqQXI, the 8-Byte data read instruction RD8 is then transmitted from the command signal Command, and the bank address 7 and the column address 63 are transmitted from the address signal Address to the memory circuit MemVL.

The command decoder CmdDec decodes the 8-Byte data read instruction RD8, the control circuit Cont Logic selects the memory bank NV1BANK7, and the column address 63 is stored in the column address buffer CAddLat of the memory bank NV1BANK7 and input to the column decoder ColDec.

Subsequently, 8-Byte data whose starting address is the column address 64 is read from the data buffer DataLat, transferred to the read data buffer RDataLat and stored therein via the data control circuit DataCont. The 8-Byte data that has been read is subsequently transferred to the response queue circuit RsQo.

A write operation of the memory circuit MemNV1 is described next. With an 8-Byte data write instruction WT8, the bank address 7, and a column address 128 being stored in the request queue RqQXI, the 8-Byte data write instruction RD8 is transmitted from the command signal Command, the bank address 7 and the column address 127 are transmitted from the address signal Address, and the 8-Byte data is transmitted from the write data signal WData to the memory circuit MemNV1.

The command decoder CmdDec decodes the 8-Byte data write instruction WT8, the control circuit Cont Logic selects the memory bank NV1BANK7, and the column address 128 is stored in the column address buffer CAddLat of the memory bank NV1BANK7 and input to the column decoder ColDec.

Additionally, the 8-Byte write data is stored in the write data buffer WData Lat by the control circuit Cont Logic.

Subsequently, 8-Byte data whose starting address is the column address 128 is read from the write data buffer WData-Lat, transferred to the data buffer DataLat in the memory bank NV1BANK 7, and written into the memory cell circuit NV1BK7 via the data control circuit DataCont.

Because respective memory banks NV1BANK0 to NV1BANK7 operate independently, read and write operations can be performed simultaneously among different banks, whereby processing speed can be increased.

<Description of Memory Chip M2>

Figure 21:
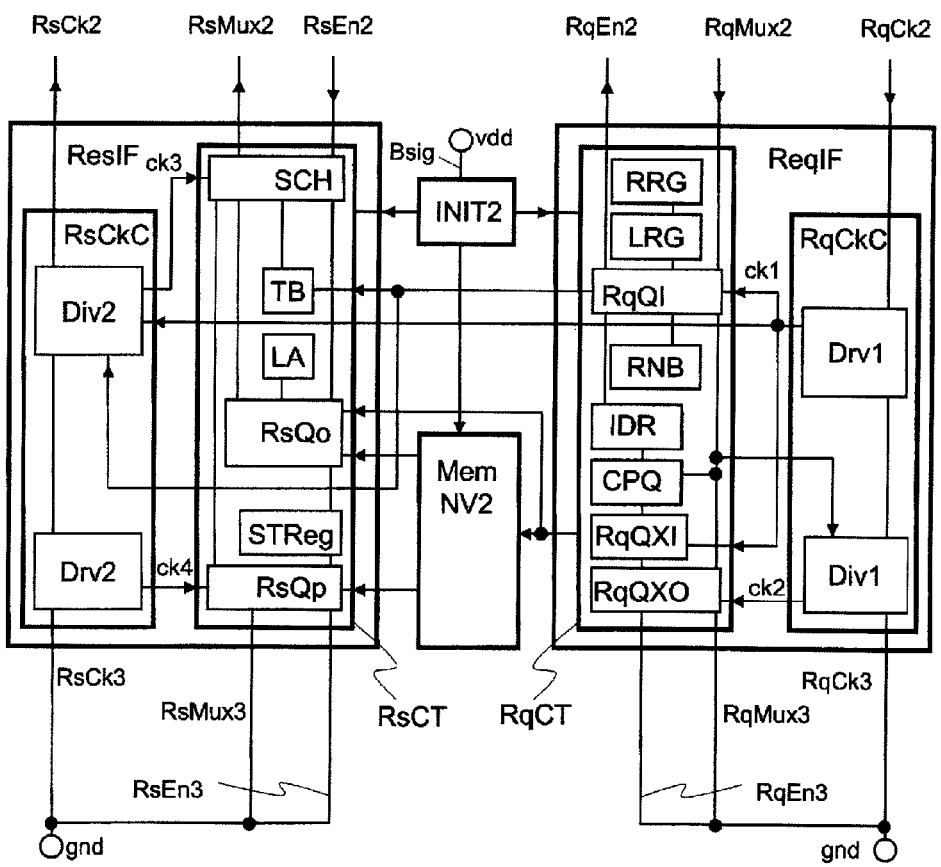
FIG. 21 is a diagram showing one example of a memory configuring the information processing system of the present invention.

FIG. 21 shows an example of a configuration diagram of the memory chip M2.

The memory chip M2 includes the request interface circuit ReqIF, the response interface circuit ResIF, the initialization circuit INIT, and the memory circuit MemNV1. The request interface circuit ReqIF includes the request clock control circuit RqCkC and the request queue control circuit RqCT. The request clock control circuit RqCkC includes the clock driver Drv1 and the clock frequency dividing circuit Div1.

The request queue control circuit RqCT includes the request queue circuit RqQI, the request queue circuit RqQXI, the request queue circuit RqQX0, the ID register circuit IDR, the ID comparison circuit CPQ, the latency value output setting register circuit LRG, the response order setting register circuit RRG, and the request number setting circuit RNB.

The request queue circuits RqQI, RqQXI, and RqQX0 respectively include four request queues, although not particularly limited thereto. The response interface circuit ResIF includes the response clock control circuit RsCkC and the response queue control circuit RsCT. The response clock control circuit RsCkC includes the clock driver Drv2 and the clock frequency dividing circuit Div2.

The response queue control circuit RsCT includes the response queue circuit RsQo, the response queue circuit RsQp, the status register circuit STReg, the response schedule circuit SCH, the latency calculating circuit LA, and the response number table TB.

The response queue circuits RsQo and RsQp respectively include four response queues, although not particularly limited thereto.

The response clock control circuit RsCkC includes the clock driver Drv2 and the clock frequency dividing circuit Div2. The response queue control circuit RsCT includes the response queue circuit RsQo, the response queue circuit RsQp, the status register circuit STReg, and the response schedule circuit SCH.

The memory circuit MemNV2 is a nonvolatile, NAND flash memory using NAND flash memory cells, although not particularly limited thereto. The circuits other than the memory circuit MemNV2 and the initialization circuit INIT2 included in the memory chip M2, and operations such as data read or write are equivalent to those of the memory chip M0 of FIG. 10.

The operation when powering on the memory chip M2 is described. When the memory chip M2 is powered-on, the initialization circuit INIT2 initializes the memory chip M2. First, the value of the ID register and the ID valid bit held in the ID register circuit IDR are initialized to 0 and Low, respectively. Next, the priority of the response that is held in the response schedule circuit SCH and input to the response queue circuit RsQo is set to 1. The division ratio of the clock frequency dividing circuits Div1 and Div2 is set to 1.

Upon completion of initialization by the initialization circuit INIT2, the memory chip M2 performs a communication confirmation operation to confirm that communication is possible to and from the memory chip M1. Having grounded (gnd) RqEn3, RsMux3, and RqCk3, the memory chip M2 recognizes that it is located at the farthest end of serially connected memory chips, and sets the request enable signal RqEn2 to High.

The memory chip M1 then confirms that the request enable signal RqEn2 has become High, and sets the response enable signal RsEn2 and the request enable signal RqEn1 to High. Control of response priority in the memory chip M2 is described next.

FIG. 22 shows control of dynamic response priority performed by the response schedule circuit SCH provided in the memory chip M2. As shown in FIG. 1, if the memory chip M2 is the end chip of a serial connection, no response of the memory chips M0 and M1 is generated for the memory chip M2.

Therefore, priority is defined only for the responses of the memory chip M2. Accordingly, the priority of the response of the memory chip M2 entered into the response queue circuit RsQo (PRsQ0(M2)) does not change after having been set to 1 by the initialization (Initial) immediately after power-on. Because the priority of the response of the memory circuit NV2 entered into the response queue circuit RsQo (PRsQ0 (M2)) is never changed, the number of response output times for changing the priority of the response entered into the response queue circuit RsQo from the memory chip M2 is set to 0 by the initialization (Initial) immediately after power-on, although not particularly limited thereto, and need not be changed. The clock control method of the response clock signal RsCk2 is similar to that shown in FIG. 16.

<Memory Circuit MemNV2>

Figure 23:
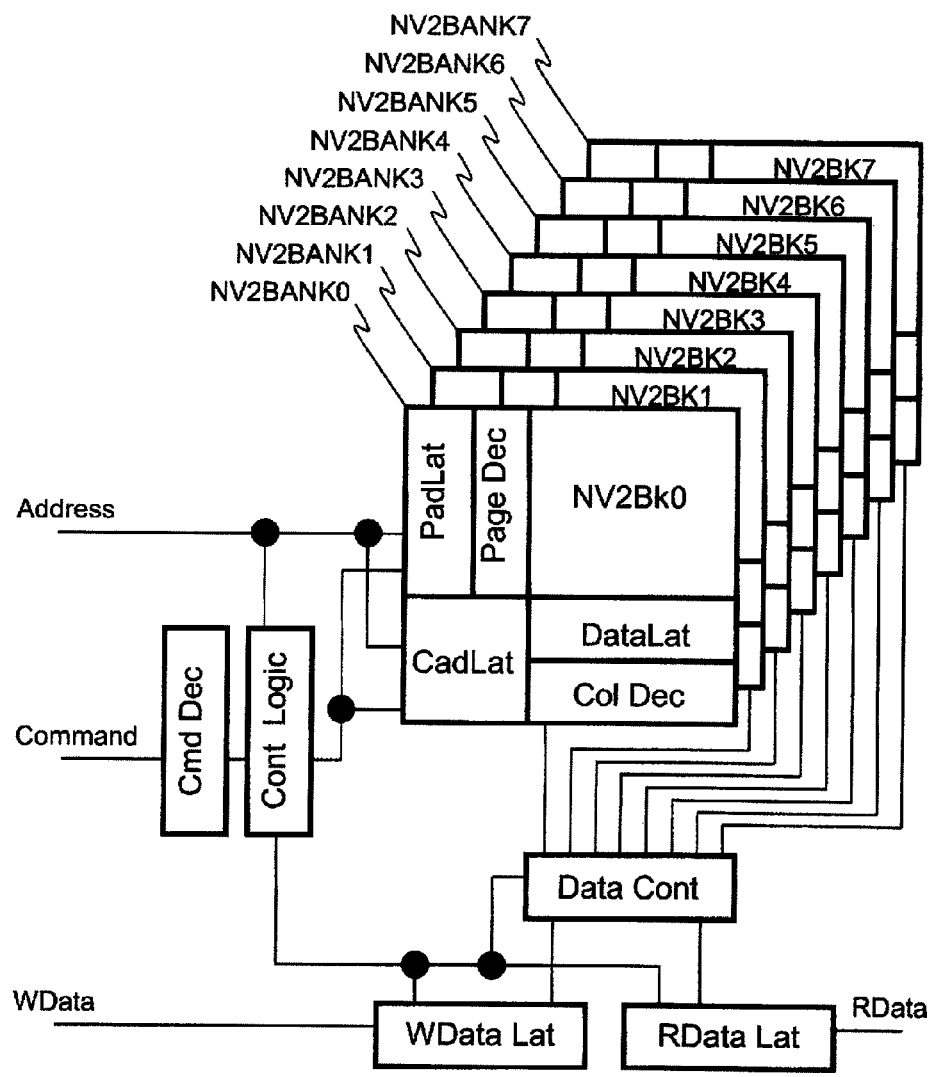
FIG. 23 is a diagram showing one example of a memory circuit of the memory configuring the information processing system of the present invention.

FIG. 23 is an example of a circuit block diagram of the memory circuit MemNV2 provided in the memory chip M0.

The memory circuit MemNV1 includes the command decoder CmdDec, the control circuit Cont Logic, the write data buffer WDataLat, the read data buffer RDataLat, the data control circuit DataCont, and the memory banks NV1BANK0 to NV1BANK7.

Each of the memory banks NV1BANK0 to NV1BANK7 includes the page address buffer PadLat, the column address buffer CadLat, the page decoder PageDec, the column decoder ColDec, the data buffer DataLat, and the memory cell circuits NV1BK0 to NV1BK7.

A read operation of the memory circuit MemNV1 is described.

With the bank address 7 and the page address 5 being stored in the request queue RqQXI, the bank activation instruction BA is transmitted from the command signal Command, and the bank address 7 and the page address 5 are transmitted from the address signal Address to the memory circuit MemNV2. The command decoder CmdDec decodes the bank activation instruction BA, the control circuit Cont Logic selects a memory bank NV2BANK7, the page address 5 is stored in the page address buffer PadLat of memory bank NV1BANK7 and input to the page decoder PageDec. Subsequently, memory cells connected to the page address 5 in the memory cell circuit NV2Bank7 is activated and 2-kByte data is transferred to the data buffer DataLat, although not particularly limited thereto.

With a 32-Byte data read instruction RD32, the bank address 7, and the column address 64 being stored in the request queue RqQXI, the 32-Byte data read instruction RD32 is then transmitted from the command signal Command, and the bank address 7 and the column address 64 are transmitted from the address signal Address to the memory circuit MemNV2.

The command decoder CmdDec decodes the 32-Byte data read instruction RD32, the control circuit Cont Logic selects the memory bank NV1BANK7, and the column address 64 is stored in the column address buffer CAddLat of the memory bank NV1BANK7 and input to the column decoder ColDec.

Subsequently, 32-Byte data whose starting address is the column address 64 is read from the data buffer DataLat, transferred to the read data buffer RDataLat and stored therein via the data control circuit DataCont. The 32-Byte data that has been read is subsequently transferred to the response queue circuit RsQo.

A write operation of the memory circuit MemNV2 is described next. With an 8-Byte data write instruction WT32, the bank address 7, and the column address 128 being stored in the request queue RqQXI, the 32-Byte data write instruction RD32 is transmitted from the command signal Command, the bank address 7 and the column address 127 are transmitted from the address signal Address, and the 32-Byte data is transmitted from the write data signal WData to the memory circuit MemNV2.

The command decoder CmdDec decodes the 32-Byte data write instruction WT32, the control circuit Cont Logic selects the memory bank NV2BANK7, and the column address 128 is stored in the column address buffer CAddLat of the memory bank NV2BANK7 and input to the column decoder ColDec.

Additionally, the 32-Byte write data is stored in the write data buffer WData Lat by the control circuit Cont Logic.

Subsequently, 32-Byte data whose starting address is the column address 128 is read from the write data buffer WDataLat, transferred to the data buffer DataLat in the memory bank NV2BANK7, and written into the memory cell circuit NV2BK7 via the data control circuit DataCont.

Because respective memory banks NV2BANK0 to NV2BANK7 operate independently, read and write operations can be performed simultaneously among different banks, whereby processing speed can be increased.

Figure 24:
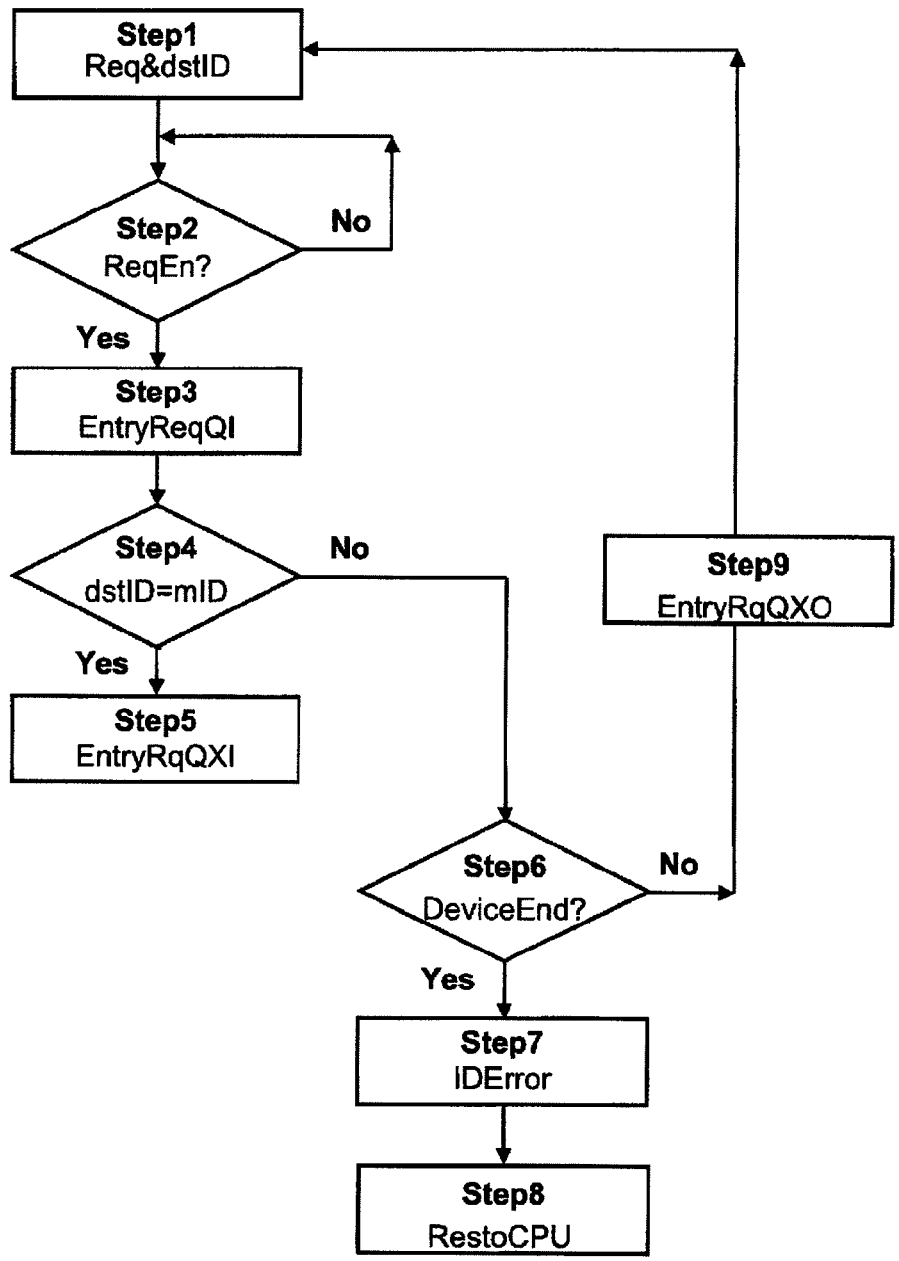
FIG. 24 is a flowchart showing one example of an operation responsive to an error response in the information processing system of the present invention.

FIG. 24 is a flowchart showing an example of an operation when an error occurred because the ID value included in the request transmitted from the information processing device CPU_CHIP to the memory module MEM did not match with any of the ID register values of the memory chips M0, M1, and M2. The request and the ID value are transmitted from the information processing device CPU_CHIP to the memory module MEM (Step 1). If the request enable signal RqEn0 is Low (Step 2), the request from the information processing device CPU_CHIP is not stored in the request queue circuit RqQI of the memory chip M0. If the request enable signal RqEn0 is High (Step 2), it is stored in the request queue circuit RqQI of the memory chip M0 (Step 3).

Subsequently, the ID comparison circuit CPQ compares the ID value included in the request entered into the request queue circuit RqQI with the ID value held in the ID register circuit IDR (Step 4). If the result of comparison is a match, the request entered into the request queue circuit RqQI is transferred to the request queue circuit RqQXI (Step 5). If the result of comparison is a mismatch, it is checked whether the memory chip M0 is the memory chip at the farthest end (Step 6). Because the memory chip M0 is not the end device, the request entered into the request queue circuit RqQI is transferred to the request queue circuit RqQX0, and further transferred to the next memory chip M1 (Step 9). In the memory chip M1, Steps 1 to 9 are repeated. In the memory chip M2, Steps 1 to 4 are performed. If the result of comparison at Step 4 is a match, the request entered into the request queue circuit RqQI is transferred to the request queue circuit RqQXI (Step 5). If the result of comparison is a mismatch, it is checked whether the memory chip M0 is the memory chip at the farthest end (Step 6).

Because the memory chip M2 is the memory chip at the farthest end, the ID value included in the request transmitted from the information processing device CPU_CHIP to the memory module MEM does not match with any of the ID register values of the memory chips M0, M1, and M2, whereby an ID error occurs (Step 7). The ID error is transmitted from the memory chip M2 at the farthest end to the information processing device CPU_CHIP via the memory chips M1 and M2.

Operation waveforms of the request input to the memory module MEM are described next. FIGS. 25 and 26 show an example of an operation waveform of the request transmitted by the information processing device CPU_CHIP to the memory module MEM and an operation waveform of the response from the memory module MEM to the information processing device CPU_CHIP.

FIG. 25(*a*) shows an example of a bank activation request including the bank activation instruction BA to the memory chip M0. When the request enable signal RqEN0 is High, the bank activation request has the ID2, the bank activation instruction BA, addresses AD20 and AD21 of the memory chip M0 multiplexed therein and is input to the memory chip M0 in synchronization with the request clock signal RqCk0, although not particularly limited thereto. The addresses AD20 and AD21 include the bank address and the row address. The bank activation request causes one of the memory banks in the memory chip M0 to be activated.

FIG. 25(*b*) shows an example of a read request including a 4-Byte data read instruction RD4 to the memory chip M0. When the request enable signal RqEN0 is High, the read request has the ID2, the read instruction RD4, the addresses AD22 and AD22 of the memory chip M0 multiplexed therein and is input to the memory chip M0 in synchronization with the request clock signal RqCk0, although not particularly limited thereto. The addresses AD22 and AD23 include the bank address and the column address. The read request causes data to be read from the activated memory bank in the memory chip M0.

FIG. 25(*c*) shows an example of a latency response that transmits the latency value of the response from the memory chip M0. The latency response include the ID value ID2, the latency transmission flag LF, and the latency value Lat of the memory chip M0, although not particularly limited thereto.

When the response enable signal RsEN0 is High, the latency response is input to the information processing device CPU_CHIP in synchronization with the rise and fall of the response clock signal RsCk0.

Figure 25A:
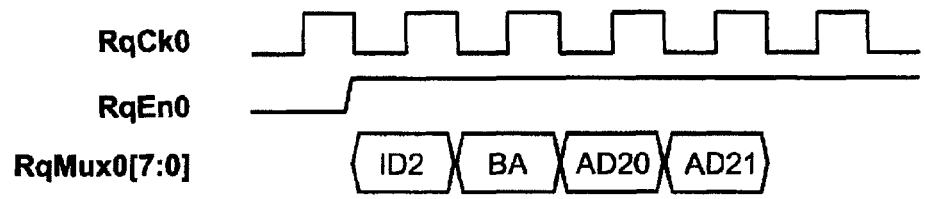
FIG. 25 is a diagram showing one example of an operation waveform of the information processing system of the present invention.
Figure 25B:
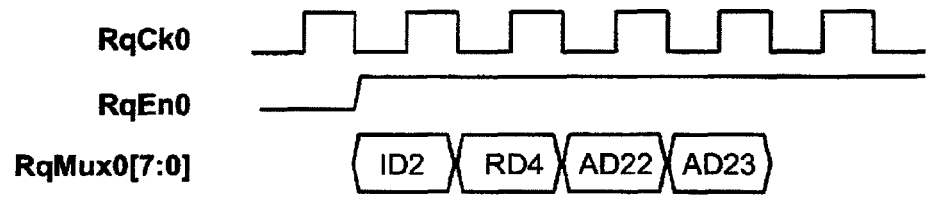
Figure 25C:
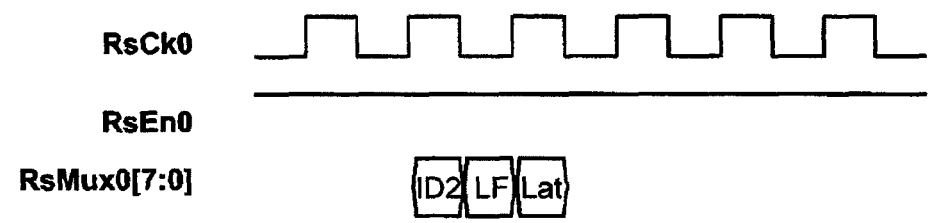
Figure 25D:
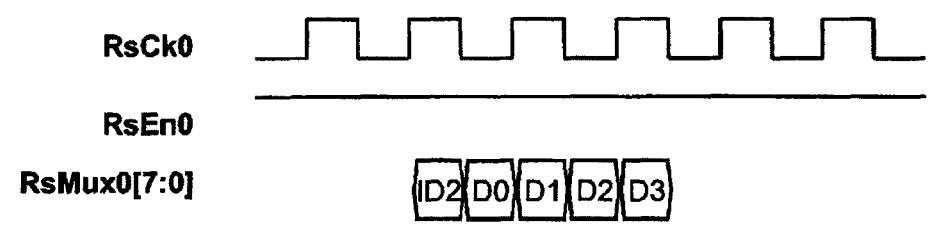

FIG. 25(d) shows a read response including the ID value of the memory chip M0 and data read from the memory chip M0. When the response enable signal RsEN0 is High, the read response has the ID value ID2 and 4-Byte data D0, D1, D2, and D3 of the memory chip M0 multiplexed therein and is input to the information processing device CPU_CHIP in synchronization with the rise and fall of the response clock signal RsCk0, although not particularly limited thereto.

Figure 26A:
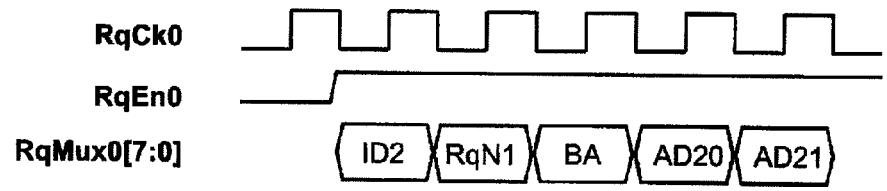
FIG. 26 is a diagram showing one example of an operation waveform of the information processing system of the present invention.

FIG. 26(a) shows another example of a bank activation request including the bank activation instruction BA to the memory chip M0. When the response enable signal RsEN0 is High, the bank activation request has the ID value ID2, a request number RqN1, the bank activation instruction BA, and the addresses AD20 and AD21 of the memory chip M0 multiplexed therein and is input to the memory chip M0 in synchronization with the request clock signal RqCk0, although not particularly limited thereto. The addresses AD20 and AD21 include the bank address and the row address. The bank activation request causes one of the memory banks in the memory chip M0 to be activated.

Figure 26B:
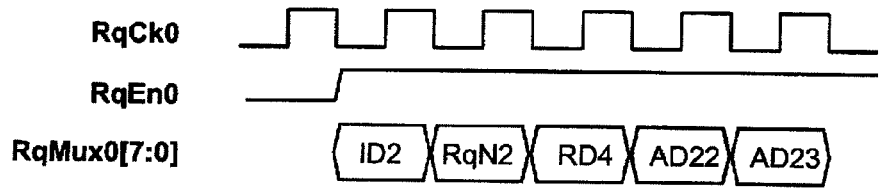

FIG. 26(b) shows another example of a read request including the 4-Byte data read instruction RD4 to the memory chip M0. When the request enable signal RqEN0 is High, the read request has the ID2, a request number RqN2, the read instruction RD4, the addresses AD22 and AD22 of the memory chip M0 multiplexed therein and is input to the memory chip M0 in synchronization with the request clock signal RqCk0, although not particularly limited thereto. The addresses AD22 and AD23 include the bank address and the column address. The read request causes data to be read from the activated memory bank in the memory chip M0.

Figure 26C:
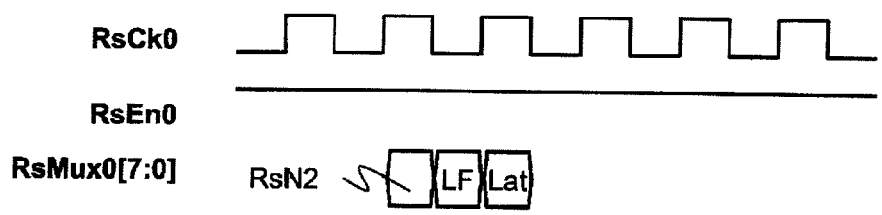

FIG. 26(c) shows another example of a latency response that transmits the latency value of the response from the memory chip M0. The latency response include the request number RqN2, the latency transmission flag LF, and the latency value Lat, although not particularly limited thereto.

When the response enable signal RsEN0 is High, the latency response is input to the information processing device CPU_CHIP in synchronization with the rise and fall of the response clock signal RsCk0.

Figure 26D:
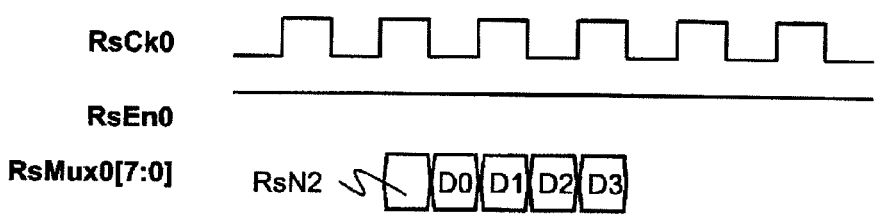

FIG. 26(d) shows another example of a read response including the data read from the memory chip M0. When the response enable signal RsEN0 is High, the read response has the request number RqN2 and the 4-Byte data D0, D1, D2, and D3 multiplexed therein and is input to the information processing device CPU_CHIP in synchronization with the rise and fall of the response clock signal RsCk0, although not particularly limited thereto.

Figure 27A:
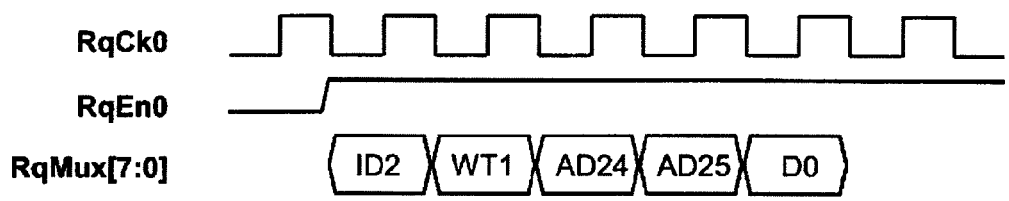
FIG. 27 is a diagram showing one example of an operation waveform of the information processing system of the present invention.

FIG. 27(a) is an example of a write request including a write instruction WT2 of 1-Byte data to the memory chip M0. When the request enable signal RqEN0 is High, the write request has the ID2, a write instruction WT1, and addresses AD24 and AD25 of the memory chip M0 multiplexed therein and is input to the memory chip M0 in synchronization with the request clock signal RqCk0, although not particularly limited thereto. The addresses AD22 and AD23 include the bank address and the column address. The write request causes data to be written into the memory chip M0.

Figure 27B:
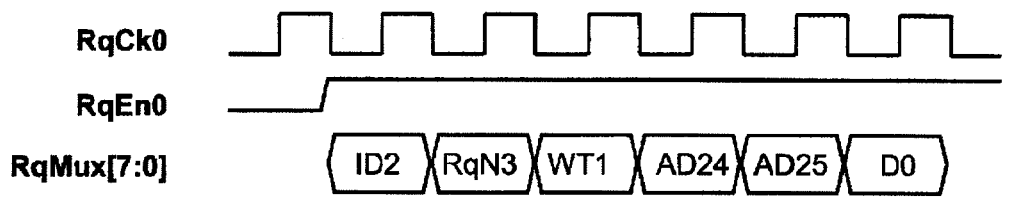

FIG. 27(b) is another example of a write request including the write instruction WT2 of 1-Byte data to the memory chip M0. When the request enable signal RqEN0 is High, the write request has the ID2, a request number RqN3, the write instruction WT1, and the addresses AD24 and AD25 of the memory chip M0 multiplexed therein and is input to the memory chip M0 in synchronization with the request clock signal RqCk0, although not particularly limited thereto. The addresses AD22 and AD23 include the bank address and the column address. The write request causes data to be written into the memory chip M0.

Figure 28A:
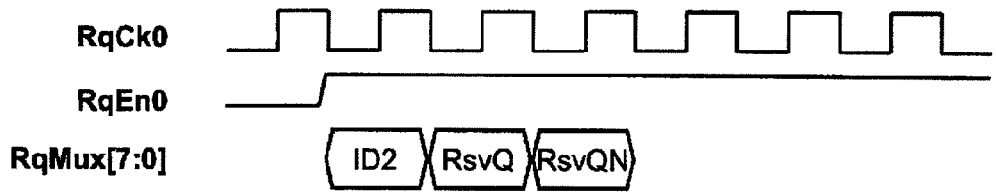
FIG. 28 is a diagram showing one example of an operation waveform of the information processing system of the present invention.

FIG. 28(a) is an example of the queue reservation request ReqNQRv for reserving request queues and response queues of the memory chip M0.

When the request enable signal RqEN0 is High, the queue reservation request ReqNQRv having the ID value ID2, the queue reservation instruction QRv, and the number of queues to be reserved QRvN multiplexed therein is transferred to the memory chip M0 in synchronization with the request clock signal RqCk0, although not particularly limited thereto. The request causes as many request queues and response queues of the memory chip M0 as the number specified by QRvN to be reserved, respectively.

Figure 28B:
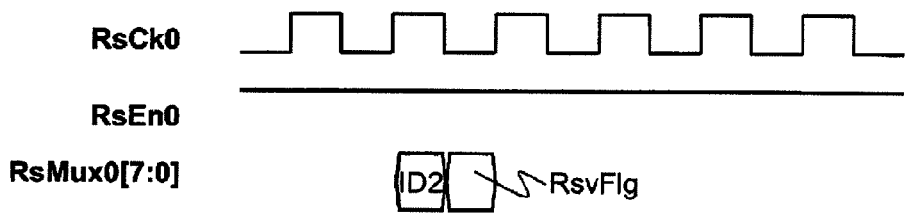

FIG. 28(b) shows a reservation completion response notifying that a reservation of queues of the memory chip M0 has been completed.

When the response enable signal RsEN0 is High, the reservation completion response having the ID value ID2 and the reservation completion signal RvFlg multiplexed therein is input to the information processing device CPU_CHIP in synchronization with the rise and fall of the response clock signal RsCk0, although not particularly limited thereto. Upon receiving the reservation completion response, the information processing device CPU_CHIP can confirm that a reservation of queues has been completed.

Figure 28C:
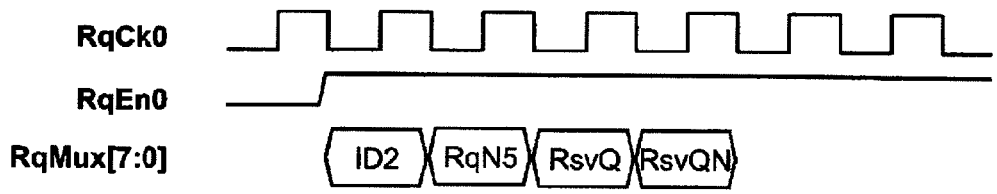

FIG. 28(c) is another example of the queue reservation request ReqNQRv for reserving request queues and response queues of the memory chip M0.

When the request enable signal RqEN0 is High, the queue reservation request ReqNQRv having the ID value ID2, a request number RqN5, the queue reservation instruction QRv, and the number of queues to be reserved QRvN multiplexed therein is transferred to the memory chip M0 in synchronization with the request clock signal RqCk0, although not particularly limited thereto. The request causes as many request queues and response queues of the memory chip M0 as the number specified by QRvN to be reserved, respectively.

Figure 28D:
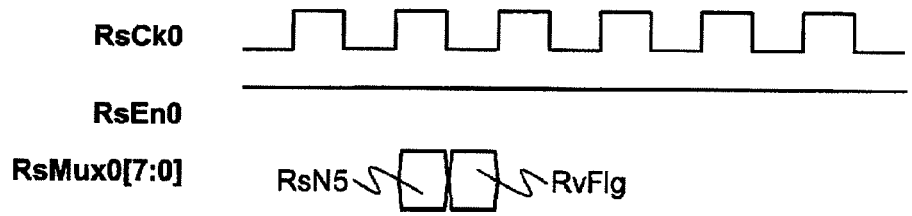

FIG. 28(d) shows a reservation completion response notifying that a reservation of queues of the memory chip M0 has been completed.

When the response enable signal RsEN0 is High, the reservation completion response having a response number RsN5 and the reservation completion signal RvFlg multiplexed therein is input to the information processing device CPU_CHIP in synchronization with the rise and fall of the response clock signal RsCk0, although not particularly limited thereto. Upon receiving the reservation completion response, the information processing device CPU_CHIP can confirm that a reservation of queues has been completed.

Figure 29A:
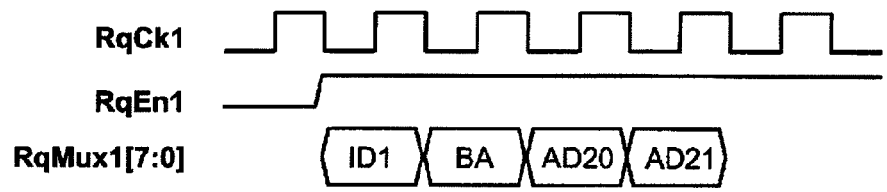
FIG. 29 is a diagram showing one example of an operation waveform of the information processing system of the present invention.

FIG. 29(a) shows an example of a bank activation request including the bank activation instruction BA input from the information processing device CPU_CHIP to the memory chip M1 via the memory chip M0. When the request enable signal RqEN1 is High, the bank activation request has the ID1, the bank activation instruction BA, the addresses AD20 and AD21 of the memory chip M0 multiplexed therein and is input to the memory chip M1 in synchronization with the request clock signal RqCk0, although not particularly limited thereto. The addresses AD20 and AD21 include the bank address and the page address. The bank activation request causes one of the memory banks in the memory chip M1 to be activated.

Figure 29B:
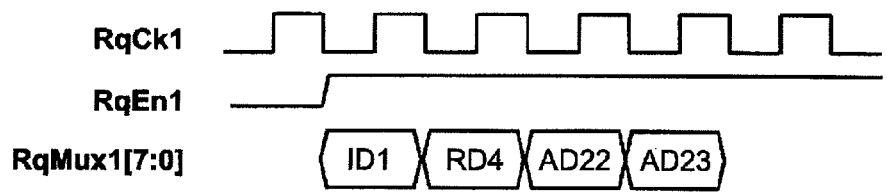

FIG. 29(b) shows an example of a read request including the 4-Byte data read instruction RD4 input from the information processing device CPU_CHIP to the memory chip M1 via the memory chip M0. When the request enable signal RqEN1 is High, the read request has the ID1, the read instruction RD4, the addresses AD22 and AD22 of the memory chip M0 multiplexed therein and is input to the memory chip M1 in synchronization with the request clock signal RqCk1, although not particularly limited thereto. The addresses AD22 and AD23 include the bank address and the column address. The read request causes data to be read from the activated memory bank in the memory chip M1.

Figure 29C:
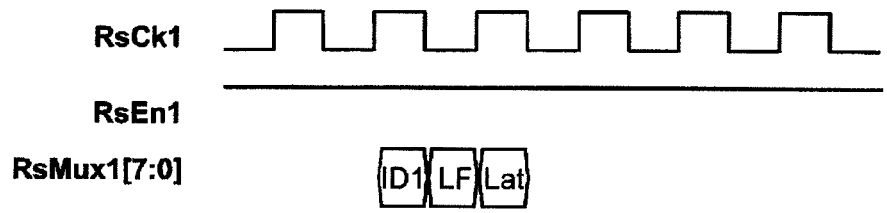

FIG. 29(c) shows an example of a latency response that transmits the latency value of the response from the memory chip M1. The latency response include the ID value ID1, the latency transmission flag LF, and the latency value Lat of the memory chip M1, although not particularly limited thereto.

When the response enable signal RsEN1 is High, the latency response is transmitted to the memory chip M0, and further transmitted to the information processing device CPU_CHIP in synchronization with the rise and fall of the response clock signal RsCk1.

Figure 29D:
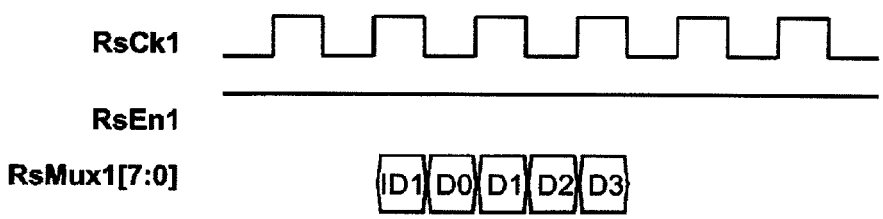

FIG. 29(d) shows a read response including the ID value of the memory chip M1 and data read from the memory chip M1. When the response enable signal RsEN1 is High, the read response has the ID value ID1 and the 4-Byte data D0, D1, D2, and D3 of the memory chip M1 multiplexed therein and is transmitted to the memory chip M0, and further transmitted to the information processing device CPU_CHIP in synchronization with the rise and fall of the response clock signal RsCk1, although not particularly limited thereto.

Figure 30A:
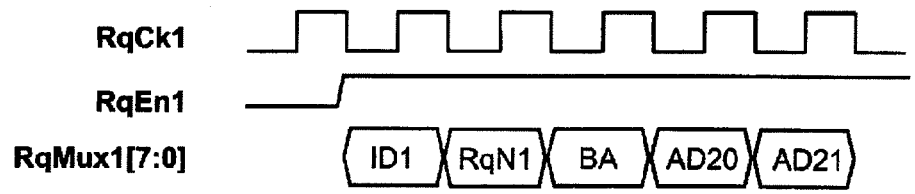
FIG. 30 is a diagram showing one example of an operation waveform of the information processing system of the present invention.

FIG. 30(a) shows another example of a bank activation request including the bank activation instruction BA input from the information processing device CPU_CHIP to the memory chip M1 via the memory chip M0. When the response enable signal RsEN1 is High, the bank activation request has the ID value ID1, the request number RqN1, the bank activation instruction BA, and the addresses AD20 and AD21 of the memory chip M1 multiplexed therein and is input to the memory chip M1 in synchronization with the request clock signal RqCk1, although not particularly limited thereto. The addresses AD20 and AD21 include the bank address and the row address. The bank activation request causes one of the memory banks in the memory chip M1 to be activated.

Figure 30B:
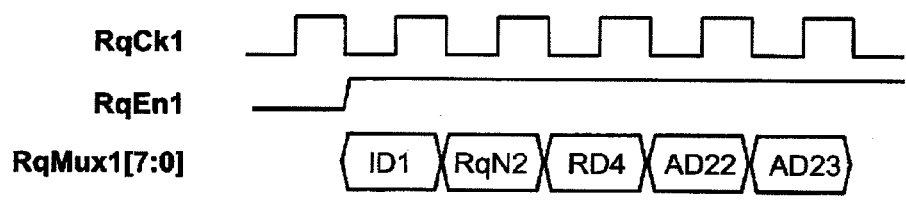

FIG. 30(b) shows another example of a read request including the 4-Byte data read instruction RD4 input from the information processing device CPU_CHIP to the memory chip M1 via the memory chip M0. When the request enable signal RqEN1 is High, the read request has the ID1, the request number RqN2, the read instruction RD4, the addresses AD22 and AD22 of the memory chip M1 multiplexed therein and is input to the memory chip M1 in synchronization with the request clock signal RqCk0, although not particularly limited thereto. The addresses AD22 and AD23 include the bank address and the column address. The read request causes data to be read from the activated memory bank in the memory chip M1.

Figure 30C:
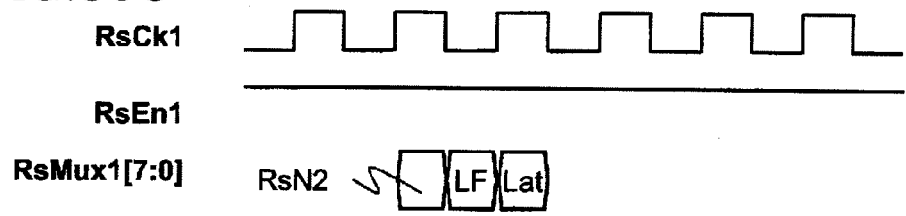

FIG. 30(c) shows another example of a latency response that transmits the latency value of the response from the memory chip M1. The latency response include the request number RqN2, the latency transmission flag LF, and the latency value Lat, although not particularly limited thereto.

When the response enable signal RsEN1 is High, the latency response is transmitted to the memory chip M0, and further transmitted to the information processing device CPU_CHIP in synchronization with the rise and fall of the response clock signal RsCk1.

Figure 30D:
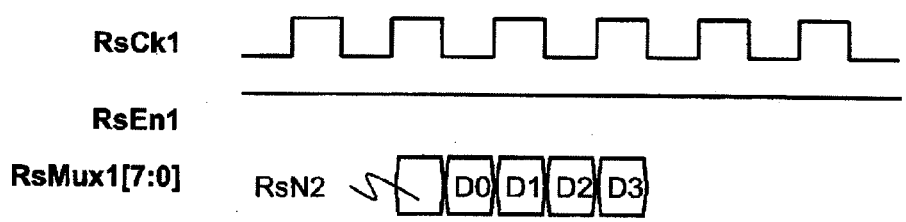

FIG. 30(d) shows another example of a read response including the data read from the memory chip M1. When the response enable signal RsEN1 is High, the read response has the request number RqN2 and the 4-Byte data D0, D1, D2, and D3 multiplexed therein and is transmitted to the memory chip M0, and further transmitted to the information processing device CPU_CHIP in synchronization with the rise and fall of the response clock signal RsCk1, although not particularly limited thereto.

Figure 31A:
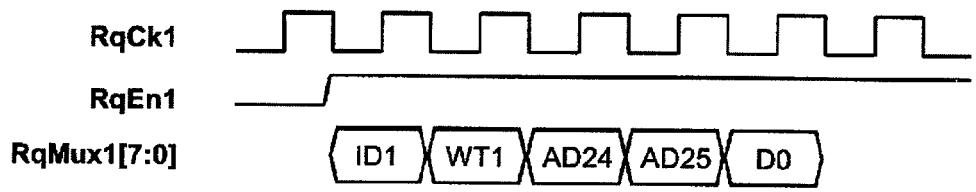
FIG. 31 is a diagram showing one example of an operation waveform of the information processing system of the present invention.

FIG. 31(a) is an example of a write request including a write instruction WT2 of 1-Byte data input from the information processing device CPU_CHIP to the memory chip M1 via the memory chip M0. When the request enable signal RqEN1 is High, the write request has the ID1, the write instruction WT1, and the addresses AD24 and AD25 of the memory chip M0 multiplexed therein and is input to the memory chip M1 in synchronization with the request clock signal RqCk1, although not particularly limited thereto. The addresses AD22 and AD23 include the bank address and the column address. The write request causes data to be written into the memory chip M1.

Figure 31B:
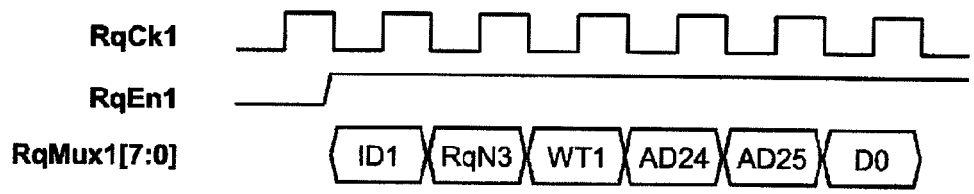

FIG. 31(b) is another example of a write request including the write instruction WT2 of 1-Byte data input from the information processing device CPU_CHIP to the memory chip M1 via the memory chip M0. When the request enable signal RqEN1 is High, the write request has the ID1, the request number RqN3, the write instruction WT1, and the addresses AD24 and AD25 of the memory chip M1 multiplexed therein and is input to the memory chip M1 in synchronization with the request clock signal RqCk1, although not particularly limited thereto. The addresses AD22 and AD23 include the bank address and the column address. The write request causes data to be written into the memory chip M1.

Figure 32A:
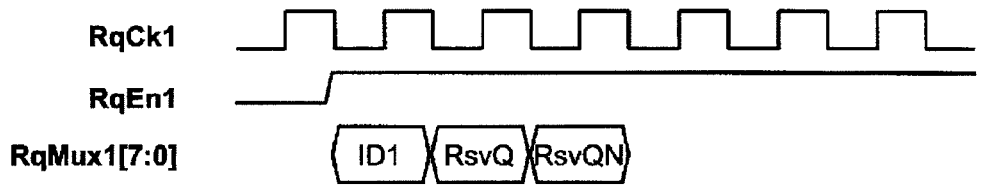
FIG. 32 is a diagram showing one example of an operation waveform of the information processing system of the present invention.

FIG. 32(a) is an example of a queue reservation request ReqNQRv for reserving request queues and response queues input from the information processing device CPU_CHIP to the memory chip M1 via the memory chip M0.

When the request enable signal RqEN1 is High, the queue reservation request ReqNQRv having the ID value ID1, the queue reservation instruction QRv, and the number of queues to be reserved QRvN multiplexed therein is transferred to the memory chip M0 in synchronization with the request clock signal RqCk1, although not particularly limited thereto. The request causes as many request queues and response queues of the memory chip M1 as the number specified by QRvN to be reserved, respectively.

Figure 32B:
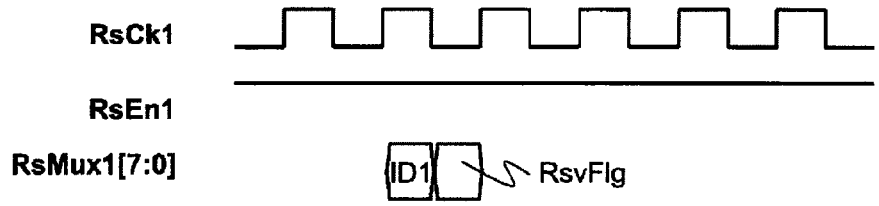

FIG. 32(b) shows a reservation completion response notifying that a reservation of queues of the memory chip M1 has been completed. When the response enable signal RsEN1 is High, the reservation completion response having the ID value ID1 and the reservation completion signal RvFlg multiplexed therein is transmitted to the memory chip M0, and further transmitted to the information processing device CPU_CHIP in synchronization with the rise and fall of the response clock signal RsCk1, although not particularly limited thereto. Upon receiving the reservation completion response, the information processing device CPU_CHIP can confirm that a reservation of queues has been completed.

Figure 32C:
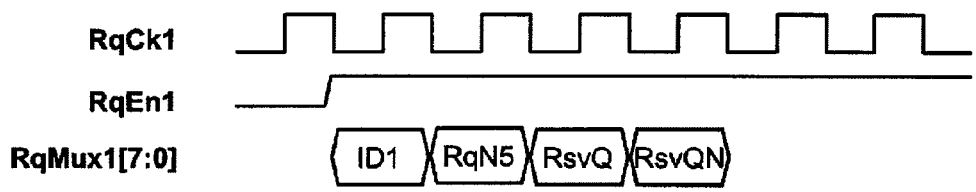

FIG. 32(c) is another example of the queue reservation request ReqNQRv for reserving request queues and response queues input from the information processing device CPU_CHIP to the memory chip M1 via the memory chip M0.

When the request enable signal RqEN1 is High, the queue reservation request ReqNQRv having the ID value ID1, the request number RqN5, the queue reservation instruction QRv, and the number of queues to be reserved QRvN multiplexed therein is transferred to the memory chip M1 in synchronization with the request clock signal RqCk1, although not particularly limited thereto. The request causes as many request queues and response queues of the memory chip M1 as the number specified by QRvN to be reserved, respectively.

Figure 32D:
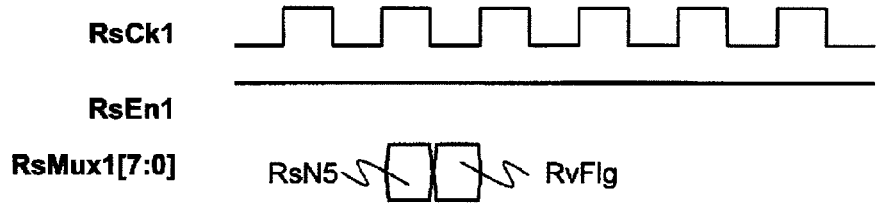

FIG. 32(d) shows a reservation completion response notifying that a reservation of queues of the memory chip M1 has been completed.

When the response enable signal RsEN1 is High, the reservation completion response having a response number RsN5 and the reservation completion signal RvFlg multiplexed therein is transmitted to the memory chip M0, and further transmitted to the information processing device CPU_CHIP in synchronization with the rise and fall of the response clock signal RsCk1, although not particularly limited thereto. Upon receiving the reservation completion response, the information processing device CPU_CHIP can confirm that a reservation of queues has been completed.

Figure 33A:
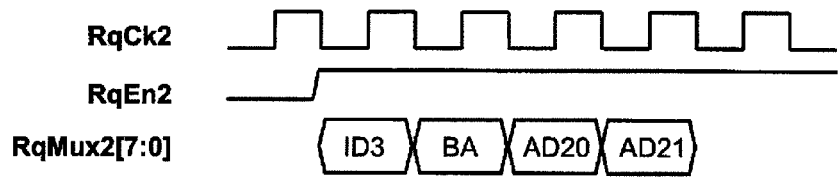
FIG. 33 is a diagram showing one example of an operation waveform of the information processing system of the present invention.

FIG. 33(a) shows an example of a bank activation request including the bank activation instruction BA input from the information processing device CPU_CHIP to the memory chip M2 via the memory chips M0 and M1. When the request enable signal RqEN2 is High, the bank activation request has the ID3, the bank activation instruction BA, the addresses AD20 and AD21 of the memory chip M2 multiplexed therein and is input to the memory chip M1 in synchronization with the request clock signal RqCk2, although not particularly limited thereto. The addresses AD20 and AD21 include the bank address and the page address. The bank activation request causes one of the memory banks in a memory chip M3 to be activated.

Figure 33B:
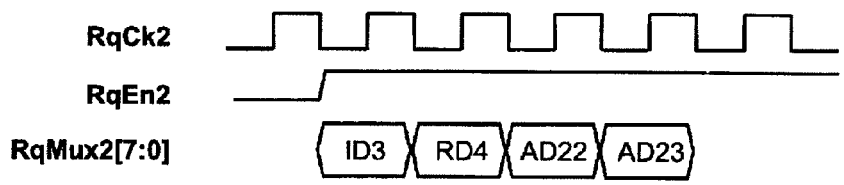

FIG. 33(b) shows an example of a read request including the 4-Byte data read instruction RD4 input from the information processing device CPU_CHIP to the memory chip M2 via the memory chips M0 and M1. When the request enable signal RqEN2 is High, the read request has the ID3, the read instruction RD4, the addresses AD22 and AD22 of the memory chip M2 multiplexed therein and is input to the memory chip M2 in synchronization with the request clock signal RqCk2, although not particularly limited thereto. The addresses AD22 and AD23 include the bank address and the column address. The read request causes data to be read from the activated memory bank in the memory chip M3.

Figure 33C:
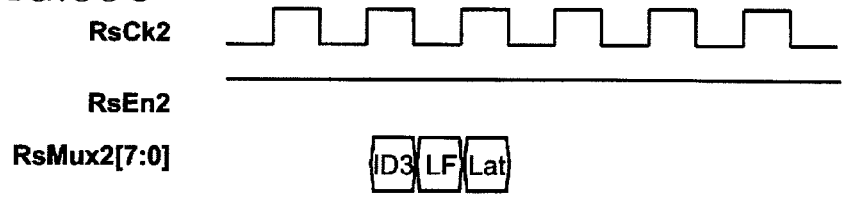

FIG. 33(c) shows an example of a latency response that transmits the latency value of the response from the memory chip M2. The latency response include the ID value ID3, the latency transmission flag LF, and the latency value Lat of the memory chip M2, although not particularly limited thereto.

When the response enable signal RsEN2 is High, the latency response is transmitted to the memory chip M1, and further transmitted to the information processing device CPU_CHIP via the memory chip M0 in synchronization with the rise and fall of the response clock signal RsCk2.

Figure 33D:
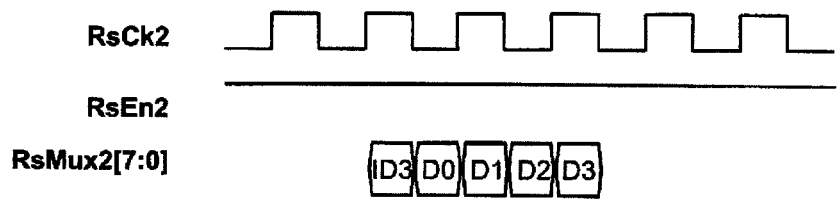

FIG. 33(d) shows a read response including the ID value of the memory chip M2 and data read from the memory chip M2. When the response enable signal RsEN2 is High, the read response has the ID value ID3 and the 4-Byte data D0, D1, D2, and D3 of the memory chip M2 multiplexed therein and is transmitted to the memory chip M1, and further transmitted to the information processing device CPU_CHIP via the memory chip M0 in synchronization with the rise and fall of the response clock signal RsCk2, although not particularly limited thereto.

Figure 34A:
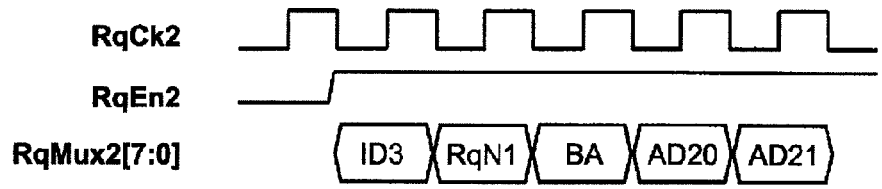
FIG. 34 is a diagram showing one example of an operation waveform of the information processing system of the present invention.

FIG. 34(a) shows another example of a bank activation request including the bank activation instruction BA input from the information processing device CPU_CHIP to the memory chip M2 via the memory chips M0 and M1. When the response enable signal RsEN2 is High, the bank activation request has the ID value ID1, the request number RqN1, the bank activation instruction BA, and the addresses AD20 and AD21 of the memory chip M2 multiplexed therein and is input to the memory chip M2 in synchronization with the request clock signal RqCk2, although not particularly limited thereto. The addresses AD20 and AD21 include the bank address and the row address. The bank activation request causes one of the memory banks in the memory chip M2 to be activated.

Figure 34B:
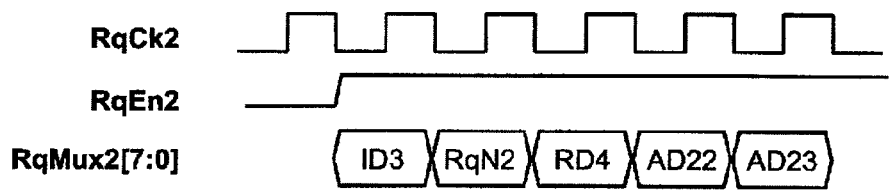

FIG. 34(b) shows another example of a read request including the 4-Byte data read instruction RD4 input from the information processing device CPU_CHIP to the memory chip M2 via the memory chips M0 and M1. When the request enable signal RqEN2 is High, the read request has the ID3, the request number RqN2, the read instruction RD4, the addresses AD22 and AD22 of the memory chip M2 multiplexed therein and is input to the memory chip M2 in synchronization with the request clock signal RqCk2, although not particularly limited thereto. The addresses AD22 and AD23 include the bank address and the column address. The read request causes data to be read from the activated memory bank in the memory chip M2.

Figure 34C:
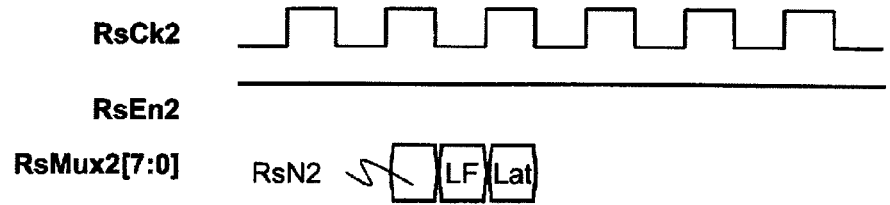

FIG. 34(c) shows another example of a latency response that transmits the latency value of the response from the memory chip M2. The latency response include the request number RqN2, the latency transmission flag LF, and the latency value Lat, although not particularly limited thereto.

When the response enable signal RsEN1 is High, the latency response is transmitted to the memory chip M1, and further transmitted to the information processing device CPU_CHIP in synchronization with the rise and fall of the response clock signal RsCk2 via the memory chip M0.

Figure 34D:
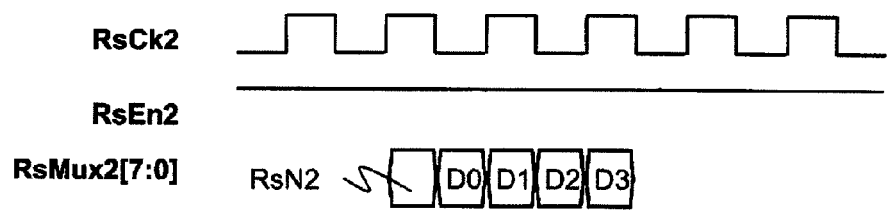

FIG. 34(d) shows another example of a read response including the data read from the memory chip M2. When the response enable signal RsEN2 is High, the read response has the request number RqN2 and the 4-Byte data D0, D1, D2, and D3 multiplexed therein and is transmitted to the memory chip M1, and further transmitted to the information processing device CPU_CHIP via the memory chip M0 in synchronization with the rise and fall of the response clock signal RsCk2, although not particularly limited thereto.

Figure 35A:
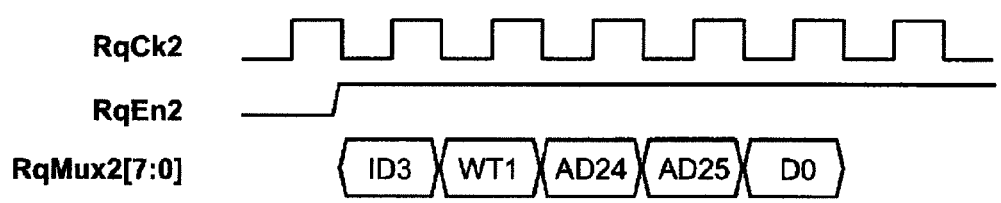
FIG. 35 is a diagram showing one example of an operation waveform of the information processing system of the present invention.

FIG. 35(a) is an example of a write request including a write instruction WT2 of 1-Byte data input from the information processing device CPU_CHIP to the memory chip M2 via the memory chips M0 and M1. When the request enable signal RqEN2 is High, the write request has the ID3, the write instruction WT1, and the addresses AD24 and AD25 of the memory chip M1 multiplexed therein and is input to the memory chip M1 in synchronization with the request clock signal RqCk2, although not particularly limited thereto. The addresses AD22 and AD23 include the bank address and the column address. The write request causes data to be written into the memory chip M2.

Figure 35B:
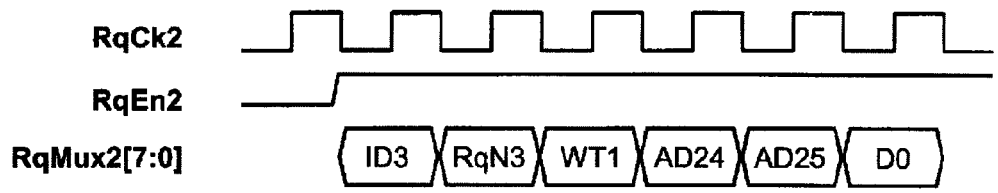

FIG. 35(b) is another example of a write request including the write instruction WT2 of 1-Byte data input from the information processing device CPU_CHIP to the memory chip M2 via the memory chips M0 and M1. When the request enable signal RqEN2 is High, the write request has the ID3, the request number RqN3, the write instruction WT1, and the addresses AD24 and AD25 of the memory chip M2 multiplexed therein and is input to the memory chip M1 in synchronization with the request clock signal RqCk2, although not particularly limited thereto. The addresses AD22 and AD23 include the bank address and the column address. The write request causes data to be written into the memory chip M2.

Figure 36A:
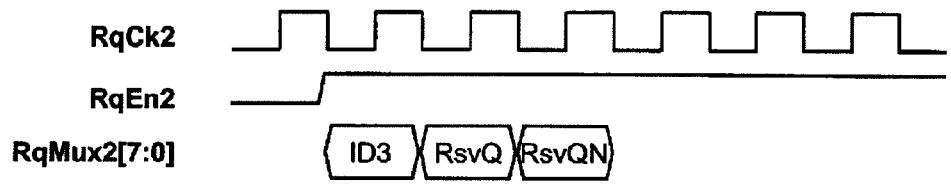
FIG. 36 is a diagram showing one example of an operation waveform of the information processing system of the present invention.

FIG. 36(a) is an example of the queue reservation request ReqNQRv for reserving request queues and response queues input from the information processing device CPU_CHIP to the memory chip M2 via the memory chips M0 and M1.

When the request enable signal RqEN2 is High, the queue reservation request ReqNQRv having the ID value ID3, the queue reservation instruction QRv, and the number of queues to be reserved QRvN multiplexed therein is transferred to the memory chip M0 in synchronization with the request clock signal RqCk2, although not particularly limited thereto. The request causes as many request queues and response queues of the memory chip M2 as the number specified by QRvN to be reserved, respectively.

Figure 36B:
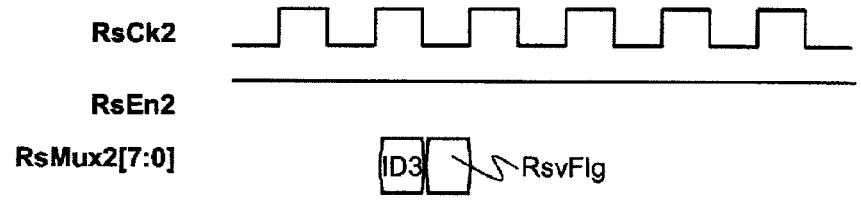

FIG. 36(b) shows a reservation completion response notifying that a reservation of queues of the memory chip M2 has been completed. When the response enable signal RsEN2 is High, the reservation completion response having the ID value ID3 and the reservation completion signal RvFlg multiplexed therein is transmitted to the memory chip M1, and further transmitted to the information processing device CPU_CHIP via the memory chip M0 in synchronization with the rise and fall of the response clock signal RsCk1, although not particularly limited thereto. Upon receiving the reservation completion response, the information processing device CPU_CHIP can confirm that a reservation of queues has been completed.

Figure 36C:
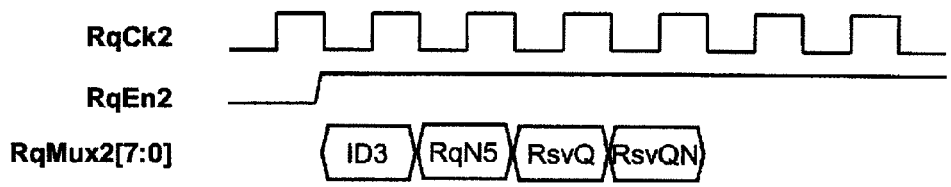

FIG. 36(c) is another example of the queue reservation request ReqNQRv for reserving request queues and response queues input from the information processing device CPU_CHIP to the memory chip M2 via the memory chips M0 and M1.

When the request enable signal RqEN2 is High, the queue reservation request ReqNQRv having the ID value ID3, the request number RqN5, the queue reservation instruction QRv, and the number of queues to be reserved QRvN multiplexed therein is transferred to the memory chip M2 in synchronization with the request clock signal RqCk1, although not particularly limited thereto. The request causes as many request queues and response queues of the memory chip M2 as the number specified by QRvN to be reserved, respectively.

Figure 36D:
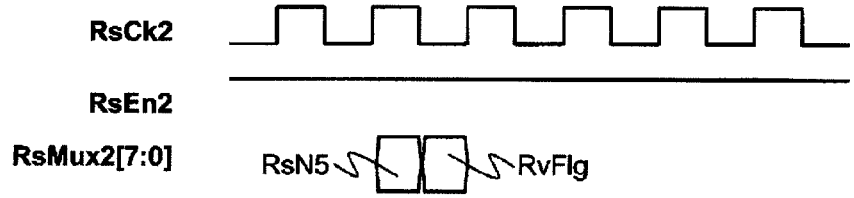

FIG. 36(d) shows a reservation completion response notifying that a reservation of queues of the memory chip M2 has been completed.

When the response enable signal RsEN2 is High, the reservation completion response having a response number RsN5 and the reservation completion signal RvFlg multiplexed therein is transmitted to the memory chip M2, and further transmitted to the information processing device CPU_CHIP via the memory chip M0 in synchronization with the rise and fall of the response clock signal RsCk2, although not particularly limited thereto. Upon receiving the reservation completion response, the information processing device CPU_CHIP can confirm that a reservation of queues has been completed.

Although operations of requests including information such as bank activation instructions, read instructions, write instructions, queue reservation instructions, and responses including information such as the read data and latency values have been described, it is needless to say that similar operations can be performed with regard to requests and responses including information other than that described above.

Figure 37:
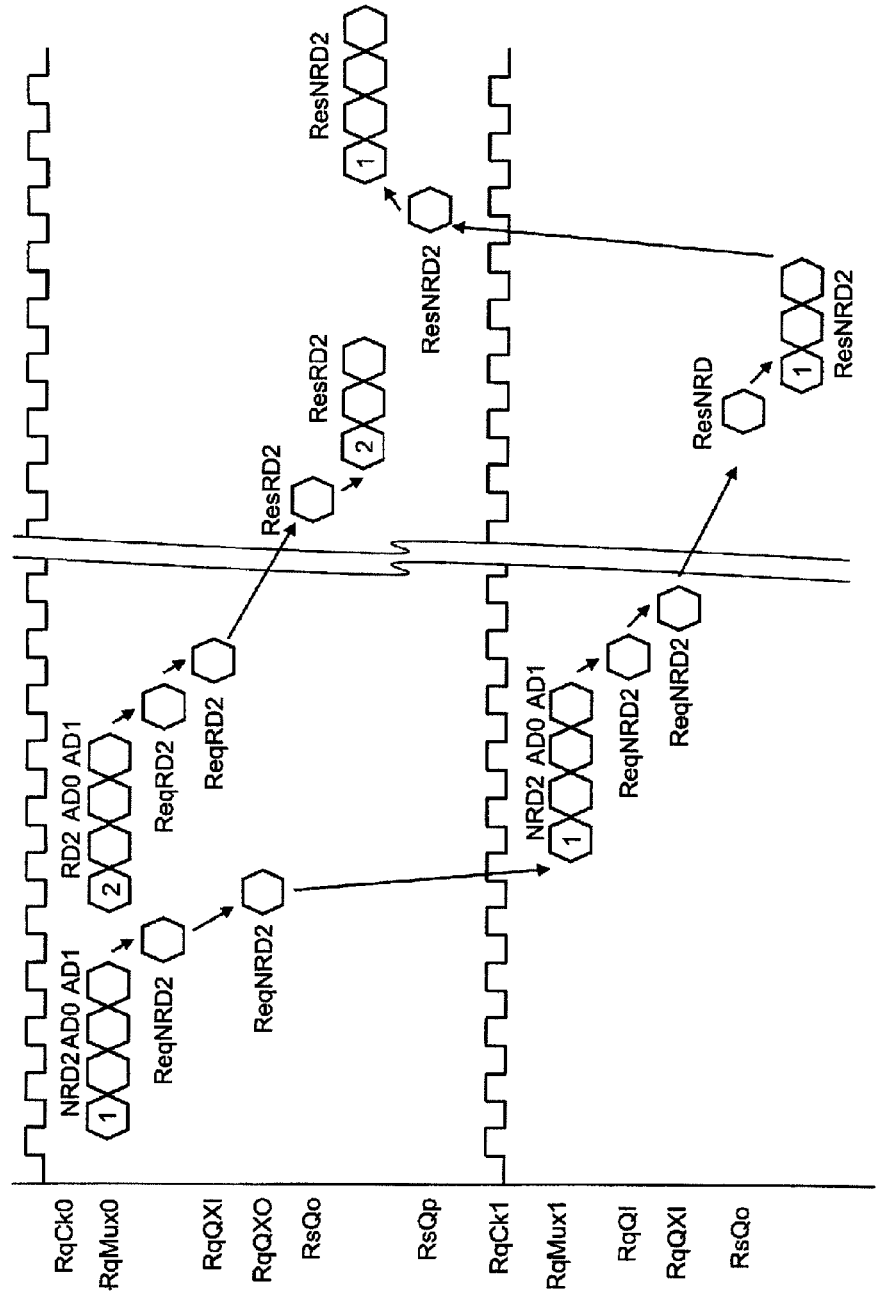
FIG. 37 is a diagram showing one example of an operation waveform of the information processing system of the present invention.

FIG. 37 shows a data transfer waveform when a read request from the information processing device CPU_CHIP to the memory chip M1 is generated and subsequently a read request to the memory chip M0 is generated.

The information processing device CPU_CHIP transfers a request ReqNRD2 having the ID value 1, a 2-Byte data read instruction NRD2 and addresses AD0 and AD1 multiplexed therein to the memory chip M0 through the request signal RqMux0.

Subsequently, the information processing device CPU_CHIP transfers a request ReqRD2 having the ID value 2, a 2-Byte data read instruction RD2, and the addresses AD0 and AD1 multiplexed therein to the memory chip M0, through the request signal RqMux0.

The requests ReqNRD2 and ReqRD2 are input to the request queue RqQI of the memory chip M0.

Because it is a request to the memory chip M1, the request ReqNRD2 is transferred to a request queue RqQX0 of the memory chip M0. The request ReqNRD2 is transferred to the memory chip M1 through the request signal RqMux1.

The request ReqNRD2 is input to the request queue RqQI of the memory chip M1, and subsequently transferred to the request queue RqQXI. A data corresponding to the request ReqNRD2 is read from the memory circuit MemNV1 of the memory chip M1 and input, together with the ID register value 1, to the response queue RsQo as a response RsNRD2.

The response RsNRD2 that has been input to the response queue RsQo is transferred through the response signal RqMux1 and stored in the response queue RsQp of the memory chip M0. The response RsNRD2 stored in the response queue RsQp is output, together with the ID value 1, as the read data through a response signal ResMux0.

Because it is a request to the memory chip M0, the request ReqRD2 is transferred to the request queue RqQXI of the memory chip M0.

A data corresponding to the request ReqRD2 is read from the memory circuit MemVL of the memory chip M0 and input, together with the ID register value 2, to the response queue RsQo as a response RsRD2.

The response RsRD2 input to the response queue RsQo is output, together with the ID value 2, as the read data through the response signal RqMux0.

The time required for inputting the request ReqRD2 to the request queue RqQI of the memory chip M0 and outputting the response ResRD2 corresponding to the request from the response signal ResMux0 is about 15 nanoseconds.

The time required for inputting the request ReqNRD2 to the request queue RqQI of the memory chip M1 and outputting the response ResRD2 corresponding to the request from the response signal ResMux0 is about 70 nanoseconds.

Therefore, the request ReqRD2 can be output prior to the request ReqNRD2 although the former was input after the latter.

Although a data read operation has been mainly described in the present embodiment, it is needless to say that similar operations can be performed in the data writing.

Additionally, although the data transfer operation between the memory chips M0 and M1 has been described in the present embodiment, it is needless to say that similar data transfer operations can be performed between M1 and other memory chips.

<Effect of First Embodiment>

Configurations and effects thereof of the embodiment described above are summarized below.

(1) It can be confirmed that the memories are reliably connected with each other by performing a checking operation of serial connection immediately after power-on. Furthermore, only the necessary number of memory chips can be easily connected to expand memory capacity, by clearly indicating the boot device and the memory chip at the farthest end and automatically allocating an ID to each memory.

(2) Requests can be reliably transferred from the information processing device CPU_CHIP to each of the memory chips M0, M1, and M2 by providing IDs to the requests. Furthermore, it can be confirmed that data transfer from each memory has been successfully performed by providing IDs to the responses to the information processing device CPU_CHIP so that the information processing device CPU_CHIP can perform the desired processing while reducing the number of connection signals by serially connecting the information processing device CPU_CHIP and the memory chips M0, M1, and M2.

(3) By transmitting the latency value of the data before transmitting the data, the information processing device CPU_CHIP can recognize the arrival time of the data and perform required processed before arrival of the data, thereby improving the performance.

(4) By providing a request number to the request and a response number to the response, the information processing device CPU_CHIP can recognize which request a response transmitted to from the memory chip is directed to, even if responses are transmitted in an order different from the order of inputting the requests, whereby the information processing device CPU_CHIP can perform the desired processing at high speed.

(5) Because the request interface circuit ReIF and the response interface circuit can operate independently, data read and write operations can be performed simultaneously, thereby improving the performance of data transfer.

(6) Because a data that can be read earlier can be immediately read without waiting for a data that is read slower regardless of the order of inputting requests, processing speed can be increased.

(7) Because clocks of the memory chips M0, M1, and M2 can be operated more slowly, stopped or resumed, power consumption can be lowered.

(8) By detecting and correcting errors when reading from the memory chip M2, and performing a replacement process for a failed address into which writing failed, reliability can be maintained.

Although an example in which the memory module MEM includes a volatile memory, a NOR flash memory, and a NAND flash memory is described in the present embodiment, it is needles to say that the present invention can be achieved where the memory module MEM includes a plurality of volatile memories, NOR flash memories, and NAND flash memories.

(Second Embodiment)

Figure 38:
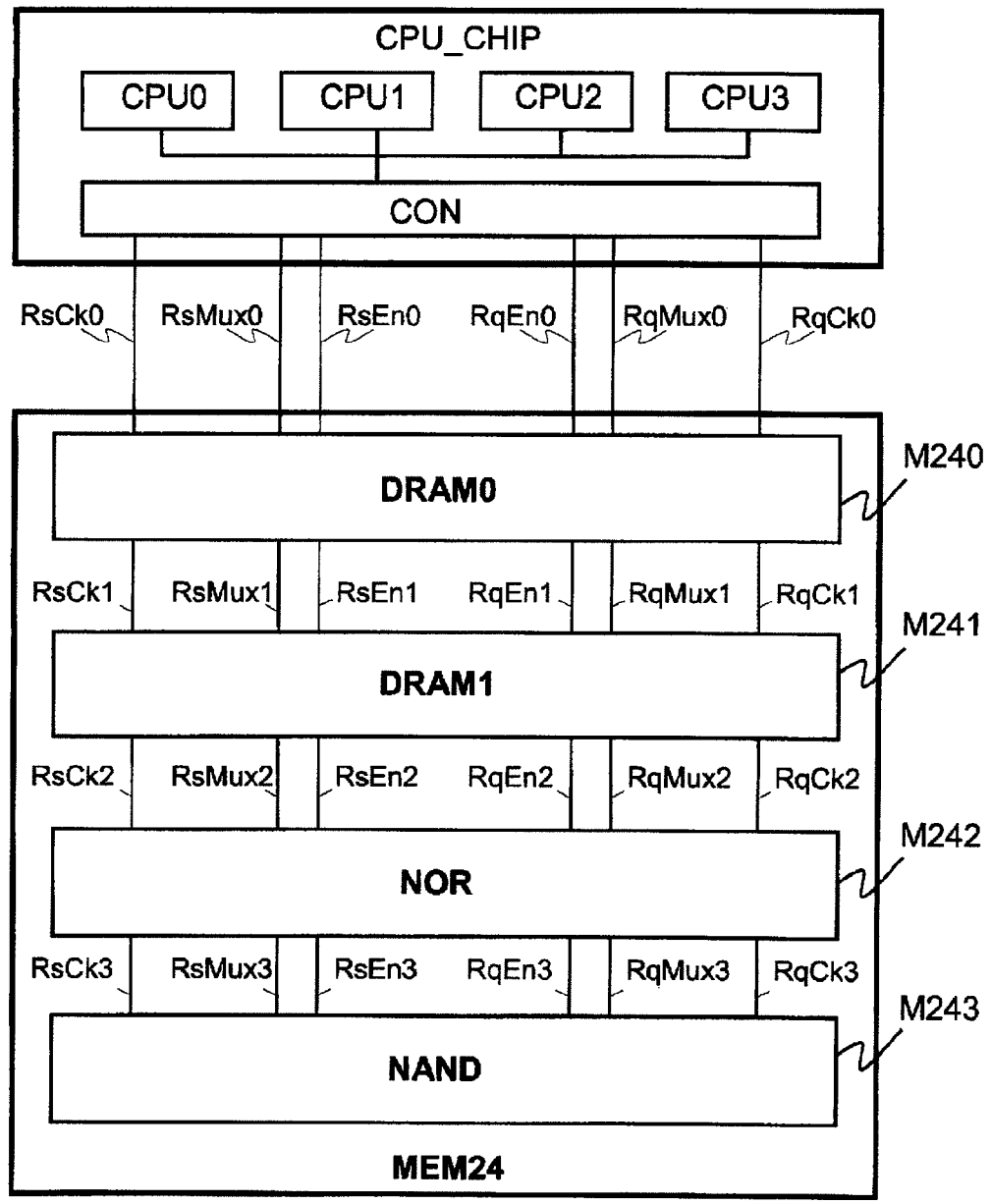
FIG. 38 is a configuration diagram of the information processing system of the present invention.

FIG. 38 shows a second embodiment of the present invention. In the second embodiment, an information processing system including the information processing device CPU_CHIP and a memory module MEM24 is described.

The memory module MEM24 includes dynamic random access memories DRAM0 and DRAM1, a NOR flash memory NOR, and a NAND flash memory NAND.

The information processing device CPU_CHIP is equivalent to that shown in FIG. 1. The dynamic random access memories DRAM0 and DRAM1 are equivalent to the memory shown in FIG. 10. The NOR flash memory NOR is equivalent to the memory shown in FIG. 18. The NAND flash memory NAND is equivalent to the memory shown in FIG. 21.

According to the present invention, a plurality of dynamic random access memories DRAMs can be connected easily so that work areas and copy areas required by the information processing device CPU_CHIP can be easily expanded to allow high speed processing.

Although a case of connecting a plurality of dynamic random access memories is described in the present embodiment, a plurality of NOR flash memories NOR and NAND flash memories NAND can be connected if necessary so that program areas and data areas can be easily expanded, flexibly adapting to the system configuration of portable devices.

(Third Embodiment)

Figure 39:
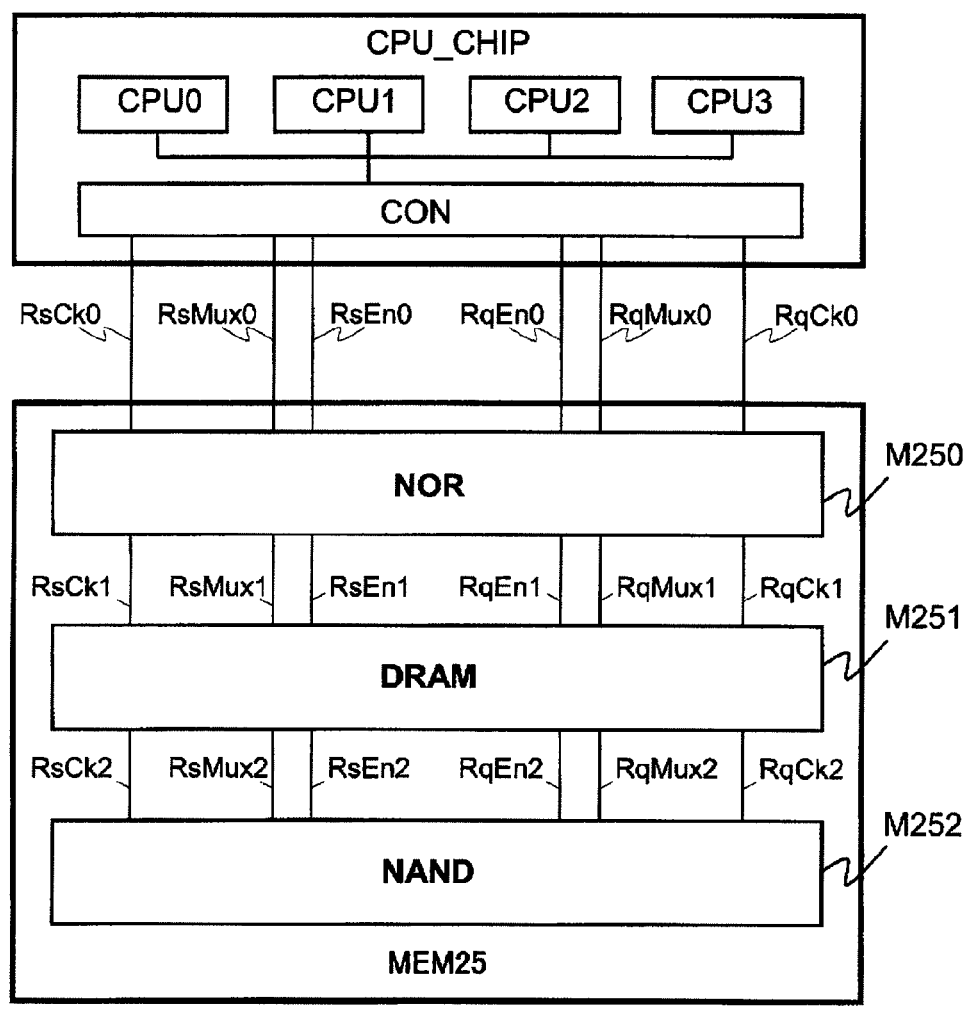
FIG. 39 is a configuration diagram of the information processing system of the present invention.

FIG. 39 shows a third embodiment of the present invention. The third embodiment describes an information processing system including the information processing device CPU_CHIP and a memory module MEM24. The information processing device CPU_CHIP is equivalent to that shown in FIG. 1. The NOR flash memory NOR is equivalent to the memory shown in FIG. 18. The dynamic random access memory DRAM is equivalent to the memory shown in FIG. 10. The NAND flash memory NAND is equivalent to the memory shown in FIG. 21.

A memory module MEM25 includes, in the order of closeness to the information processing device CPU_CHIP, the NOR flash memory NOR using NOR flash memory cells, the dynamic random access memory DRAM using dynamic memory cells, and the NAND flash memory NAND using NAND flash memory cells.

In a mobile phone, an intermittent access to the NOR flash memory NOR storing the OS and communication programs is dominant during the standby state for calls or e-mails. Therefore, in the present embodiment having the NOR flash memory NOR connected closest to the information processing device CPU_CHIP, it is possible to bring the dynamic random access memory DRAM into a self-refresh state, stop the request clocks (RqCk1 and RqCk0) and response clocks (RsCk1 and RsCk2) to the dynamic random access memory DRAM and the NAND flash memory NAND, and operate only the NOR flash memory NOR, whereby power consumption in the standby state for calls or e-mails can be reduced.

(Fourth Embodiment)

Figure 40:
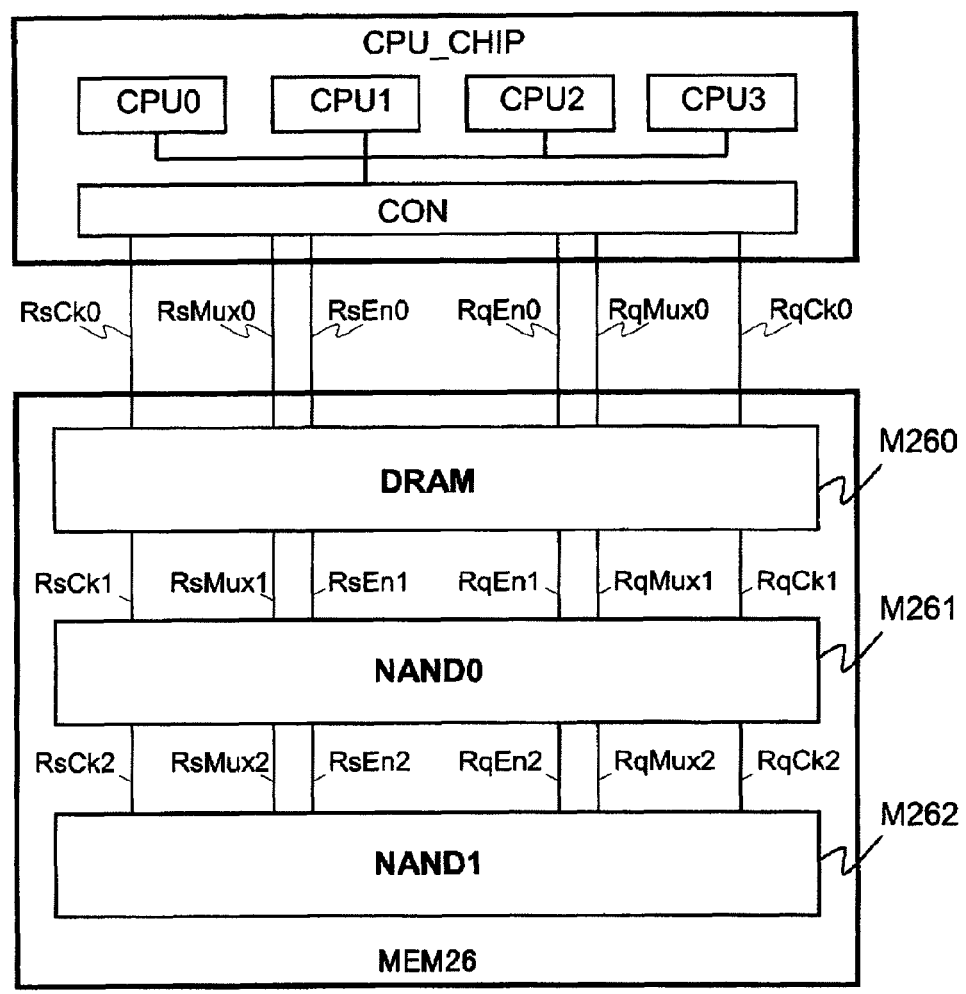
FIG. 40 is a configuration diagram of the information processing system of the present invention.

FIG. 40 shows an information processing system including the information processing device CPU_CHIP and a memory module MEM26. The memory module MEM26 includes the dynamic random access memory DRAM and NAND flash memories NAND0 and NAND1. The information processing device CPU_CHIP is equivalent to that shown in FIG. 1. The dynamic random access memory DRAM is equivalent to the memory shown in FIG. 10. The NAND flash memories NAND0 and NAMD1 are equivalent to the memory shown in FIG. 21. The NAND flash memories NAND0 and NAND1 are memories that can realize a larger capacity and lower cost than those of NOR flash memories. By using the NAND flash memory NAND0 instead of a NOR flash memory, the OS and application programs can be stored in the NAND flash memory NAND0 to realize a large-capacity and low-cost information processing system. Furthermore, performance of the information processing system can be improved by preliminarily transferring the OS and application programs stored in the NAND flash memory NAND0 to the dynamic random access memory DRAM.

(Fifth Embodiment)

Figure 41:
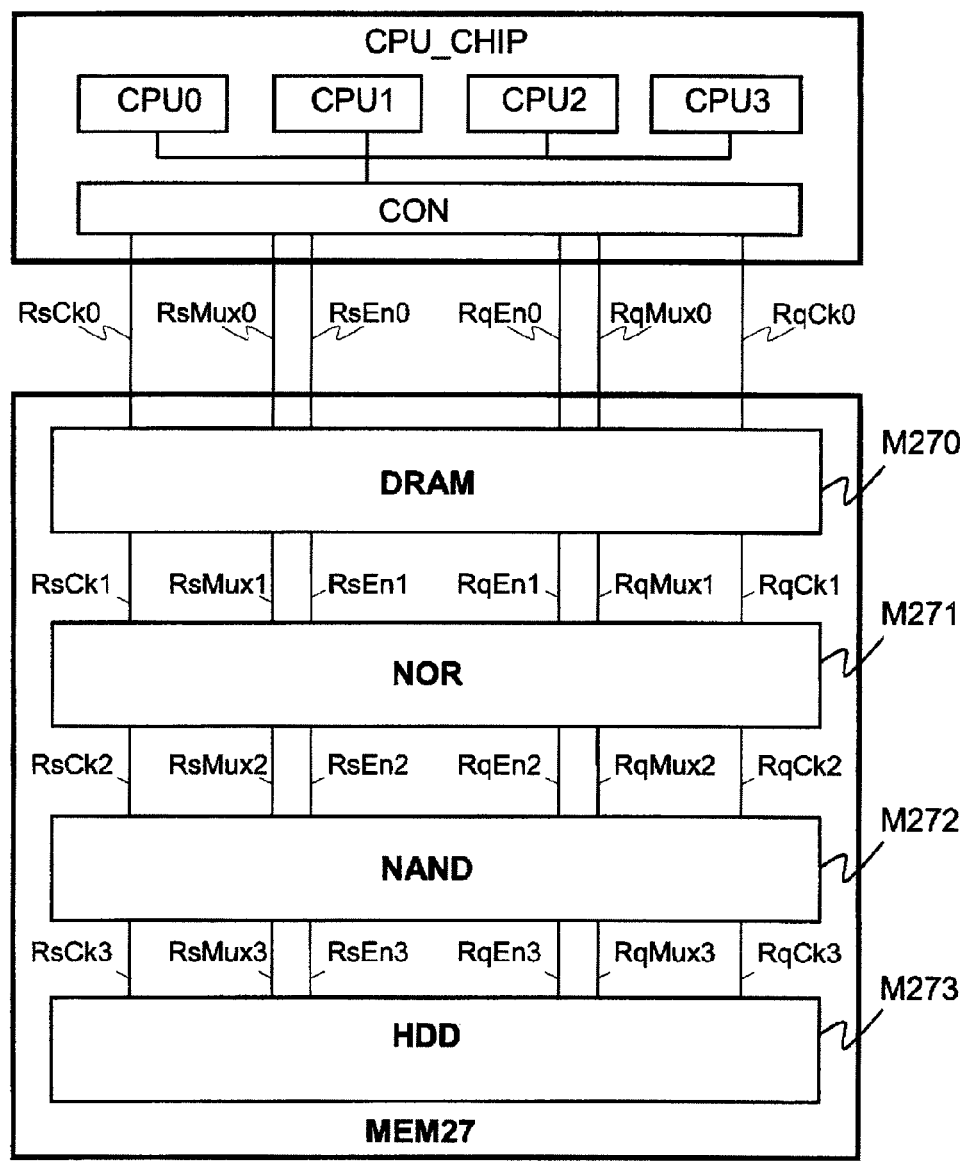
FIG. 41 is a configuration diagram of the information processing system of the present invention.

FIG. 41 shows an information processing system including the information processing device CPU_CHIP and a memory module MEM27. The memory module MEM27 includes the dynamic random access memory DRAM, the NOR flash memory NOR, the NAND flash memory NAND, and a hard disk HDD. The information processing device CPU_CHIP is equivalent to that shown in FIG. 1. The dynamic random access memory DRAM is equivalent to the memory shown in FIG. 10. The NOR flash memory NOR is equivalent to the memory shown in FIG. 18. The NAND flash memory NAND is equivalent to the memory shown in FIG. 21. The hard disk HDD is a memory that can realize a larger capacity and lower cost than those of the NAND flash memory NAND.

With regard to units of data read, address management method, error detection and correction method, those originally realized by the hard disk HDD are taken over by the flash memory, additional connection of the hard disk HDD can be easily performed to realize a large-capacity and lower-cost memory module.

(Sixth Embodiment)

Figure 42:
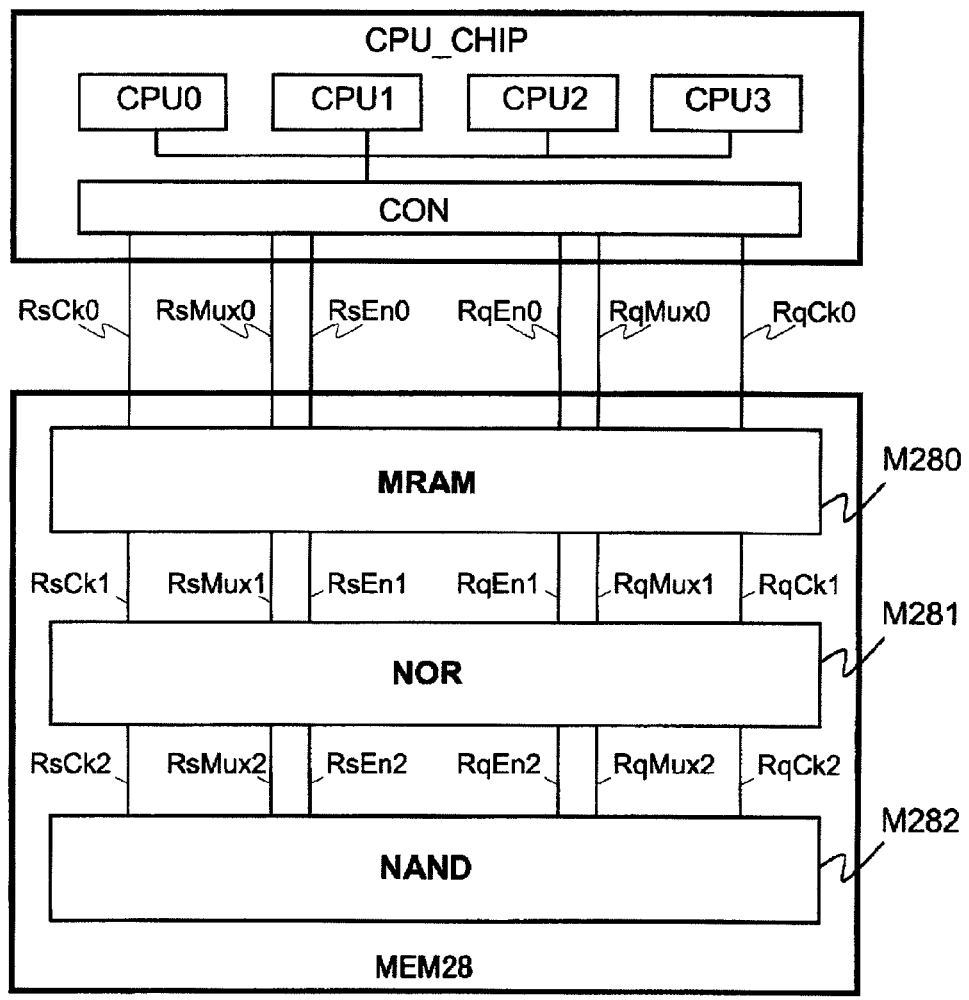
FIG. 42 is a configuration diagram of the information processing system of the present invention.

FIG. 42 shows an information processing system including the information processing device CPU_CHIP and a memory module MEM28. The memory module MEM28 includes a first nonvolatile memory MRAM, a second nonvolatile memory NOR, and a third nonvolatile memory NAND. The information processing device CPU_CHIP is equivalent to that shown in FIG. 1. The first nonvolatile memory MRAM is the magnetic random access memory MRAM in which the memory circuit MemVL shown in FIG. 10 includes nonvolatile magnetic memory cells. The second nonvolatile memory NOR is equivalent to the NOR flash memory shown in FIG. 18. The third nonvolatile memory NAND is equivalent to the NAND flash memory NAND shown in FIG. 21.

Using the volatile MRAM instead of the nonvolatile the dynamic random access memory DRAM eliminates the necessity of regularly performing a data retaining operation in the memory circuit, whereby power consumption can be lowered. In addition, the second nonvolatile memory M280 can be a phase-change memory in which the memory circuit NV1 shown in FIG. 12 includes nonvolatile phase-change memory cells.

(Seventh Embodiment)

Figure 43A:
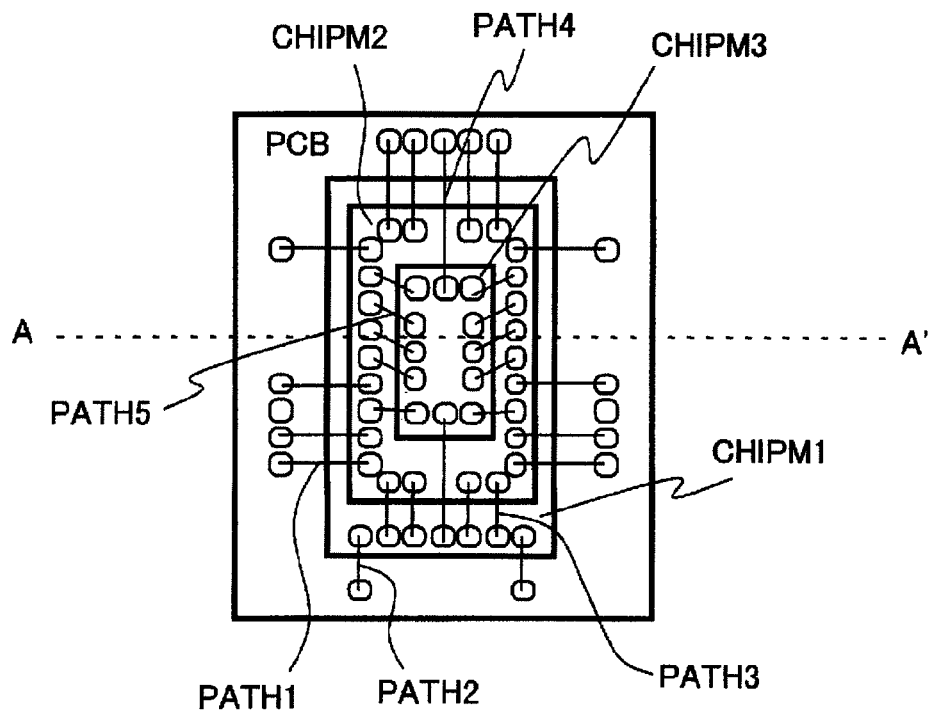
FIG. 43 is a diagram showing one example of a mount style of the information processing system of the present invention.
Figure 43B:
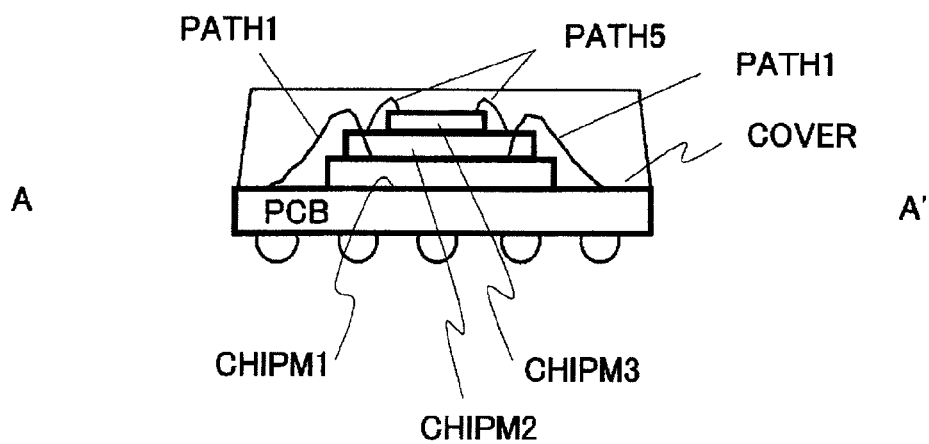

FIG. 43 shows a seventh embodiment of the present invention. FIG. 43(A) is a top view and FIG. 43(B) is a cross-sectional view of a part taken along a line A-A' shown in the top view.

The multi-chip module of the present embodiment has CHIPM1, CHIPM2, and CHIPM3 mounted on a base (for example, a printed circuit board made of a glass epoxy substrate) PCB implemented on the device by a ball grid array (BGA). CHIPM1 is the first nonvolatile memory, CHIPM2 is the second nonvolatile memory, and CHIPM3 is a first volatile memory, although not particularly limited thereto.

The multi-chip module can integrate the memory modules MEM shown in FIG. 1, the memory module MEM25 shown in FIG. 39, the memory module MEM26 shown in FIG. 40, and the memory module MEM28 shown in FIG. 42 into a single sealing body.

CHIPM1 and a bonding pat on the PCB are connected by a bonding wire (PATH2), CHIPM2 and the bonding pat on the PCB are connected by a bonding wire (PATH1). CHIPM3 and the bonding pat on the PCB are connected by a bonding wire (PATH4). CHIPM1 and CHIPM2 are connected by a bonding wire (PATH3), and CHIPM2 and CHIPM3 are connected by a bonding wire (PATH5).

The top surface of PCB having a chip mounted thereon is resin molded to protect respective chips and connection wirings. Additionally, a cover (COVER) made of metal, ceramic, or resin can be applied from above.

Because a bare chip is directly mounted on the printed circuit board PCB in the present embodiment, a memory module having a small incorporating area can be provided. Additionally, because the chips can be stacked, wiring length between the chips and PCB can be shortened, reducing the incorporating area. The memory modules can be produced with a fewer number of processes by unifying the method of wiring the chips and wiring between the chips and the base into bonding wiring.

Furthermore, memory modules can be produced with a fewer number of processes by wiring the chips directly by a bonding wire to reduce the number of bonding pats and bonding wires on the base. Using a resin cover can create more robust memory modules. Using a ceramic or metal cover can create memory modules having superior heat radiation and shielding effect as well as robustness.

(Eight Embodiment)

Figure 44A:
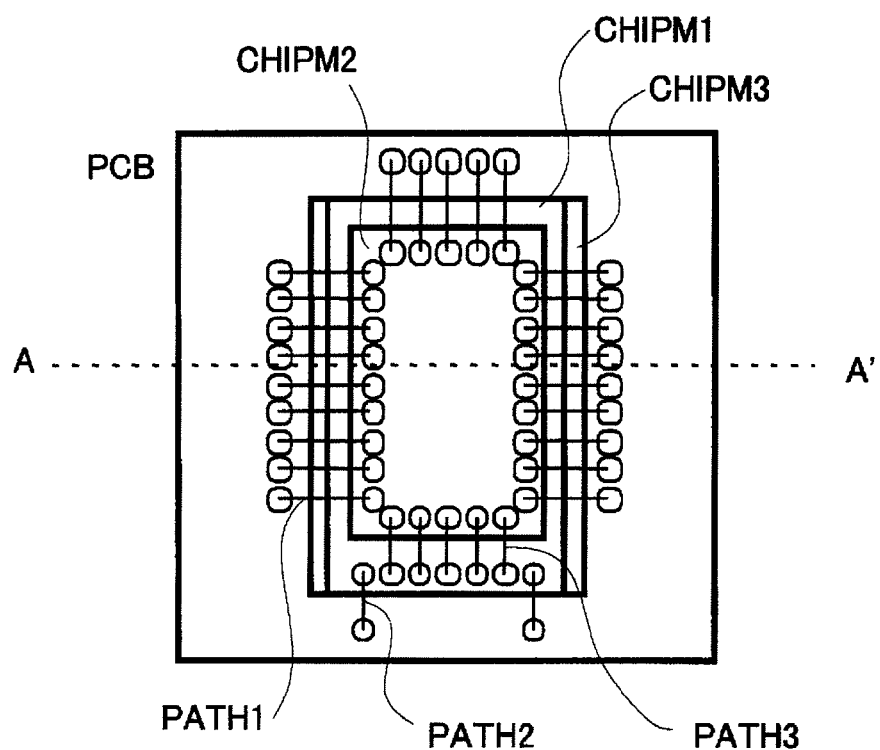
FIG. 44 is a diagram showing one example of a mount style of the information processing system of the present invention.
Figure 44B:
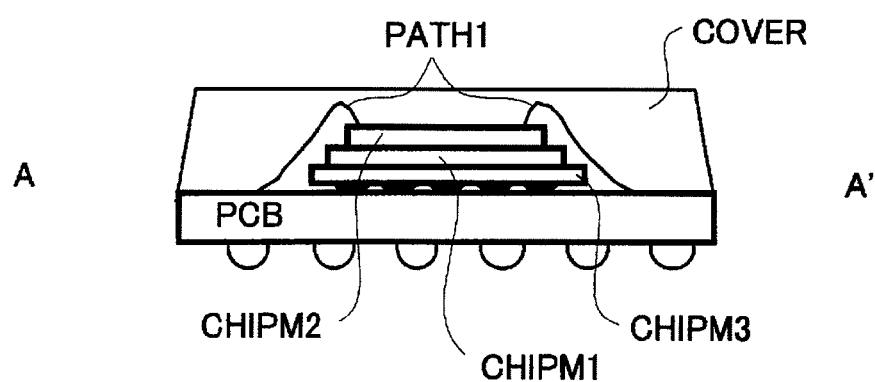

FIG. 44 shows an eighth embodiment of the present invention. FIG. 44(A) is a top view and FIG. 44(B) is a cross-sectional view of a part taken along the line A-A' shown in the top view.

The multi-chip module of the present embodiment has CHIPM1, CHIPM2, and CHIPM3 mounted on a base (for example, a printed circuit board made of a glass epoxy substrate) PCB implemented on the device by the ball grid array (BGA). CHIPM1 is the first nonvolatile memory, and CHIP2M is the second nonvolatile memory. CHIP3M is a random access memory. The multi-chip module can integrate the memory modules MEM shown in FIG. 1, the memory module MEM25 shown in FIG. 39, the memory module MEM26 shown in FIG. 40, and the memory module MEM28 shown in FIG. 42 into a single sealing body.

CHIPM1 and the bonding pat on the PCB are connected by the bonding wire (PATH2), and CHIPM2 and the bonding pat on the PCB are connected by bonding wire (PATH1). CHIPM1 and CHIPM2 are connected by the bonding wire (PATH3). In addition, the ball grid array is used for implementing and wiring CHIP3M.

The three chips can be stacked according to the present incorporating method to keep the incorporating area small. Furthermore, because the bonding between CHIPM3 and the base becomes unnecessary, reducing the number of bonding wirings, whereby assembly workload can be reduced and a highly reliable multi-chip module can be realized.

(Ninth Embodiment)

Figure 45A:
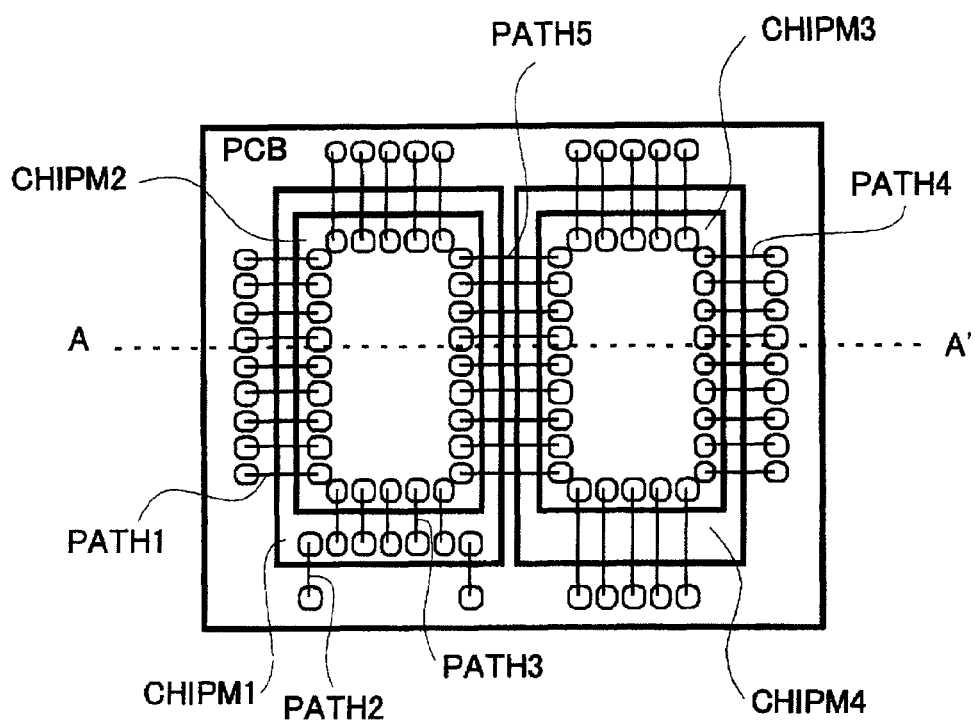
FIG. 45 is a diagram showing one example of a mount style of the information processing system of the present invention.
Figure 45B:
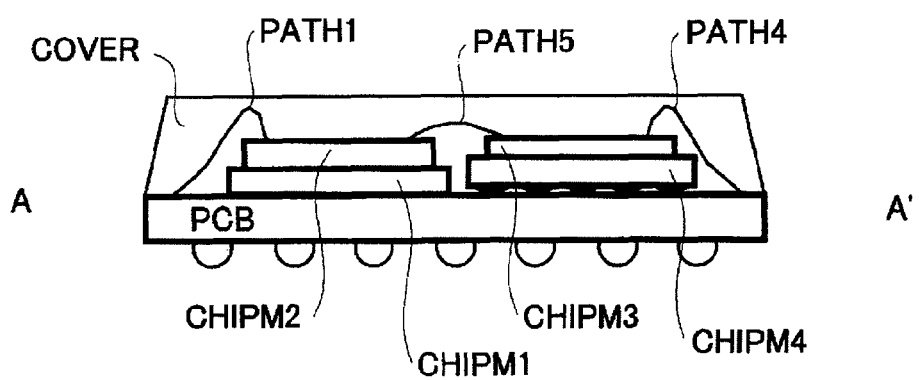

FIG. 45 shows a multi-chip module according to a ninth embodiment of the present invention. FIG. 45(A) is a top view and FIG. 45(B) is a cross-sectional view of a part taken along a line A-A' shown in the top view.

The memory module of the present embodiment has CHIPM1, CHIPM2, CHIPM3, and CHIPM4 mounted on a base (for example, a printed circuit board made of a glass epoxy substrate) PCB implemented on the device by the ball grid array (BGA). CHIPM1 and CHIPM2 are nonvolatile memories, and CHIPM3 is a random access memory.

CHIPM4 is the information processing device CPU_CHIP. According to the present incorporating method, the information processing systems shown in FIGS. 1, 39, 40, and 42 can be integrated into a single sealing body.

CHIPM1 and the bonding pat on the PCB are connected by the bonding wire (PATH2), CHIPM2 and the bonding pat on the PCB are connected by the bonding wire (PATH4), CHIPM3 and the bonding pat on the PCB are connected by the bonding wire (PATH1).

CHIPM1, and CHIPM3 are connected by the bonding wire (PATH3), and CHIPM2 and CHIPM3 are connected by the bonding wire (PATH5). The ball grid array (BGA) is used for implementing and wiring CHIPM4. Because a bare chip is directly mounted on the printed circuit board PCB in the present implementing method, a memory module having a small incorporating area can be provided. Additionally, because the chips can be placed close together, wiring length between the chips can be shortened.

The memory modules can be produced with a fewer number of processes by wiring the chips directly by a bonding wire to reduce the number of bonding pats and bonding wires on the base. Furthermore, the bonding between CHIPM4 and the base becomes unnecessary, reducing the number of bonding wirings, whereby assembly workload can be reduced and a highly reliable multi-chip module can be realized.

(Tenth Embodiment)

Figure 46A:
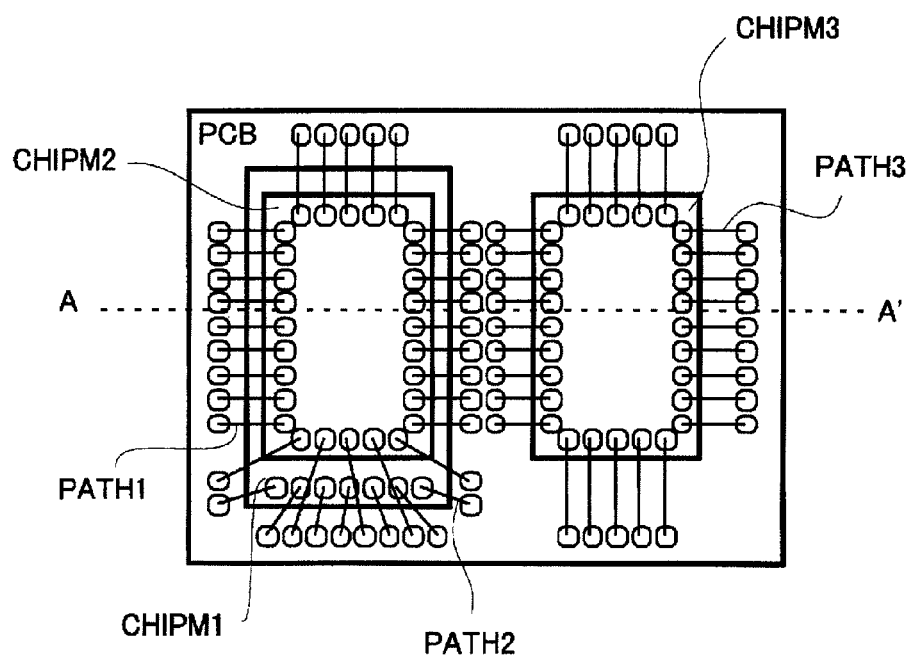
FIG. 46 is a diagram showing one example of a mount style of the information processing system of the present invention.
Figure 46B:
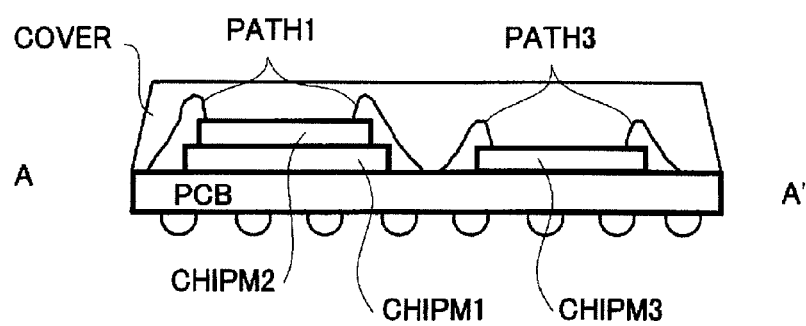

FIG. 46 shows a memory system according to a tenth embodiment of the present invention. FIG. 46(A) is a top view and FIG. 46(B) is a cross-sectional view of a part taken along a line A-A' shown in the top view.

The memory module of the present embodiment has CHIPM1, CHIPM2, and CHIPM3 mounted on a base (for example, a printed circuit board made of a glass epoxy substrate) PCB implemented on the device by the ball grid array (BGA). CHIPM1 and CHIPM2 are nonvolatile memories, and CHIPM3 is a random access memory.

The memory modules can be produced with a fewer number of processes by unifying the method of wiring the chips and wiring between the chips and the base into bonding wiring. The present incorporating method can integrate the memory modules MEM shown in FIG. 1, the memory module MEM25 shown in FIG. 39, the memory module MEM26 shown in FIG. 40, and the memory module MEM28 shown in FIG. 42 into a single sealing body.

CHIPM1 and the bonding pat on the PCB are connected by the bonding wire (PATH2), CHIPM2 and the bonding pat on the PCB are connected by the bonding wire (PATH1), and CHIPM1 and the bonding pat on the PCB are connected by the bonding wire (PATH3). Because a bare chip is directly mounted on the printed circuit board PCB in the present embodiment, a memory module having a small incorporating area can be provided. Additionally, because the chips can be placed close together, wiring length between the chips can be shortened.

The memory modules can be produced with a fewer number of processes by unifying the method of wiring between the chips and the base into bonding wiring.

(Eleventh Embodiment)

Figure 47A:
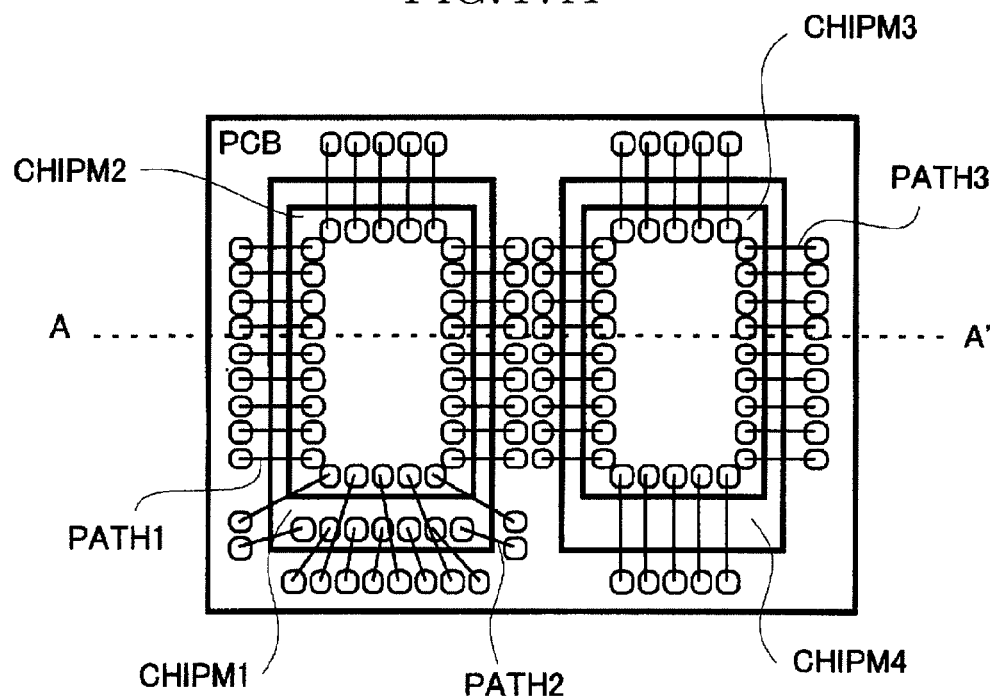
FIG. 47 is a diagram showing one example of a mount style of the information processing system of the present invention.
Figure 47B:
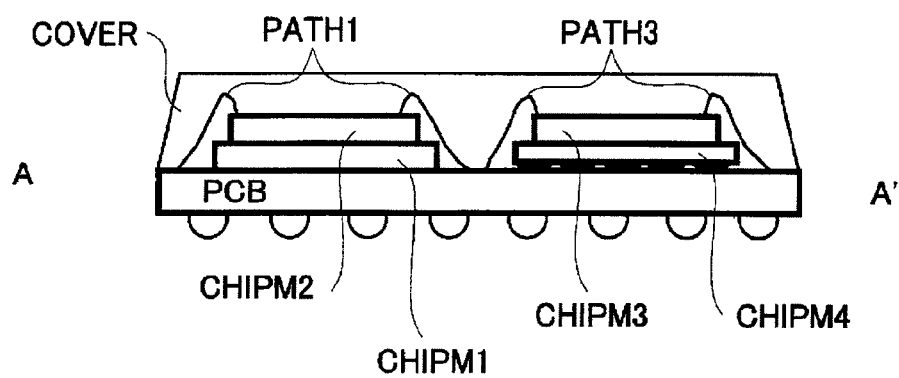

FIG. 47 shows a memory system according to an eleventh embodiment of the present invention. FIG. 47(A) is a top view and FIG. 47(B) is a cross-sectional view of a part taken along a line A-A' shown in the top view.

The memory module of the present embodiment has CHIPM1,

CHIPM2, CHIPM3, and CHIPM4 mounted on a base (for example, a printed circuit board made of a glass epoxy substrate) PCB implemented on the device by the ball grid array (BGA). CHIPM1 and CHIPM2 are nonvolatile memories, and CHIPM3 is a random access memory. CHIPM4 is the information processing device CPU_CHIP appears.

According to the present incorporating method, the information processing systems shown in FIGS. 1, 39, 40, and 42 can be integrated into a single sealing body.

CHIPM1 and the bonding pat on the PCB are connected by the bonding wire (PATH2), CHIPM2 and the bonding pat on the PCB are connected by the bonding wire (PATH1), CHIPM3 and the bonding pat on the PCB are connected by the bonding wire (PATH3). The ball grid array (BGA) is used for implementing and wiring CHIPM4.

Because a bare chip is directly mounted on the printed circuit board PCB in the present embodiment, a memory module having a small incorporating area can be provided. Additionally, because the chips can be placed close together, wiring length between the chips can be shortened. The bonding between CHIPM4 and the base becomes unnecessary, reducing the number of bonding wirings, whereby assembly workload can be reduced and a highly reliable multi-chip module can be realized.

(Twelfth Embodiment)

Figure 48:
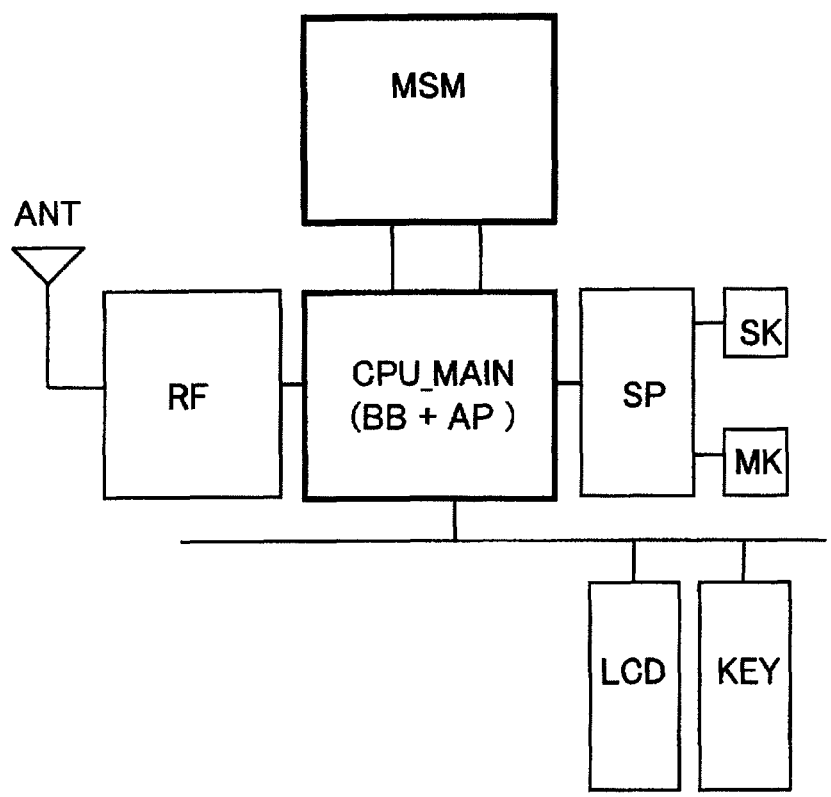
FIG. 48 is a block diagram showing a configuration example of a mobile phone using the information processing system of the present invention.

FIG. 48 shows a mobile phone using a memory module according to a twelfth embodiment of the present invention. The mobile phone includes an antenna ANT, a radio block RF, a voice codec block SP, a speaker SK, a microphone MK, an information processing device CPU, a liquid crystal display unit LCD, a keyboard KEY, and a memory module MSM of the present invention. The information processing device CPU_MAIN includes a plurality of information processing circuits, with one information processing circuit CPU0 of which operating as a baseband processing circuit BB and at least one information processing circuit CPU1 of the others operating as an application processor AP.

An operation during a call is described. Voice received through the antenna ANT is amplified in the radio block RF and input to the information processing device CPU0. The information processing device CPU0 converts the analog signal of the voice into a digital signal, performs error correcting and decoding, and outputs it to the voice codec block SP. When the voice codec block converts the digital signal into an analog signal and outputs it to the speaker SK, voice of the other party can be heard from the speaker.

An operation of performing a series of tasks such as accessing an Internet site from the mobile phone, downloading music data, playing and listening to the data, and finally storing the downloaded music data is described.

The memory module MEM includes the OS, application programs (e-mail, Web browser, music player programs, video reproduction programs, game programs), music data, still image data, and video data stored therein.

Upon instructing to start the Web browser from the keyboard, a Web browser program stored in the NOR flash memory in the memory module MSM is read and executed by the information processing circuit CPU1, and the Web browser is displayed on the liquid crystal display LCD. Upon indicating to access the desired site and download a favorite music data from the keyboard KEY, the music data is received through the antenna ANT, amplified by the radio block RF, and input to the information processing device CPU0. The information processing device CPU0 converts the music data, which is an analog signal, into a digital signal and performs error correcting and decoding processes. The music data converted into a digital signal is temporarily held in the dynamic random access memory DRAM in the memory module MSM, and finally transferred to the NAND flash memory of the memory module MEM and stored therein.

Next, upon instructing to activate the music player program from the keyboard KEY, the music player program stored in the NOR flash memory in the memory module MSM is read and executed by the information processing circuit CPU1, and the music player program is displayed on the liquid crystal display LCD.

Upon instructing to play the music data downloaded to the NAND flash memory in the memory module from the keyboard KEY, the information processing circuit CPU1 executes the music player program, processes the music data held in the NAND flash memory, whereby the music is finally output from the speaker SK. Because the NOR flash memory in the memory module MSM of the present invention stores a plurality of programs such as the Web browser, the music player program and the e-mail program, and the information processing device CPU_MAIN includes a plurality of information processing circuits CPU0 to CPU3, a plurality of programs can be simultaneously executed.

During the standby state for calls or e-mails, the information processing device CPU_MAIN can operate the clock for the memory module MSM at a minimum frequency required, whereby power consumption can be significantly reduced.

As described above, by using the memory module according to the present invention, a large amount of e-mails, music player programs, application programs, music data, still image data, video data can be stored and further, a plurality of programs can be simultaneously executed.

(Thirteenth Embodiment)

Figure 49:
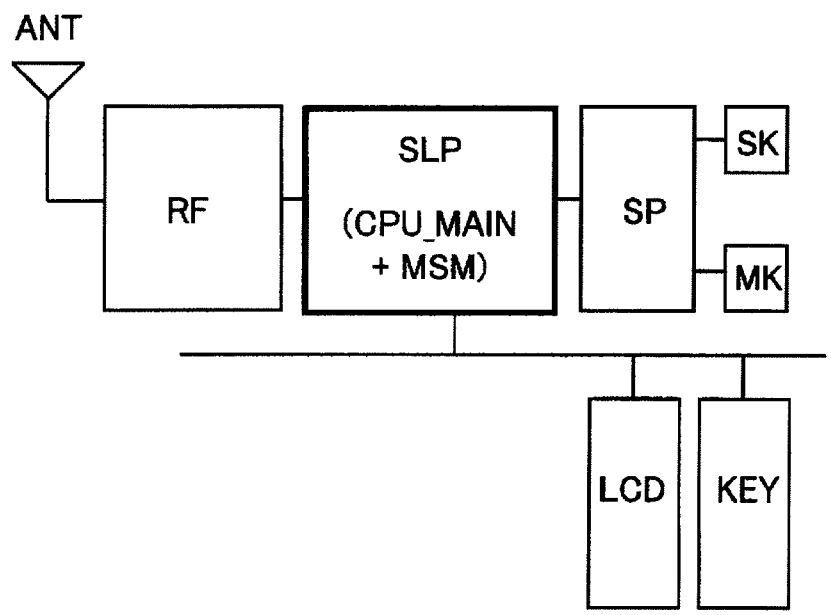
FIG. 49 is a block diagram showing a configuration example of a mobile phone using the information processing system of the present invention.
Figure 50:
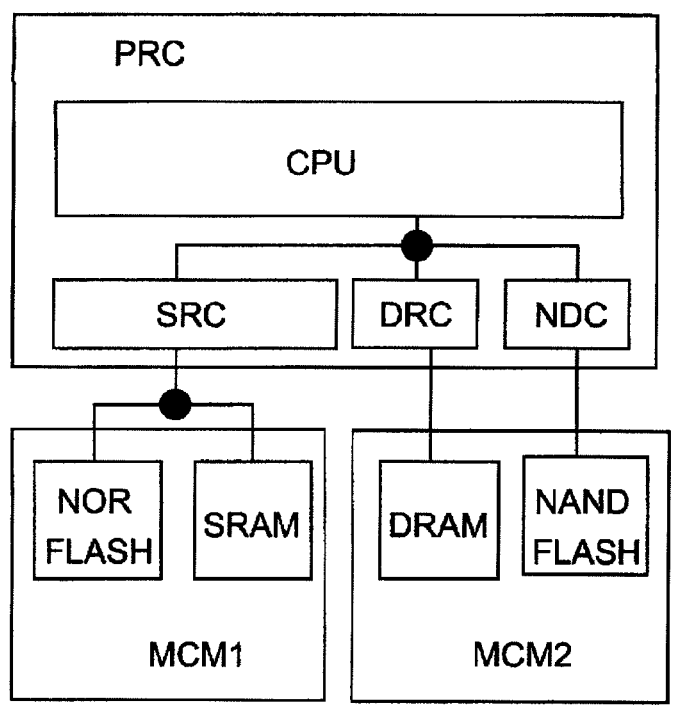
FIG. 50 is a block diagram showing a configurtion of a conventional memory example used in a mobile phone.

FIG. 49 shows a mobile phone using a memory system according to a thirteenth embodiment of the present invention. The mobile phone includes the antenna ANT, the radio block RF, the voice codec block SP, the speaker SK, the microphone MK, the liquid crystal display unit LCD, the keyboard KEY, and an information processing system SLP of the present invention having the memory module MSM and the information processing device CPU_MAIN integrated into a single sealing body.

Using the information processing system SLP of the present invention, the number of parts can be reduced, whereby cost reductions can be achieved and reliability of the mobile phone can be improved. Accordingly, an incorporating area of the parts constituting the mobile phone can be reduced to downsize the mobile phone.

(Fourteenth Embodiment)

Figure 51:
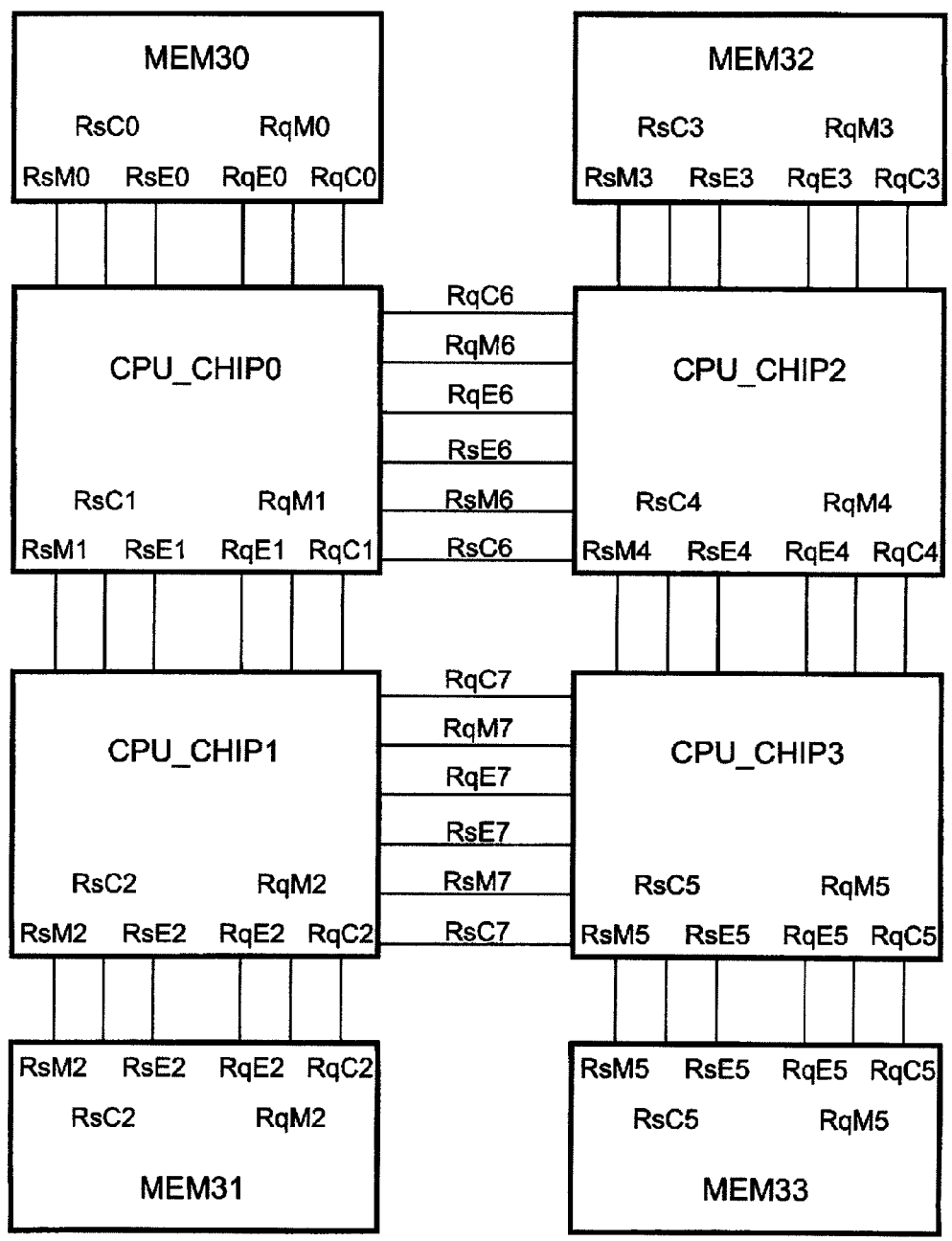
FIG. 51 is a configuration diagram of the information processing system of the present invention.

FIG. 51 is a fourteenth embodiment of the present invention. The fourteenth embodiment describes an information system including information processing devices CPU_CHIP0, CPU_CHIP1, CPU_CHIP2, and CPU_CHIP3, and memory modules MEM30, MEM31, MEM32, and MEM33.

The information processing devices CPU_CHIP0, CPU_CHIP1, CPU_CHIP2, and CPU_CHIP3 are equivalent to the information processing device CPU_CHIP shown in FIG. 1. The memory modules MEM30, MEM31, MEM32, and MEM33 are equivalent to the memory module MEM shown in FIG. 1.

RqC0 to RqC7 are request clocks and RsC0 to RsC7 are response clocks. RqE0 to RqE7 are request enable signals and RsE0 to RsEN7 are response enable signals. RqM0 to RqM7 are request signals and RsM0 to RsM1 are response signals.

In the present invention, a plurality of information processing devices can be easily connected to achieve high speed processing. Furthermore, the information processing devices and memory modules can be flexibly connected according to the system configuration and required performance of portable devices.

In the present embodiment, although the connection of the memory module MEM shown in FIG. 1 is exemplified, the memory modules shown in FIGS. 38 to 42 can be connected.

<Summary of Effects of Invention Described in Respective Embodiments>

Primary effects obtained by the invention disclosed in the present specification and described above are as follows.

First, it can be confirmed that the memories are reliably connected with each other by performing a checking operation of serial connection immediately after power-on. Furthermore, only the necessary number of memory chips can be easily connected to expand memory capacity, by clearly indicating the boot device and the memory chip at the farthest end and automatically allocating an ID to each memory.

Second, requests can be reliably transferred from the information processing device CPU_CHIP to each of the memory chips M0, M1, and M2 by providing IDs to the requests. Furthermore, it can be confirmed that data transfer from each memory has been successfully performed by providing IDs to the responses to the information processing device CPU_CHIP so that the information processing device CPU_CHIP can perform the desired processing while reducing the number of connection signals by serially connecting the information processing device CPU_CHIP and the memory chips M0, M1, and M2.

Third, by transmitting the latency value of the data before transmitting the data, the information processing device CPU_CHIP can recognize the arrival time of the data and perform required processed before arrival of the data, thereby improving the performance.

Fourth, by providing a request number to the request and a response number to the response, the information processing device CPU_CHIP can recognize which request a response transmitted from the memory chip is directed to, even if responses are transmitted in a different order from the order of inputting the requests, whereby the information processing device CPU_CHIP can perform the desired processing at high speed.

Fifth, because the request interface circuit ReIF and the response interface circuit can operate independently, data read and write operations can be performed simultaneously, thereby improving the performance of data transfer.

Sixth, because a data that can be read earlier can be immediately read without waiting for a data that is read slower regardless of the order of inputting requests, the processing speed can be increased.

Seventh, because the clocks of the memory chips M0, M1, and M2 can be operated slowly, stopped or resumed, power consumption can be lowered.

Eighth, by detecting and correcting errors when reading from the memory chip M2, and performing a replacement process for a failed address into which writing failed, reliability can be maintained.

Ninth, because the order of the responses from respective memories to the information processing device dynamically changes depending on the number of read times, performance of data transfer can be improved. Furthermore, the number of read times can be programmed to flexibly adapt to the system being used.

Tenth, because errors can be transmitted from the memory chip to the information processing unit, the information processing device can detect an error and handle it immediately, whereby a highly reliable information processing system can be constructed.

Eleventh, operating frequency of the clocks of respective memory chips M0, M1, and M2 can be changed as necessary, whereby power consumption can be lowered.

Twelfth, by incorporating a plurality of semiconductor chips into a single sealing body, a memory module having a small incorporating area can be provided.

What is claimed is:

1. A semiconductor device comprising a request interface circuit and a response interface circuit, wherein
the request interface circuit has a plurality of request queues,
the response interface circuit has a plurality of response queues, and
the request interface circuit receives a request including (i) a queue reservation instruction for reserving one or more request queues from among the plurality of request queues and one or more response queues from among the plurality of response queues and (ii) a number of queues to be reserved, wherein
the semiconductor device includes a plurality of serially connected memory devices, and each of the plurality of memory devices (i) includes the request interface circuit and the response interface circuit, (ii) has a respective plurality of request queues for transmitting and receiving requests and a respective plurality of response queues for transmitting and receiving responses, (iii) receives the request, (iv) has an ID register for storing an ID number of the memory devices, and (v) has a comparison circuit for comparing a value of the request to the ID number of the memory devices.

2. The semiconductor device as claimed in claim 1, wherein the response interface circuit transmits reservation completion information indicating that the queue reservation instruction has been successfully processed, after completing reservation of the one or more request queues and the one or more response queues in response to the queue reservation instruction.

3. The semiconductor device as claimed in claim 1, wherein the semiconductor device includes a memory control circuit.

4. The semiconductor device as claimed in claim 1, wherein the semiconductor device includes an information processing circuit.

5. The semiconductor device as claimed in claim 1, wherein the semiconductor device includes a memory device.

6. The semiconductor device as claimed in claim 1, wherein each of the plurality of memory devices transmits reservation completion information indicating that the queue reservation instruction has been successfully processed, after completing reservation of the one or more request queues and the one or more response queues in response to the queue reservation instruction.

7. The semiconductor device as claimed in claim 1, wherein
the plurality of memory devices include a first memory device and a second memory device connected to a subsequent stage of the first memory device, and
the first memory device transmits, if the comparison circuit of the first memory device determines that the value of the request does not match the ID number of the first memory device stored in the ID register of the first memory device, the queue reservation instruction received by the first memory device to the second memory device.

8. The semiconductor device as claimed in claim 6, wherein
the plurality of memory devices include a first memory device and a second memory device connected to a subsequent stage of the first memory device, and
the second memory device transmits the reservation completion information to the first memory device.

9. The semiconductor device of claim 6, wherein if the comparison circuit of the first memory device determines that the value of the request does not match the ID number of the first memory device stored in the ID register of the first memory device, the first memory device reserves, based on the received request, one or more of its respective plurality of request queues and one or more of its respective plurality of response queues for communication with the second memory device.

* * * * *